(12) United States Patent
West et al.

(10) Patent No.: US 12,424,973 B2
(45) Date of Patent: Sep. 23, 2025

(54) PHOTOVOLTAIC SYSTEMS WITH WIREWAYS

(71) Applicant: GAF Energy LLC, Parsippany, NJ (US)

(72) Inventors: Brian West, Larkspur, CA (US); Peter Wilke, Redwood City, CA (US); Peter Clemente, Warren, NJ (US); Gary Rossi, Pleasant Hill, NJ (US); Thomas Marentette, San Rafael, CA (US)

(73) Assignee: GAF Energy LLC, Parsippany, NJ (US)

( * ) Notice: Subject to any disclaimer, the term of this patent is extended or adjusted under 35 U.S.C. 154(b) by 21 days.

(21) Appl. No.: 18/659,493

(22) Filed: May 9, 2024

(65) Prior Publication Data

US 2024/0413791 A1 Dec. 12, 2024

Related U.S. Application Data

(63) Continuation of application No. 18/295,564, filed on Apr. 4, 2023, now Pat. No. 12,009,782.

(51) Int. Cl.
*H02S 40/36* (2014.01)
*H02S 20/23* (2014.01)
*H02S 40/34* (2014.01)

(52) U.S. Cl.
CPC ............. *H02S 40/36* (2014.12); *H02S 20/23* (2014.12); *H02S 40/34* (2014.12)

(58) Field of Classification Search
CPC .......... H02S 40/34; H02S 40/36; H02S 20/00; H02S 20/23; H02S 20/24; H02S 20/25; H02S 20/30; Y02E 10/50
See application file for complete search history.

(56) References Cited

U.S. PATENT DOCUMENTS

| 1,981,467 A | 11/1934 | Radtke |
| 3,156,497 A | 11/1964 | Lessard |

(Continued)

FOREIGN PATENT DOCUMENTS

| CA | 2829440 A | 5/2019 |
| CH | 700095 A2 | 6/2010 |

(Continued)

OTHER PUBLICATIONS

Sunflare, Procducts: "Sunflare Develops Prototype For New Residential Solar Shingles"; 2019 <<sunflaresolar.com/news/sunflare-develops-prototype-for-new-residential-solar-shingles>> retrieved Feb. 2, 2021.

(Continued)

*Primary Examiner* — Mayla Gonzalez Ramos
(74) *Attorney, Agent, or Firm* — GREENBERG TRAURIG, LLP

(57) ABSTRACT

A system includes a plurality of photovoltaic modules installed on and arranged in an array on a roof deck. Each of the photovoltaic modules includes first and second ends, and a baseplate located at the first end. The baseplate of one of the photovoltaic modules is substantially aligned with the baseplate of an adjacent another one of the photovoltaic modules. The baseplate is configured to receive at least one electrical component. The substantially aligned baseplates include a longitudinal axis. The system includes at least one wire cover removably attached to at least one of the baseplates. The at least one wire cover is moveable in at least a first direction transverse relative to the longitudinal axis.

19 Claims, 45 Drawing Sheets

(56) References Cited

U.S. PATENT DOCUMENTS

| | | | |
|---|---|---|---|
| 3,581,779 A | 6/1971 | Gilbert, Jr. | |
| 4,258,948 A | 3/1981 | Hoffmann | |
| 4,349,220 A | 9/1982 | Carroll et al. | |
| 4,499,702 A | 2/1985 | Turner | |
| 4,636,577 A | 1/1987 | Peterpaul | |
| 5,167,579 A | 12/1992 | Rotter | |
| 5,437,735 A | 8/1995 | Younan et al. | |
| 5,590,495 A | 1/1997 | Bressler et al. | |
| 5,642,596 A | 7/1997 | Waddington | |
| 6,008,450 A | 12/1999 | Ohtsuka et al. | |
| 6,033,270 A | 3/2000 | Stuart | |
| 6,046,399 A | 4/2000 | Kapner | |
| 6,201,180 B1 | 3/2001 | Meyer et al. | |
| 6,220,329 B1 | 4/2001 | King et al. | |
| 6,308,482 B1 | 10/2001 | Strait | |
| 6,320,114 B1 | 11/2001 | Kuechler | |
| 6,320,115 B1 | 11/2001 | Kataoka et al. | |
| 6,336,304 B1 | 1/2002 | Mimura et al. | |
| 6,341,454 B1 | 1/2002 | Koleoglou | |
| 6,407,329 B1 | 6/2002 | Iino et al. | |
| 6,576,830 B2 | 6/2003 | Nagao et al. | |
| 6,928,781 B2 | 8/2005 | Desbois et al. | |
| 6,972,367 B2 | 12/2005 | Federspiel et al. | |
| 7,138,578 B2 | 11/2006 | Komamine | |
| 7,155,870 B2 | 1/2007 | Almy | |
| 7,178,295 B2 | 2/2007 | Dinwoodie | |
| 7,487,771 B1 | 2/2009 | Eiffert et al. | |
| 7,587,864 B2 | 9/2009 | McCaskill et al. | |
| 7,678,990 B2 | 3/2010 | McCaskill et al. | |
| 7,678,991 B2 | 3/2010 | McCaskill et al. | |
| 7,748,191 B2 | 7/2010 | Podirsky | |
| 7,819,114 B2 | 10/2010 | Augenbraun et al. | |
| 7,824,191 B1 | 11/2010 | Podirsky | |
| 7,832,176 B2 | 11/2010 | McCaskill et al. | |
| 8,118,109 B1 | 2/2012 | Hacker | |
| 8,168,880 B2 | 5/2012 | Jacobs et al. | |
| 8,173,889 B2 | 5/2012 | Kalkanoglu et al. | |
| 8,210,570 B1 | 7/2012 | Railkar et al. | |
| 8,276,329 B2 | 10/2012 | Lenox | |
| 8,312,693 B2 | 11/2012 | Cappelli | |
| 8,319,093 B2 | 11/2012 | Kalkanoglu et al. | |
| 8,333,040 B2 | 12/2012 | Shiao et al. | |
| 8,371,076 B2 | 2/2013 | Jones et al. | |
| 8,375,653 B2 | 2/2013 | Shiao et al. | |
| 8,404,967 B2 | 3/2013 | Kalkanoglu et al. | |
| 8,410,349 B2 | 4/2013 | Kalkanoglu et al. | |
| 8,418,415 B2 | 4/2013 | Shiao et al. | |
| 8,438,796 B2 | 5/2013 | Shiao et al. | |
| 8,468,754 B2 | 6/2013 | Railkar et al. | |
| 8,468,757 B2 | 6/2013 | Krause et al. | |
| 8,505,249 B2 | 8/2013 | Geary | |
| 8,512,866 B2 | 8/2013 | Taylor | |
| 8,513,517 B2 | 8/2013 | Kalkanoglu et al. | |
| 8,586,856 B2 | 11/2013 | Kalkanoglu et al. | |
| 8,601,754 B2 | 12/2013 | Jenkins et al. | |
| 8,629,578 B2 | 1/2014 | Kurs et al. | |
| 8,646,228 B2 | 2/2014 | Jenkins | |
| 8,656,657 B2 | 2/2014 | Livsey et al. | |
| 8,671,630 B2 | 3/2014 | Lena et al. | |
| 8,677,702 B2 | 3/2014 | Jenkins | |
| 8,695,289 B2 | 4/2014 | Koch et al. | |
| 8,713,858 B1 | 5/2014 | Xie | |
| 8,713,860 B2 | 5/2014 | Railkar et al. | |
| 8,733,038 B2 | 5/2014 | Kalkanoglu et al. | |
| 8,776,455 B2 | 7/2014 | Azoulay | |
| 8,789,321 B2 | 7/2014 | Ishida | |
| 8,793,940 B2 | 8/2014 | Kalkanoglu et al. | |
| 8,793,941 B2 | 8/2014 | Bosler et al. | |
| 8,826,607 B2 | 9/2014 | Shiao et al. | |
| 8,835,751 B2 | 9/2014 | Kalkanoglu et al. | |
| 8,863,451 B2 | 10/2014 | Jenkins et al. | |
| 8,898,970 B2 | 12/2014 | Jenkins et al. | |
| 8,925,262 B2 | 1/2015 | Railkar et al. | |
| 8,943,766 B2 | 2/2015 | Gombarick et al. | |
| 8,946,544 B2 | 2/2015 | Jabos et al. | |
| 8,950,128 B2 | 2/2015 | Kalkanoglu et al. | |
| 8,959,848 B2 | 2/2015 | Jenkins et al. | |
| 8,966,838 B2 | 3/2015 | Jenkins | |
| 8,966,850 B2 | 3/2015 | Jenkins et al. | |
| 8,994,224 B2 | 3/2015 | Mehta et al. | |
| 9,032,672 B2 | 5/2015 | Livsey et al. | |
| 9,153,950 B2 | 10/2015 | Yamanaka et al. | |
| 9,166,087 B2 | 10/2015 | Chihlas et al. | |
| 9,169,646 B2 | 10/2015 | Rodrigues et al. | |
| 9,170,034 B2 | 10/2015 | Bosler et al. | |
| 9,178,465 B2 | 11/2015 | Shiao et al. | |
| 9,202,955 B2 | 12/2015 | Livsey et al. | |
| 9,212,832 B2 | 12/2015 | Jenkins | |
| 9,217,584 B2 | 12/2015 | Kalkanoglu et al. | |
| 9,270,221 B2 | 2/2016 | Zhao | |
| 9,273,885 B2 | 3/2016 | Rordigues et al. | |
| 9,276,141 B2 | 3/2016 | Kalkanoglu et al. | |
| 9,331,224 B2 | 5/2016 | Koch et al. | |
| 9,356,174 B2 | 5/2016 | Duarte et al. | |
| 9,359,014 B1 | 6/2016 | Yang et al. | |
| 9,412,890 B1 | 8/2016 | Meyers | |
| 9,528,270 B2 | 12/2016 | Jenkins et al. | |
| 9,605,432 B1 | 3/2017 | Robbins | |
| 9,711,672 B2 | 7/2017 | Wang | |
| 9,755,573 B2 | 9/2017 | Livsey et al. | |
| 9,786,802 B2 | 10/2017 | Shiao et al. | |
| 9,831,818 B2 | 11/2017 | West | |
| 9,912,284 B2 | 3/2018 | Svec | |
| 9,923,515 B2 | 3/2018 | Rodrigues et al. | |
| 9,938,729 B2 | 4/2018 | Coon | |
| 9,991,412 B2 | 6/2018 | Gonzalez et al. | |
| 9,998,067 B2 | 6/2018 | Kalkanoglu et al. | |
| 10,027,273 B2 | 7/2018 | West et al. | |
| 10,115,850 B2 | 10/2018 | Rodrigues et al. | |
| 10,128,660 B1 | 11/2018 | Apte et al. | |
| 10,156,075 B1 | 12/2018 | McDonough | |
| 10,187,005 B2 | 1/2019 | Rodrigues et al. | |
| 10,256,765 B2 | 4/2019 | Rodrigues et al. | |
| 10,284,136 B1 | 5/2019 | Mayfield et al. | |
| 10,454,408 B2 | 10/2019 | Livsey et al. | |
| 10,530,292 B1 | 1/2020 | Cropper et al. | |
| 10,560,048 B2 | 2/2020 | Fisher et al. | |
| 10,563,406 B2 | 2/2020 | Kalkanoglu et al. | |
| D879,031 S | 3/2020 | Lance et al. | |
| 10,579,028 B1 | 3/2020 | Jacob | |
| 10,784,813 B2 | 9/2020 | Kalkanoglu et al. | |
| D904,289 S | 12/2020 | Lance et al. | |
| 11,012,026 B2 | 5/2021 | Kalkanoglu et al. | |
| 11,177,639 B1 | 11/2021 | Nguyen et al. | |
| 11,217,715 B2 | 1/2022 | Sharenko et al. | |
| 11,251,744 B1 | 2/2022 | Bunea et al. | |
| 11,258,399 B2 | 2/2022 | Kalkanoglu et al. | |
| 11,283,394 B2 | 3/2022 | Perkins et al. | |
| 11,309,828 B2 | 4/2022 | Sirski et al. | |
| 11,394,344 B2 | 7/2022 | Perkins et al. | |
| 11,424,379 B2 | 8/2022 | Sharenko et al. | |
| 11,431,280 B2 | 8/2022 | Liu et al. | |
| 11,431,281 B2 | 8/2022 | Perkins et al. | |
| 11,444,569 B2 | 9/2022 | Clemente et al. | |
| 11,454,027 B2 | 9/2022 | Kuiper et al. | |
| 11,459,757 B2 | 10/2022 | Nguyen et al. | |
| 11,486,144 B2 | 11/2022 | Bunea et al. | |
| 11,489,482 B2 | 11/2022 | Peterson et al. | |
| 11,496,088 B2 | 11/2022 | Sirski et al. | |
| 11,508,861 B1 | 11/2022 | Perkins et al. | |
| 11,512,480 B1 | 11/2022 | Achor et al. | |
| 11,527,665 B2 | 12/2022 | Boitnott | |
| 11,545,927 B2 | 1/2023 | Abra et al. | |
| 11,545,928 B2 | 1/2023 | Perkins et al. | |
| 11,658,470 B2 | 5/2023 | Nguyen et al. | |
| 11,661,745 B2 | 5/2023 | Bunea et al. | |
| 11,689,149 B2 | 6/2023 | Clemente et al. | |
| 11,705,531 B2 | 7/2023 | Sharenko et al. | |
| 11,728,759 B2 | 8/2023 | Nguyen et al. | |
| 11,732,490 B2 | 8/2023 | Achor et al. | |
| 11,811,361 B1 | 11/2023 | Farhangi et al. | |
| 11,824,486 B2 | 11/2023 | Nguyen et al. | |
| 11,824,487 B2 | 11/2023 | Nguyen et al. | |
| 11,843,067 B2 | 12/2023 | Nguyen et al. | |

(56) References Cited

U.S. PATENT DOCUMENTS

| | | |
|---|---|---|
| 2002/0053360 A1 | 5/2002 | Kinoshita et al. |
| 2002/0129849 A1 | 9/2002 | Heckeroth |
| 2003/0101662 A1 | 6/2003 | Ullman |
| 2003/0132265 A1 | 7/2003 | Villela et al. |
| 2003/0217768 A1 | 11/2003 | Guha |
| 2004/0000334 A1 | 1/2004 | Ressler |
| 2005/0030187 A1 | 2/2005 | Peress et al. |
| 2005/0115603 A1 | 6/2005 | Yoshida et al. |
| 2005/0144870 A1 | 7/2005 | Dinwoodie |
| 2005/0178428 A1 | 8/2005 | Laaly et al. |
| 2005/0193673 A1 | 9/2005 | Rodrigues et al. |
| 2006/0042683 A1 | 3/2006 | Gangemi |
| 2006/0046084 A1 | 3/2006 | Yang et al. |
| 2007/0074757 A1 | 4/2007 | Mellott et al. |
| 2007/0181174 A1 | 8/2007 | Ressler |
| 2007/0193618 A1 | 8/2007 | Bressler et al. |
| 2007/0249194 A1 | 10/2007 | Liao |
| 2007/0295385 A1 | 12/2007 | Sheats et al. |
| 2008/0006323 A1 | 1/2008 | Kalkanoglu et al. |
| 2008/0035140 A1 | 2/2008 | Placer et al. |
| 2008/0078440 A1 | 4/2008 | Lim et al. |
| 2008/0185748 A1 | 8/2008 | Kalkanoglu |
| 2008/0271774 A1 | 11/2008 | Kalkanoglu et al. |
| 2008/0302030 A1 | 12/2008 | Stancel et al. |
| 2008/0315061 A1 | 12/2008 | Fath |
| 2009/0000222 A1 | 1/2009 | Kalkanoglu et al. |
| 2009/0014057 A1 | 1/2009 | Croft et al. |
| 2009/0014058 A1 | 1/2009 | Croft et al. |
| 2009/0019795 A1 | 1/2009 | Szacsvay et al. |
| 2009/0044850 A1 | 2/2009 | Kimberley |
| 2009/0114261 A1 | 5/2009 | Stancel et al. |
| 2009/0133340 A1 | 5/2009 | Shiao et al. |
| 2009/0159118 A1 | 6/2009 | Kalkanoglu et al. |
| 2009/0178350 A1 | 7/2009 | Kalkanoglu et al. |
| 2009/0229652 A1 | 9/2009 | Mapel et al. |
| 2009/0275247 A1 | 11/2009 | Richter et al. |
| 2010/0019580 A1 | 1/2010 | Croft et al. |
| 2010/0095618 A1 | 4/2010 | Edison et al. |
| 2010/0101634 A1 | 4/2010 | Frank et al. |
| 2010/0116325 A1 | 5/2010 | Nikoonahad |
| 2010/0131108 A1 | 5/2010 | Meyer |
| 2010/0139184 A1 | 6/2010 | Williams et al. |
| 2010/0146878 A1 | 6/2010 | Koch et al. |
| 2010/0159221 A1 | 6/2010 | Kourtakis et al. |
| 2010/0170169 A1 | 7/2010 | Railkar et al. |
| 2010/0186798 A1 | 7/2010 | Tormen et al. |
| 2010/0242381 A1 | 9/2010 | Jenkins |
| 2010/0313499 A1 | 12/2010 | Gangemi |
| 2010/0325976 A1 | 12/2010 | DeGenfelder et al. |
| 2010/0326488 A1 | 12/2010 | Aue et al. |
| 2010/0326501 A1 | 12/2010 | Zhao et al. |
| 2011/0030761 A1 | 2/2011 | Kalkanoglu et al. |
| 2011/0036386 A1 | 2/2011 | Browder |
| 2011/0036389 A1 | 2/2011 | Hardikar et al. |
| 2011/0048507 A1 | 3/2011 | Livsey et al. |
| 2011/0058337 A1 | 3/2011 | Han et al. |
| 2011/0061326 A1 | 3/2011 | Jenkins |
| 2011/0100436 A1 | 5/2011 | Cleereman et al. |
| 2011/0104488 A1 | 5/2011 | Muessig et al. |
| 2011/0132427 A1 | 6/2011 | Kalkanoglu et al. |
| 2011/0168238 A1 | 7/2011 | Metin et al. |
| 2011/0239555 A1 | 10/2011 | Cook et al. |
| 2011/0277806 A1* | 11/2011 | Gillenwater ............ H02S 20/23 136/244 |
| 2011/0302859 A1 | 12/2011 | Crasnianski |
| 2011/0314753 A1 | 12/2011 | Farmer et al. |
| 2012/0034799 A1 | 2/2012 | Hunt |
| 2012/0060434 A1 | 3/2012 | Jacobs |
| 2012/0060902 A1 | 3/2012 | Drake |
| 2012/0085392 A1 | 4/2012 | Albert et al. |
| 2012/0137600 A1 | 6/2012 | Jenkins |
| 2012/0176077 A1 | 7/2012 | Oh et al. |
| 2012/0212065 A1 | 8/2012 | Cheng et al. |
| 2012/0233940 A1 | 9/2012 | Perkins et al. |
| 2012/0240490 A1 | 9/2012 | Gangemi |
| 2012/0260977 A1 | 10/2012 | Stancel |
| 2012/0266942 A1 | 10/2012 | Komatsu et al. |
| 2012/0279150 A1 | 11/2012 | Pislkak et al. |
| 2012/0282437 A1 | 11/2012 | Clark et al. |
| 2012/0291848 A1 | 11/2012 | Sherman et al. |
| 2013/0008499 A1 | 1/2013 | Verger et al. |
| 2013/0014455 A1 | 1/2013 | Grieco |
| 2013/0118558 A1 | 5/2013 | Sherman |
| 2013/0193769 A1 | 8/2013 | Mehta et al. |
| 2013/0247988 A1 | 9/2013 | Reese et al. |
| 2013/0284267 A1 | 10/2013 | Plug et al. |
| 2013/0306137 A1 | 11/2013 | Ko |
| 2014/0090697 A1 | 4/2014 | Rodrigues et al. |
| 2014/0150843 A1 | 6/2014 | Pearce et al. |
| 2014/0173997 A1 | 6/2014 | Jenkins |
| 2014/0179220 A1 | 6/2014 | Railkar et al. |
| 2014/0182222 A1 | 7/2014 | Kalkanoglu et al. |
| 2014/0208675 A1 | 7/2014 | Beerer et al. |
| 2014/0254776 A1 | 9/2014 | O'Connor et al. |
| 2014/0266289 A1 | 9/2014 | Della Sera et al. |
| 2014/0311556 A1 | 10/2014 | Feng et al. |
| 2014/0352760 A1 | 12/2014 | Haynes et al. |
| 2014/0366464 A1 | 12/2014 | Rodrigues et al. |
| 2015/0089895 A1 | 4/2015 | Leitch |
| 2015/0162459 A1 | 6/2015 | Lu et al. |
| 2015/0340516 A1 | 11/2015 | Kim et al. |
| 2015/0349173 A1 | 12/2015 | Morad et al. |
| 2016/0105144 A1 | 4/2016 | Haynes et al. |
| 2016/0142008 A1 | 5/2016 | Lopez et al. |
| 2016/0254776 A1 | 9/2016 | Rodrigues et al. |
| 2016/0276508 A1 | 9/2016 | Huang et al. |
| 2016/0359451 A1 | 12/2016 | Mao et al. |
| 2017/0159292 A1 | 6/2017 | Chihlas et al. |
| 2017/0179319 A1 | 6/2017 | Yamashita et al. |
| 2017/0179726 A1 | 6/2017 | Garrity et al. |
| 2017/0237390 A1 | 8/2017 | Hudson et al. |
| 2017/0331415 A1 | 11/2017 | Koppi et al. |
| 2018/0094438 A1 | 4/2018 | Wu et al. |
| 2018/0097472 A1 | 4/2018 | Anderson et al. |
| 2018/0115275 A1 | 4/2018 | Flanigan et al. |
| 2018/0254738 A1 | 9/2018 | Yang et al. |
| 2018/0294765 A1 | 10/2018 | Friedrich et al. |
| 2018/0351502 A1* | 12/2018 | Almy ................... H10F 77/955 |
| 2018/0367089 A1 | 12/2018 | Stutterheim et al. |
| 2019/0030867 A1 | 1/2019 | Sun et al. |
| 2019/0081436 A1 | 3/2019 | Onodi et al. |
| 2019/0123679 A1 | 4/2019 | Rodrigues et al. |
| 2019/0253022 A1 | 8/2019 | Hardar et al. |
| 2019/0305717 A1 | 10/2019 | Allen et al. |
| 2020/0109320 A1 | 4/2020 | Jiang |
| 2020/0144958 A1 | 5/2020 | Rodrigues et al. |
| 2020/0220819 A1 | 7/2020 | Vu et al. |
| 2020/0224419 A1 | 7/2020 | Boss et al. |
| 2020/0343397 A1 | 10/2020 | Hem-Jensen |
| 2021/0083619 A1 | 3/2021 | Hegedus |
| 2021/0115223 A1 | 4/2021 | Bonekamp et al. |
| 2021/0159353 A1 | 5/2021 | Li et al. |
| 2021/0301536 A1 | 9/2021 | Baggs et al. |
| 2021/0343886 A1 | 11/2021 | Sharenko et al. |
| 2022/0149213 A1 | 5/2022 | Mensink et al. |
| 2022/0166372 A1* | 5/2022 | Bunea ...................... E04D 1/26 |

FOREIGN PATENT DOCUMENTS

| | | |
|---|---|---|
| CN | 202797032 U | 3/2013 |
| CN | 217150978 U | 8/2022 |
| DE | 1958248 A1 | 11/1971 |
| EP | 1039361 A1 | 9/2000 |
| EP | 1837162 A1 | 9/2007 |
| EP | 1774372 A1 | 7/2011 |
| EP | 2446481 A2 | 5/2012 |
| EP | 2784241 A1 | 10/2014 |
| EP | 3772175 A1 | 2/2021 |
| JP | 10046767 A | 2/1998 |
| JP | 2002-106151 A | 4/2002 |
| JP | 2001-098703 A | 10/2002 |
| JP | 2017-027735 A | 2/2017 |
| JP | 2018053707 A | 4/2018 |
| KR | 20090084060 A | 8/2009 |

(56) References Cited

FOREIGN PATENT DOCUMENTS

| KR | 10-1348283 B1 | 1/2014 |
| KR | 10-2019-0000367 A | 1/2019 |
| KR | 10-2253483 B1 | 5/2021 |
| NL | 2026856 B1 | 6/2022 |
| WO | 2010/151777 A2 | 12/2010 |
| WO | 2011/049944 A1 | 4/2011 |
| WO | 2015/133632 A1 | 9/2015 |
| WO | 2018/000589 A1 | 1/2018 |
| WO | 2019/201416 A1 | 10/2019 |
| WO | 2020-159358 A1 | 8/2020 |
| WO | WO-2021247098 A1 * | 12/2021 ............... E04D 1/34 |

OTHER PUBLICATIONS

RGS Energy, 3.5kW Powerhouse 3.0 system installed in an afternoon; Jun. 7, 2019 <<facebook.com/RGSEnergy/>> retrieved Feb. 2, 2021.

Tesla, Solar Roof <<tesla.com/solarroof>> retrieved Feb. 2, 2021.

"Types of Roofing Underlayment", Owens Corning Roofing; <<https://www.owenscorning.com/en-us/roofing/tools/how-roofing-underlayment-helps-protect-your-home>> retrieved Nov. 1, 2021.

* cited by examiner

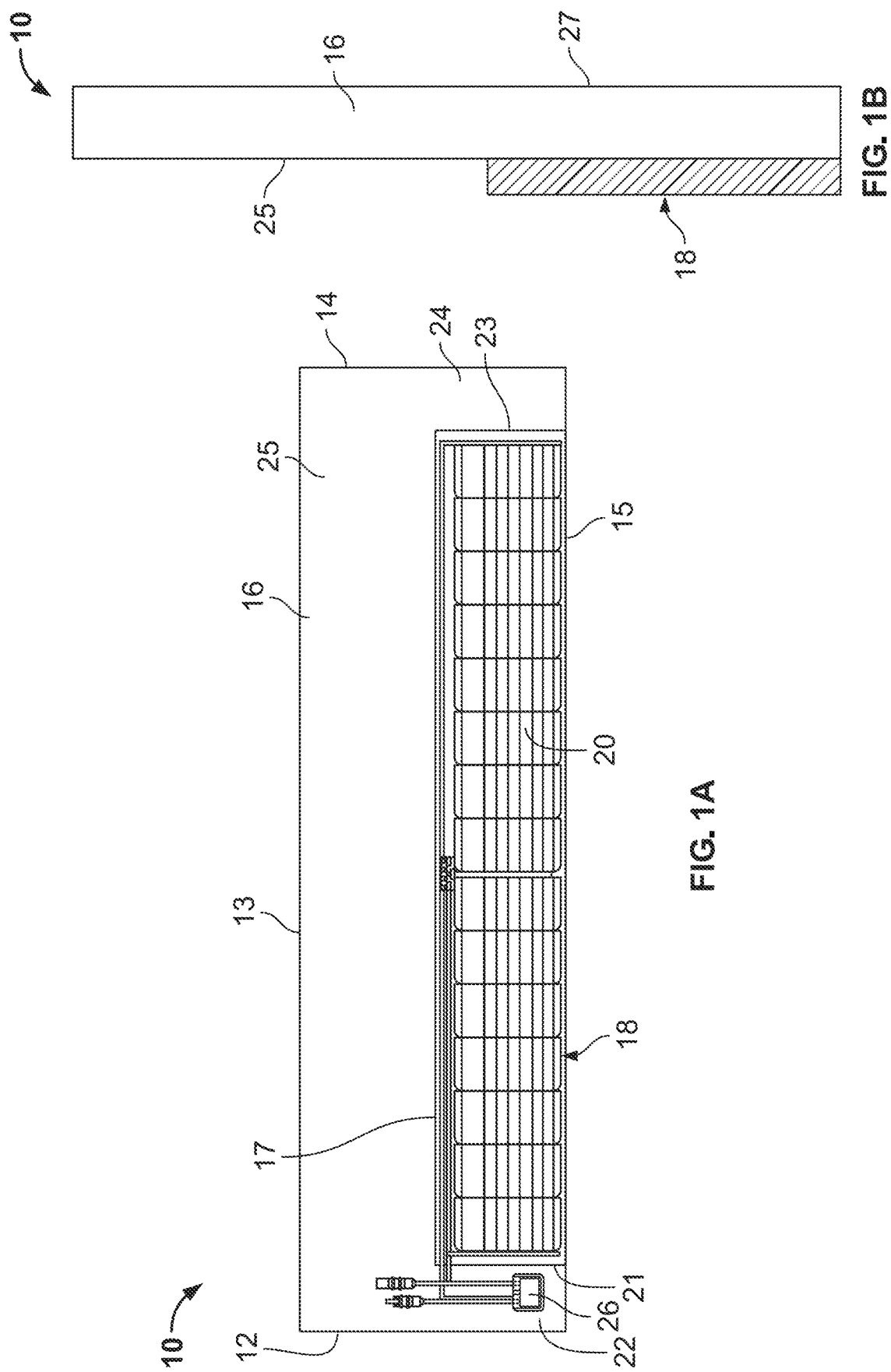

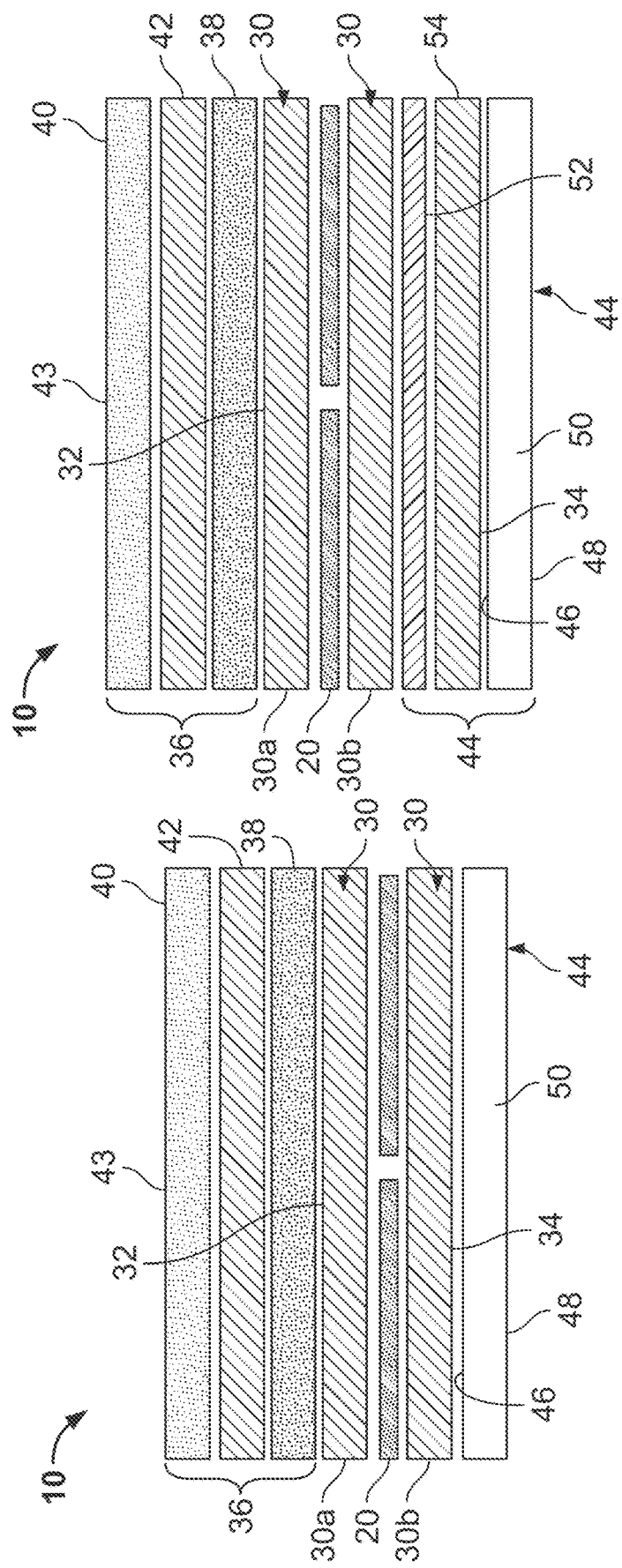

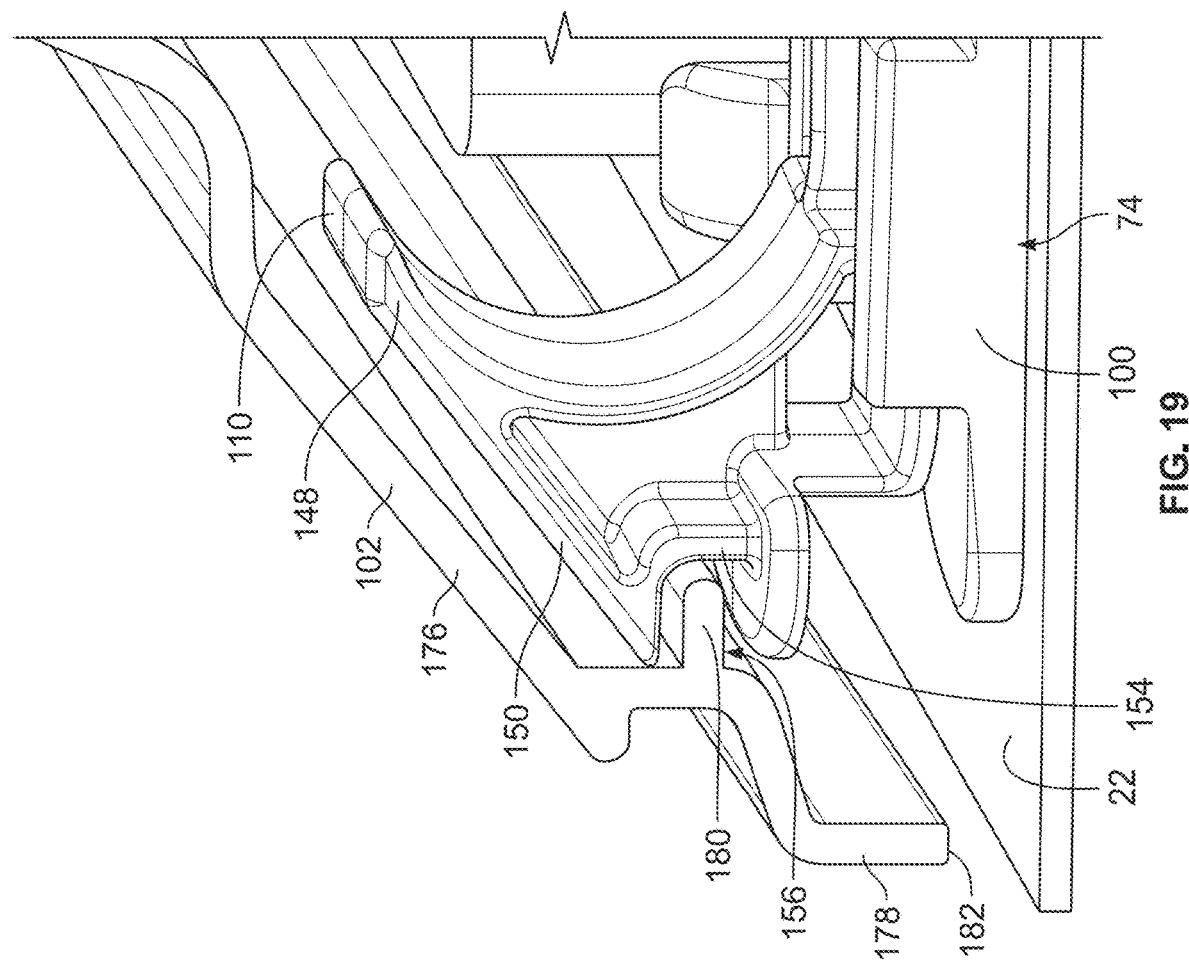

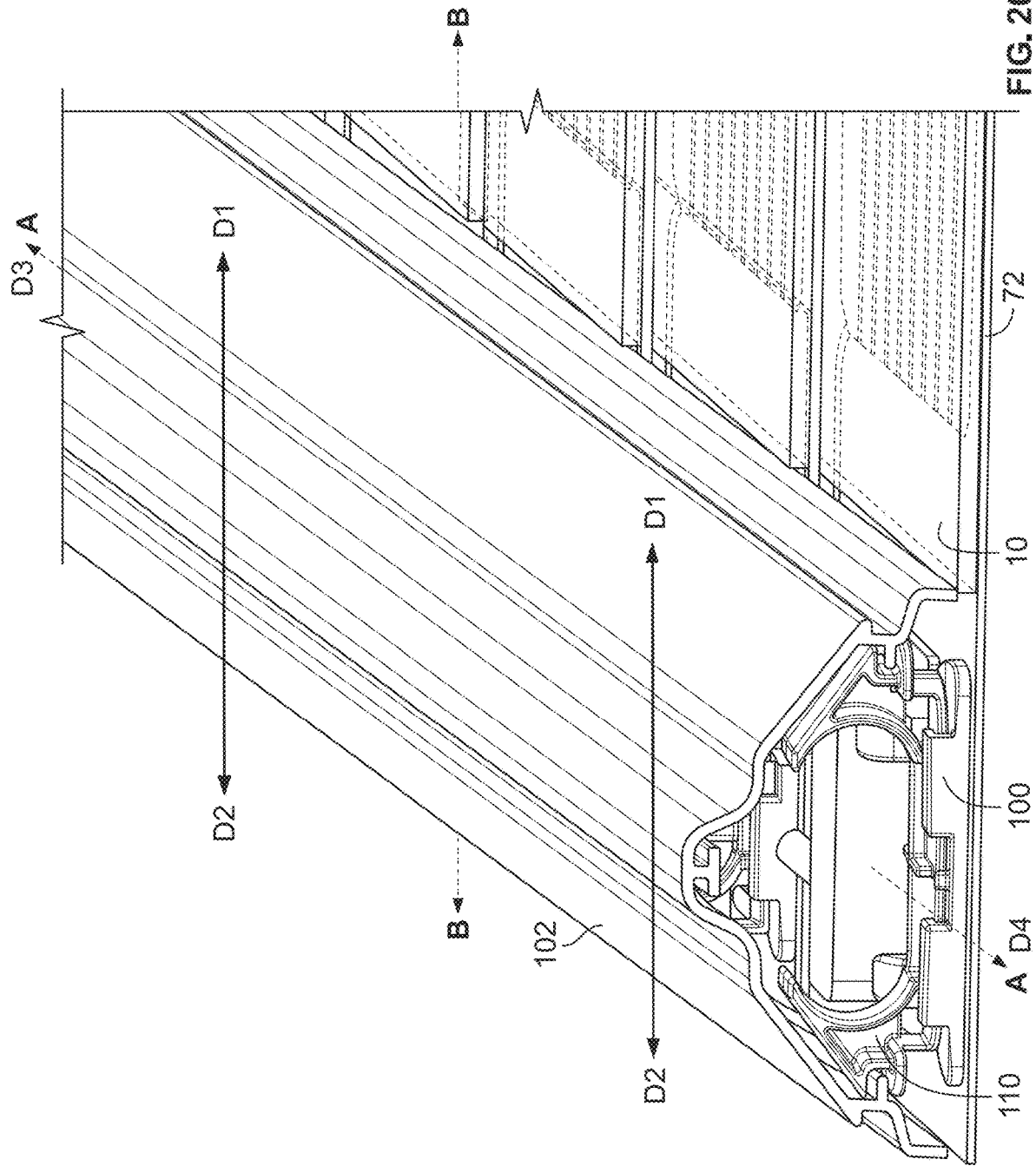

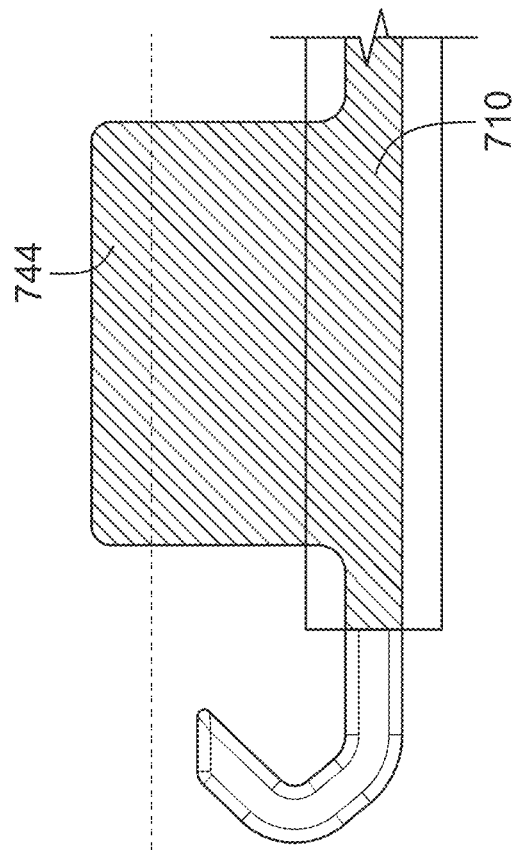
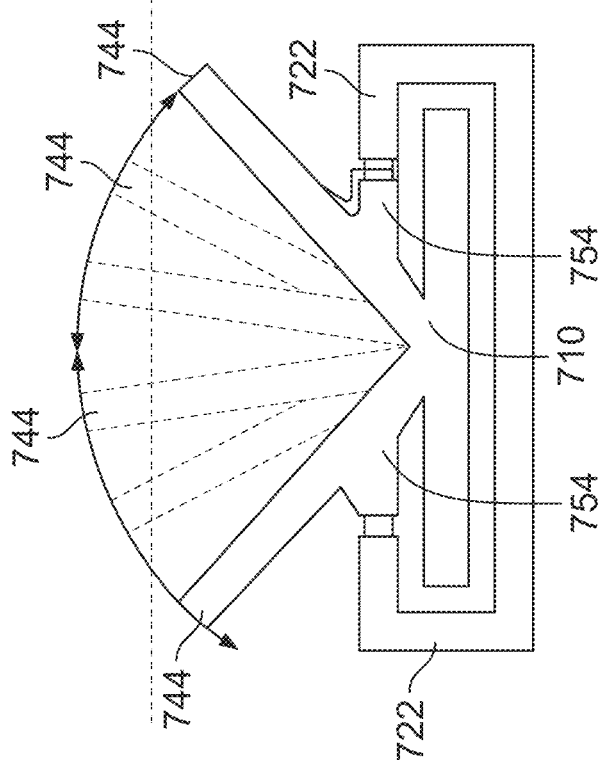
FIG. 41B
FIG. 41A

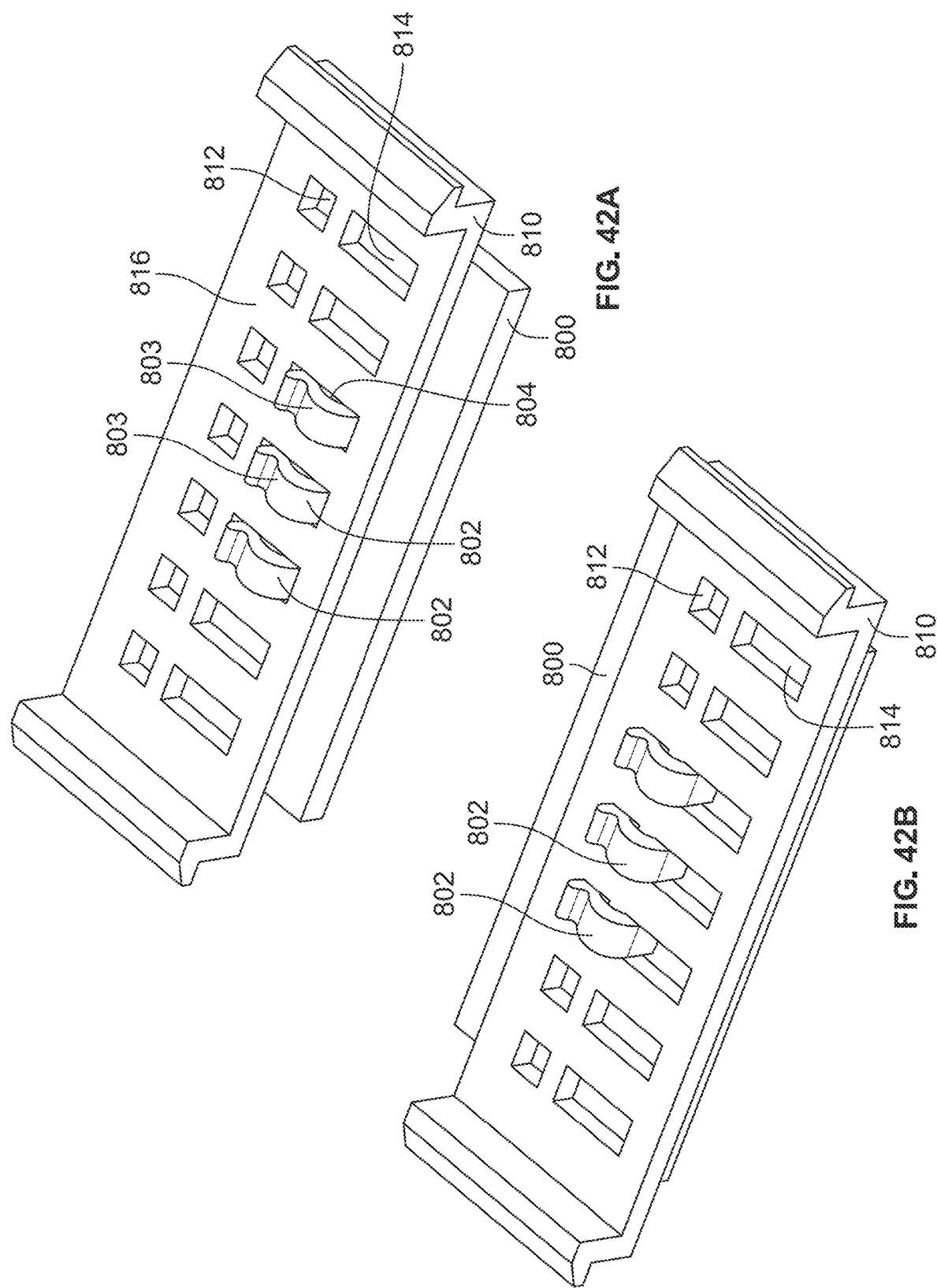

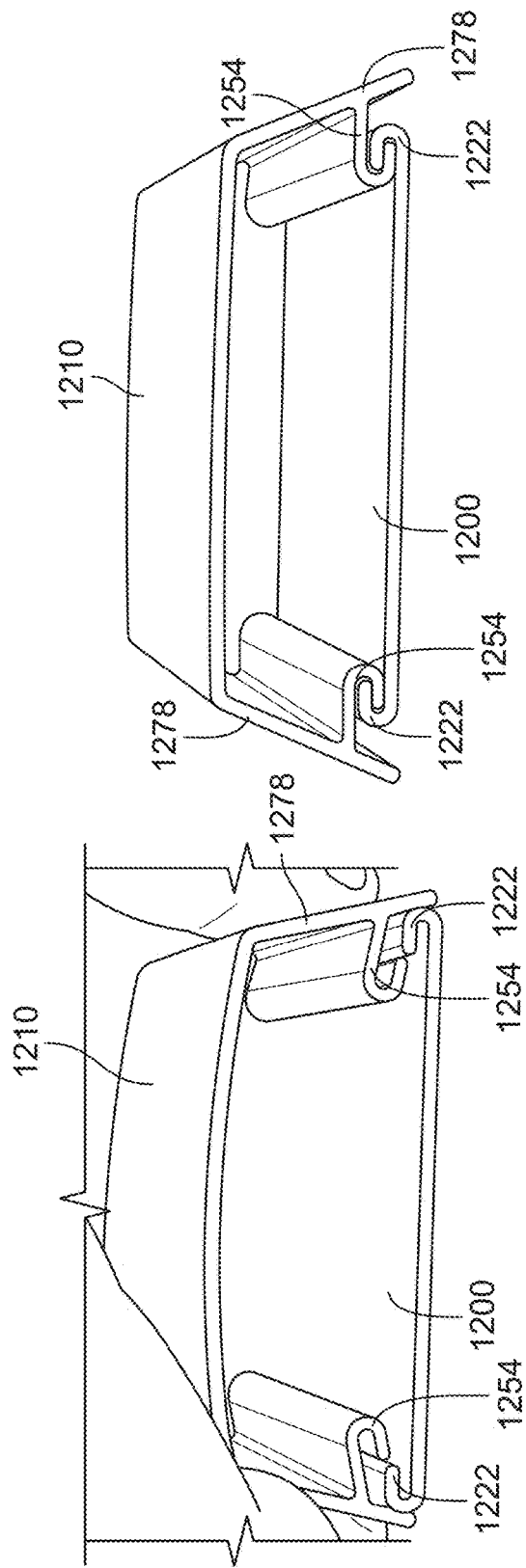
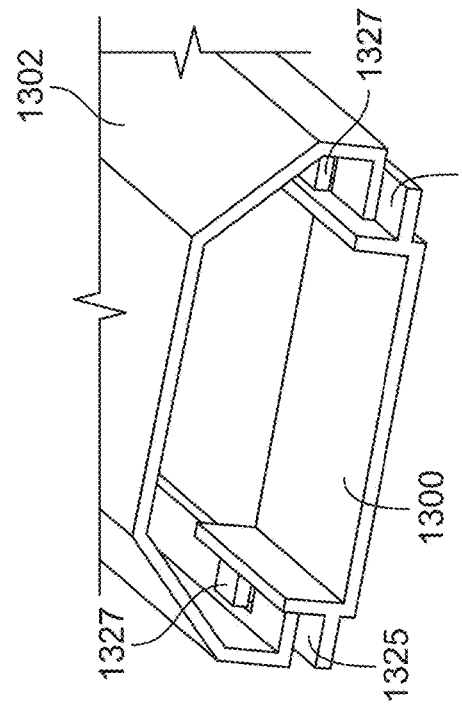
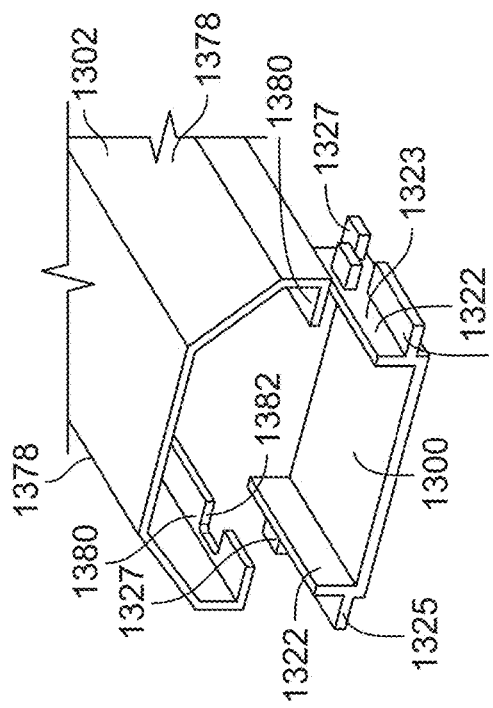

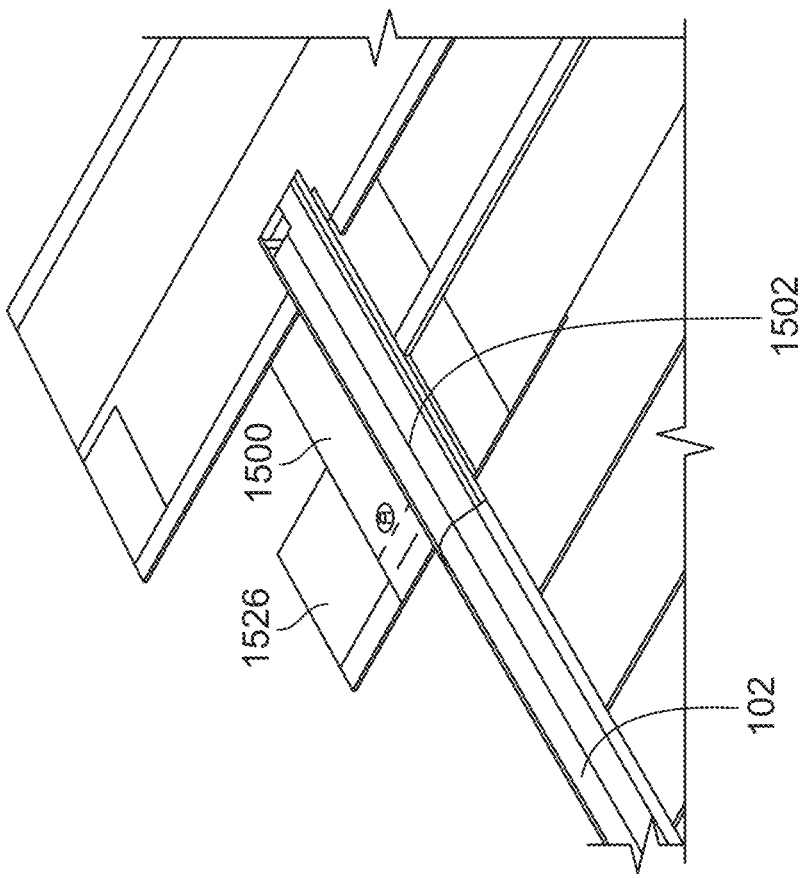
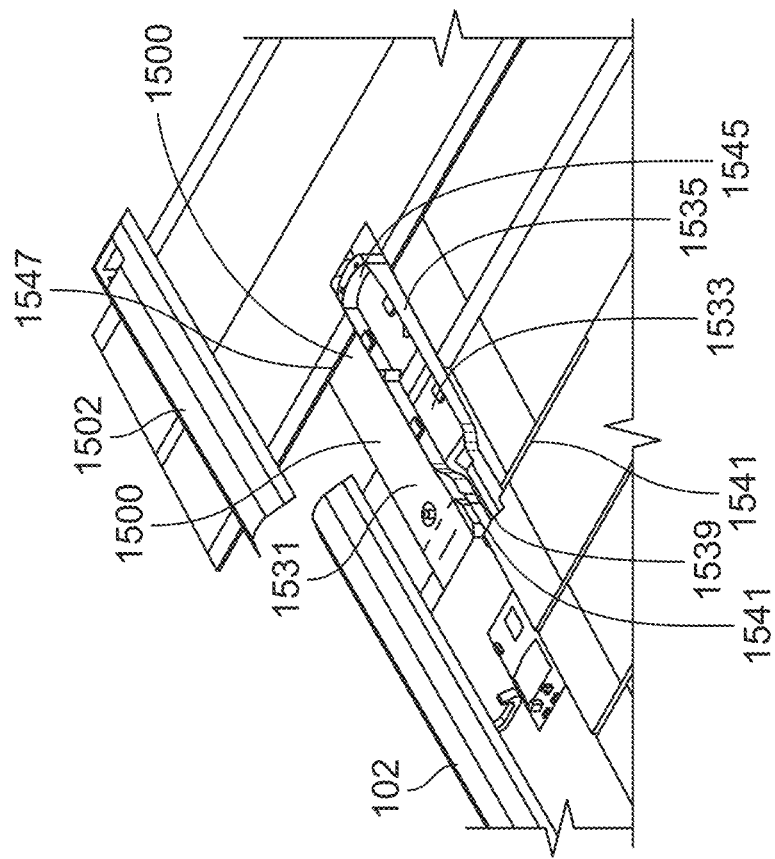
FIG. 54A
FIG. 54B

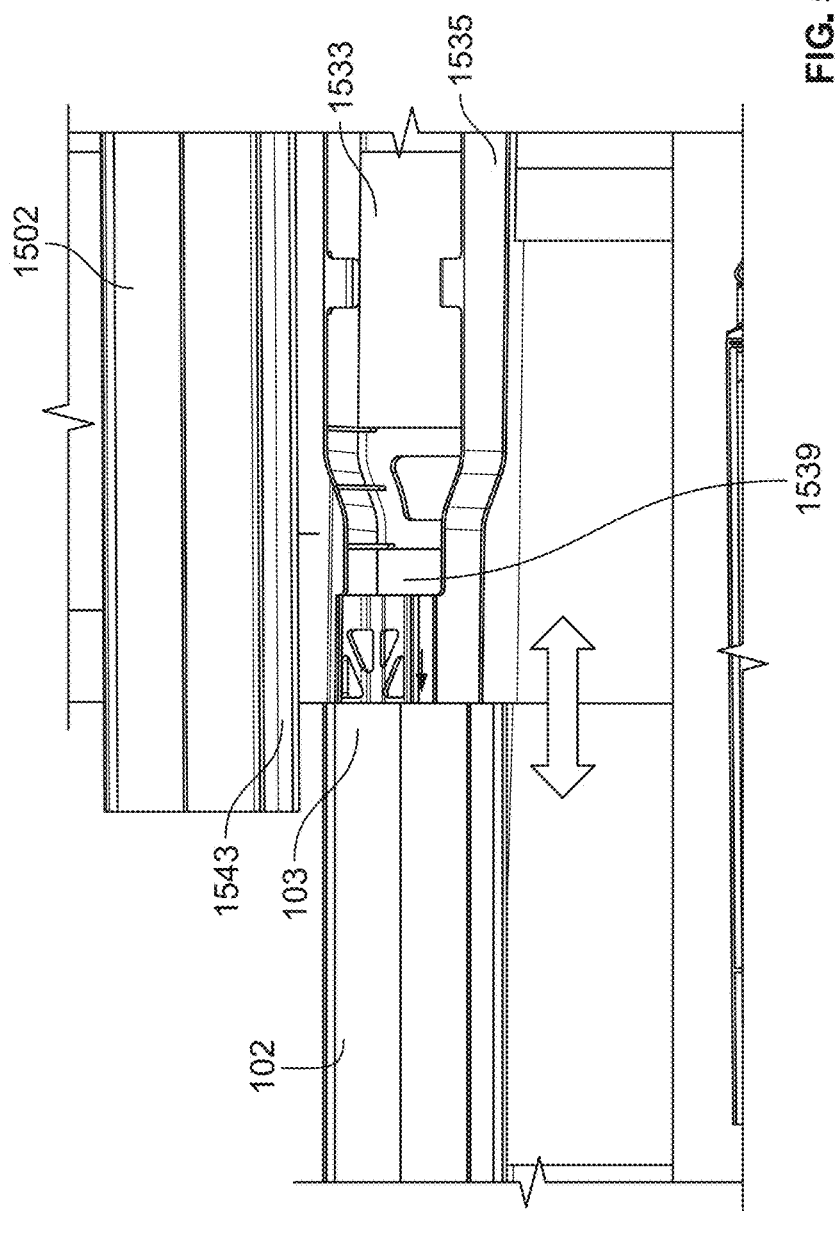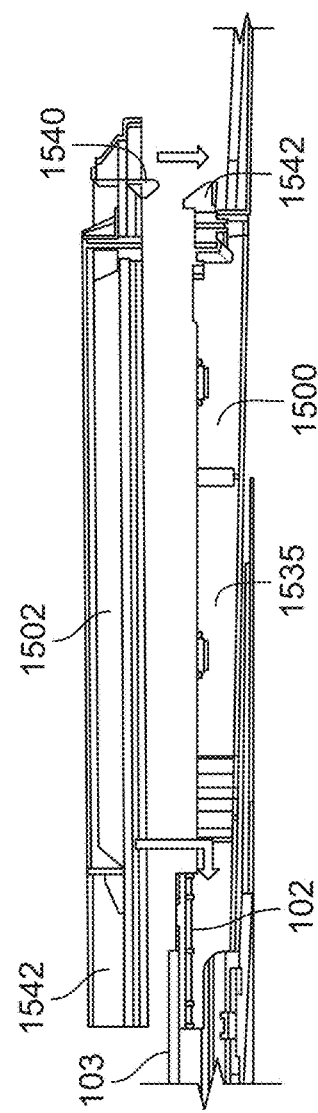

PHOTOVOLTAIC SYSTEMS WITH WIREWAYS

FIELD OF THE INVENTION

The present invention relates to photovoltaic systems and, more particularly, photovoltaic systems with wireways.

BACKGROUND

Photovoltaic systems are installed on building roofs to generate electricity.

SUMMARY

In some embodiments, a system includes a plurality of photovoltaic modules installed on a roof deck, wherein the photovoltaic modules are arranged in an array on the roof deck, wherein each of the photovoltaic modules includes a first end and a second end opposite the first end, a baseplate located at the first end, wherein the baseplate of one of the photovoltaic modules is substantially aligned with the baseplate of an adjacent another one of the photovoltaic modules, and wherein the baseplate is configured to receive at least one electrical component wherein the substantially aligned baseplates include a longitudinal axis; and at least one wire cover removably attached to at least one of the baseplates, and wherein the at least one wire cover is moveable in at least a first direction, and wherein the first direction is transverse relative to the longitudinal axis.

In some embodiments, the at least a first direction includes a first direction and a second direction opposite the first direction. In some embodiments, the baseplate includes a hook member, wherein the hook member is slidably attached to the baseplate, and wherein the at least one wire cover is attached to the hook member. In some embodiments, the hook member is moveable in the first direction and the second direction. In some embodiments, the baseplate includes a plurality of rails, wherein the hook member includes a base, and wherein the plurality of rails slidably receives the base of the hook member. In some embodiments, the hook member includes a first prong and a second prong, wherein a slot is located between the first prong and the second prong, and wherein the slot is sized and shaped to receive at least one electrical cable.

In some embodiments, the wire cover includes an inner surface and at least one tab extending from the inner surface, wherein the hook member includes at least one clip, and wherein the at least one clip is sized and shaped to removably receive a corresponding one of the at least one tab. In some embodiments, the at least one tab includes a plurality of tabs, and wherein the at least one clip includes a plurality of clips. In some embodiments, a first one of the plurality of clips extends from the first prong, and wherein a second one of the plurality of clips extends from the second prong. In some embodiments, the at least one wire cover includes a top portion, a pair of first side portions, each of which extends from the top portion on opposite sides thereof, and a pair of second side portions, each of which extends from a corresponding one of the first side portions. In some embodiments, a first one of the plurality of tabs extends from one of the second side portions, and wherein a second one of the plurality of tabs extends from another one of the second side portions.

In some embodiments, the baseplate includes an upper surface, wherein each of the plurality of clips includes a lower surface, wherein the lower surface of each of the plurality of clips is spaced apart from the upper surface of the baseplate, and wherein a space between the lower surface of each of the plurality of clips and the upper surface of the baseplate is sized and shaped to receive at least one electrical cable. In some embodiments, the hook member includes a stop member, wherein the stop member is located between at least two of the plurality of rails of the baseplate, wherein the stop member is configured to engage a first one of the at least two of the plurality of rails when the hook member is moved in the first direction, and wherein the stop member is configured to engage a second one of the at least two of the plurality of rails when the hook member is moved in the second direction. In some embodiments, at least one wire cover is removably attached to a plurality of the baseplates. In some embodiments, each of the plurality of photovoltaic modules includes a first side lap, and wherein one of the at least one baseplate is attached to the first side lap.

In some embodiments, the system further includes a second baseplate installed on the roof deck, and a second wire cover, wherein each of the plurality of photovoltaic modules includes a second side lap, wherein the first side lap is at the first end of the photovoltaic module, wherein the second side lap is at the second end of the photovoltaic module, wherein the second side lap overlays the second baseplate, and wherein the second wire cover is installed on the second baseplate. In some embodiments, the baseplates of the plurality of photovoltaic modules are configured to form a wireway. In some embodiments, the at least one wire cover includes a plurality of wire covers, and wherein a first one of the plurality of wire covers is coupled with a second one of the plurality of wire covers. In some embodiments, the system further includes a transition box installed on the roof deck, wherein the transition box includes a housing, wherein the housing includes a mating portion, and wherein the mating portion of the transition box is coupled to the at least one wire cover.

In some embodiments, a method includes the steps of obtaining a plurality of photovoltaic modules, wherein each of the photovoltaic modules includes a first end and a second end opposite the first end, a first edge extending from the first end to the second end, and a second edge opposite the first edge and extending from the first end to the second end, a head lap portion, wherein the head lap portion extends from the first end to the second end and from the first edge to a location between the first edge and the second edge, a side lap located at the first end, wherein the side lap includes a length extending from the first end to a location between the first end and the second end, and a baseplate located on the first side lap, wherein the baseplate is configured to receive at least one electrical component; installing at least three of the photovoltaic modules on a slope of a roof deck, wherein a first photovoltaic module of the at least three of the photovoltaic modules is horizontally adjacent to a second photovoltaic module of the at least three of the photovoltaic modules, wherein a third photovoltaic module of the at least three of the photovoltaic modules is vertically adjacent to the first photovoltaic module, wherein the first ends of the first and third photovoltaic modules are substantially aligned with each other, wherein the second ends of the first and third photovoltaic modules are substantially aligned with each other, wherein the first photovoltaic module overlays at least a part of the head lap portion of the third photovoltaic module, wherein the second photovoltaic module overlays at least a part of the side lap of the first photovoltaic module, and wherein the baseplate of the first photovoltaic module is substantially aligned with the baseplate of the third photovoltaic module, wherein the substantially aligned baseplates include a longitudinal axis; installing at least one wire cover to at least one of the baseplates, wherein the at least one wire cover is moveable in at least a first direction, and wherein the first direction is transverse relative to the longitudinal axis; and adjusting a position of the installed at least one wire cover in the at least a first direction.

BRIEF DESCRIPTION OF THE DRAWINGS

FIGS. 1A and 1B are a top plan view and a side elevational view, respectively, of some embodiments of a photovoltaic module;

FIGS. 2 and 3 are schematic views of some embodiments of a photovoltaic module;

FIGS. 17 through 20 are top perspective views of some embodiments of the wire cover shown in FIG. 16 installed on a wireway;

FIGS. 38 through 41B illustrate some embodiments of a hook member and a baseplate;

FIGS. 42A and 42B are top perspective views of some embodiments of a hook member and a baseplate;

FIGS. 48A and 48B illustrate some embodiments of a wire cover installed on a baseplate;

FIGS. 49A and 49B illustrate some embodiments of a hook member and a baseplate;

FIGS. 54A through 55B illustrate some embodiments of a flashing base and wire covers installed on a wireway of a photovoltaic system;

DETAILED DESCRIPTION

Figure 4:
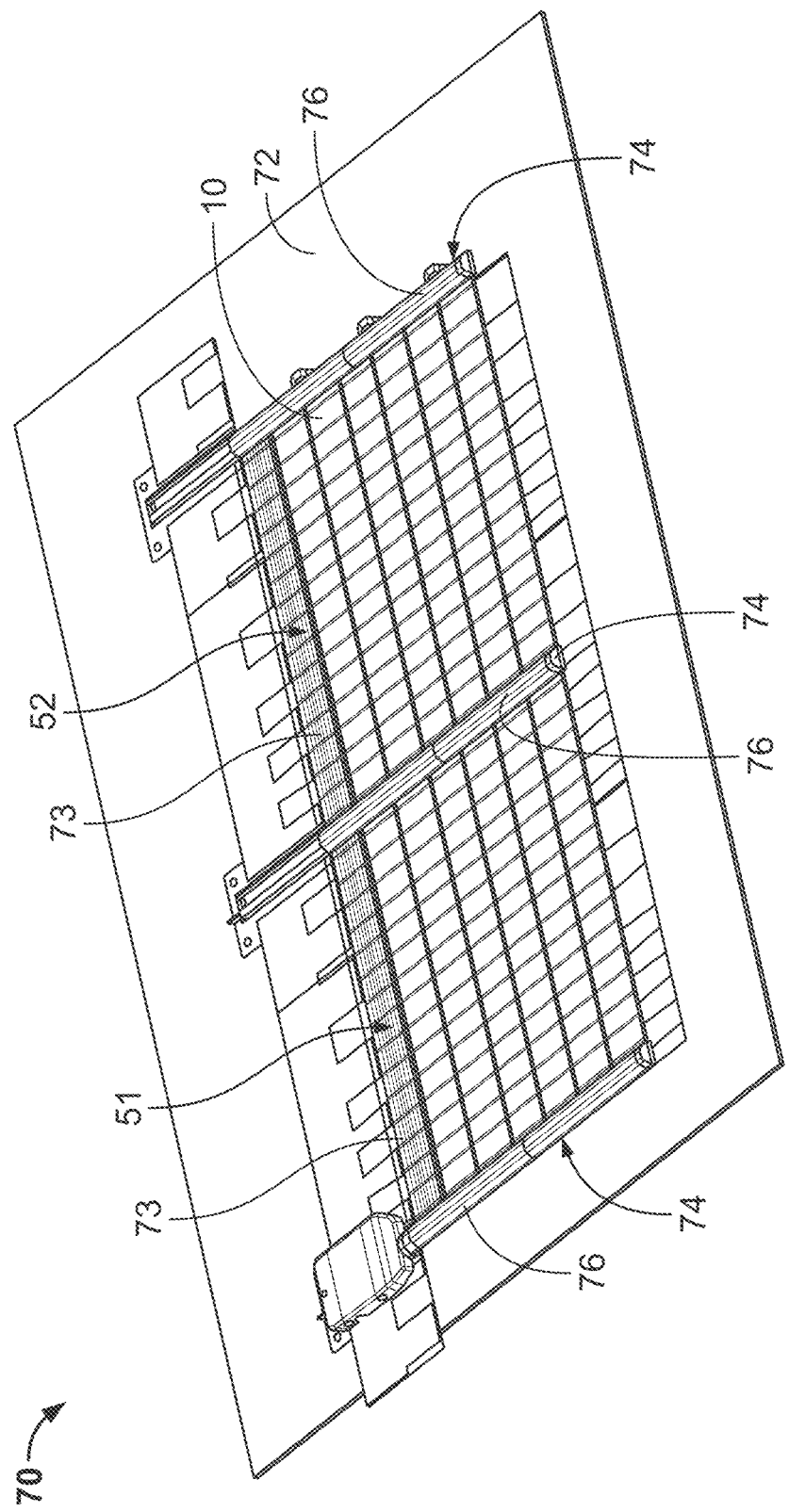
FIG. 4 is a top perspective view of some embodiments of a photovoltaic system.

Referring to FIGS. 1A and 1B, in some embodiments, a photovoltaic module 10 includes a first end 12, a second end 14 opposite the first end 12, a first edge 13 extending from the first end 12 to the second end 14, and a second edge 15 opposite the first edge 13 and extending from the first end 12 to the second end 14. In some embodiments, the photovoltaic module 10 includes a headlap portion 16. In some embodiments, the headlap portion 16 extends from the first end 12 to the second end 14 and from the first edge 13 to a first location 17 between the first edge 13 and the second edge 15. In some embodiments, the photovoltaic module 10 includes a reveal portion 18. In some embodiments, the reveal portion 18 includes at least one solar cell 20. In some embodiments, the photovoltaic module 10 includes a first side lap 22 located at the first end 12. In some embodiments, the first side lap 22 includes a length extending from the first end 12 to a second location 21 between the first end 12 and the second end 14. In some embodiments, the photovoltaic module 10 includes a second side lap 24 located at the second end 14. In some embodiments, the second side lap 24 includes a length extending from the second end 14 to a third location 23 between the first end 12 and the second end 14. In some embodiments, the photovoltaic module 10 includes an outer surface 25 and an inner surface 27 opposite the outer surface 25. In some embodiments, the reveal portion 18 extends from the first side lap 22 to the second side lap 24 and from the second edge 15 to the first location 17. In some embodiments, the photovoltaic module 10 is configured to be installed on a building structure. In some embodiments, at least one junction box 26 is located on the first side lap 22. In some embodiments, the at least one junction box 26 includes a plurality of the junction boxes 26. In some embodiments, the photovoltaic module 10 includes a structure, composition, components, and/or function similar to those of one or more embodiments of the photovoltaic modules disclosed in PCT International Patent Publication No. WO 2022/051593, Application No. PCT/US2021/049017, published Mar. 10, 2022, entitled "Building Integrated Photovoltaic System," owned by GAF Energy LLC, and U.S. Pat. No. 11,251,744 to Bunea et al., issued Feb. 15, 2022, entitled "Photovoltaic Shingles and Methods of Installing Same," the contents of each of which are incorporated by reference herein in their entirety.

In some embodiments, the at least one solar cell 20 includes a plurality of the solar cells 20. In some embodiments, the plurality of solar cells 20 includes two solar cells. In some embodiments, the plurality of solar cells 20 includes three solar cells. In some embodiments, the plurality of solar cells 20 includes four solar cells. In some embodiments, the plurality of solar cells 20 includes five solar cells. In some embodiments, the plurality of solar cells 20 includes six solar cells. In some embodiments, the plurality of solar cells 20 includes seven solar cells. In some embodiments, the plurality of solar cells 20 includes eight solar cells. In some embodiments, the plurality of solar cells 20 includes nine solar cells. In some embodiments, the plurality of solar cells 20 includes ten solar cells. In some embodiments, the plurality of solar cells 20 includes eleven solar cells. In some embodiments, the plurality of solar cells 20 includes twelve solar cells. In some embodiments, the plurality of solar cells 20 includes thirteen solar cells. In some embodiments, the plurality of solar cells 20 includes fourteen solar cells. In some embodiments, the plurality of solar cells 20 includes fifteen solar cells. In some embodiments, the plurality of solar cells 20 includes sixteen solar cells. In some embodiments, the plurality of solar cells 20 includes more than sixteen solar cells.

In some embodiments, the plurality of solar cells 20 is arranged in one row (i.e., one reveal). In another embodiment, the plurality of solar cells 20 is arranged in two rows (i.e., two reveals). In another embodiment, the plurality of solar cells 20 is arranged in three rows (i.e., three reveals). In another embodiment, the plurality of solar cells 20 is arranged in four rows (i.e., four reveals). In another embodiment, the plurality of solar cells 20 is arranged in five rows (i.e., five reveals). In another embodiment, the plurality of solar cells 20 is arranged in six rows (i.e., six reveals). In other embodiments, the plurality of solar cells 20 is arranged in more than six rows. In some embodiments, the at least one solar cell 20 is electrically inactive (i.e., a "dummy" solar cell).

Referring to FIGS. 2 and 3, in some embodiments, the photovoltaic module 10 includes an encapsulant 30 encapsulating the at least one solar cell 20. In some embodiments, the encapsulant 30 includes a first layer 30a having a first surface 32 and a second layer 30b having a second surface 34 opposite the first surface 32. In some embodiments, the photovoltaic module 10 includes a frontsheet 36 juxtaposed with the first surface 32 of the first layer 30a of the encapsulant 30. In some embodiments, the frontsheet 36 includes a glass layer 38. In some embodiments, the frontsheet 36 includes a polymer layer 40 attached to the glass layer 38. In some embodiments, the polymer layer 40 forms an upper surface of the photovoltaic module 10. In some embodiments, the polymer layer 40 is attached to the glass layer 38 by a first adhesive layer 42. In some embodiments, an upper surface 43 of the polymer layer 40 is an upper surface of the photovoltaic module 10. In some embodiments, the upper surface 43 of the polymer layer 40 is textured. In some embodiments, the upper surface 43 of the polymer layer 40 is embossed. In some embodiments, the upper surface 43 of the polymer layer 40 is embossed with a plurality of indentations. In some embodiments, the upper surface 43 of the polymer layer 40 includes a pattern. In some embodiments, the upper surface 43 of the polymer layer 40 includes a printed pattern. In some embodiments, the upper surface 43 of the polymer layer 40 includes an embossed pattern. In some embodiments, the upper surface 43 of the polymer layer 40 includes a textured pattern.

In some embodiments, the photovoltaic module 10 includes a backsheet 44. In some embodiments, the backsheet 44 is juxtaposed with the second surface 34 of the second layer 30b of the encapsulant 30. In some embodiments, the backsheet 44 includes a first surface 46 and a second surface 48 opposite the first surface 46 of the backsheet 44. In some embodiments, the second surface 48 of the backsheet 44 forms a lower surface of the photovoltaic module 10. In some embodiments, the backsheet 44 includes a first layer 50. In some embodiments, the backsheet 44 includes a second layer 52 (see FIG. 3). In some embodiments, the second layer 52 is attached to the first layer 50 by a second adhesive layer 54. In some embodiments, the backsheet 44 includes only one layer (see FIG. 2). In some embodiments, the backsheet 44 includes only the first layer 50 (see FIG. 2). In some embodiments, the backsheet 44 does not include the second layer 52 (see FIG. 2). In some embodiments, the backsheet 44 is composed of a polymer. In some embodiments, the backsheet 44 is composed of thermoplastic polyolefin (TPO). In some embodiments, the backsheet 44 forms the headlap portion 16.

In some embodiments, each of the encapsulant 30, the frontsheet 36, including each of the glass layer 38, the polymer layer 40, and the first adhesive layer 42, and the backsheet 44, including the first layer 50, the second layer 52, and the second adhesive layer 54 of the photovoltaic module 10, as applicable, includes a structure, composition and/or function of similar to those of more or one of the embodiments of the corresponding components disclosed in PCT International Patent Publication No. WO 2022/051593, Application No. PCT/US2021/049017, published Mar. 10, 2022, entitled Building Integrated Photovoltaic System, owned by GAF Energy LLC, and U.S. Pat. No. 11,251,744 to Bunea et al., issued Feb. 15, 2022, entitled "Photovoltaic Shingles and Methods of Installing Same," the contents of each of which are incorporated by reference herein in their entirety.

Referring to FIG. 4, in some embodiments, a system 70 includes a plurality of the photovoltaic modules 10 installed on a roof deck 72. In some embodiments, the plurality of the photovoltaic modules 10 is arranged in an array on the roof deck 72. In some embodiments, the array of the photovoltaic modules 10 includes subarrays S1, S2. In certain embodiments, the array includes more than the two subarrays S1, S2. In some embodiments, the array includes a single array S1. In some embodiments, each of the subarrays S1, S2 include a plurality of rows of the photovoltaic modules 10.

In some embodiments, the reveal portion 18 of one of the photovoltaic modules 10 in the subarray S1 overlays the head lap portion 16 of an adjacent another one of the photovoltaic modules 10 of the subarray S1. In some embodiments, at least a portion of the first side lap 22 of the one of the photovoltaic modules 10 overlays at least a portion of the first side lap 22 of the another one of the photovoltaic modules 10. In some embodiments, at least a portion of the second side lap 24 of the one of the photovoltaic modules 10 overlays at least a portion of the second side lap 24 of the another one of the photovoltaic modules 10.

In some embodiments, the first side lap 22 of one of the photovoltaic modules 10 in the subarray S2 overlays the second side lap 24 of an adjacent another one of the photovoltaic modules 10 in the subarray S1 in the same one of the rows R. In some embodiments, a jumper module 73 overlays an uppermost one of the photovoltaic modules 10 in a column of the subarray S1. In some embodiments, the active portion of the jumper module 73 overlays the head lap portion 16 of the photovoltaic module 10.

In some embodiments, the system 70 includes at least one wireway 74 installed proximate to the first ends 12 of the photovoltaic modules 10. In some embodiments, the at least one wireway 74 is installed proximate to the second end 14 of the photovoltaic modules 10. In some embodiments, the at least one wireway 74 is installed intermediate the first end 12 of one of the photovoltaic modules 10 and a second end 14 of another one of the photovoltaic modules 10. In some embodiments, the at least one wireway 74 includes a wire cover 76. In some embodiments, the wire cover 76 is removably attached to the at least one wireway 74. In some embodiments, the at least one wireway 74 includes a plurality of the wireways 74. In some embodiments, one of the wire covers 76 of one of the plurality of wireways 74 overlaps another of the wire covers 76 of another of the plurality of wireways 74. In some embodiments, the at least one wireway 74 includes a height of 1 mm to 20 mm. In some embodiments, the at least one wireway 74 includes a single wireway installed proximate to the first end of each of the photovoltaic modules 10. In some embodiments, the at least one wireway 74 does not include any electrical components or electrical wires or cables therein. In some embodiments, the at least one wireway 74 and the wire covers 76 include a structure, composition and/or function of similar to those of more or one of the embodiments of the wireways and wire covers disclosed in PCT International Patent Publication No. WO 2022/051593, Application No. PCT/US2021/049017, published Mar. 10, 2022, entitled Building Integrated Photovoltaic System, owned by GAF Energy LLC, and U.S. Pat. No. 11,251,744 to Bunea et al., issued Feb. 15, 2022, entitled "Photovoltaic Shingles and Methods of Installing Same," the contents of each of which are incorporated by reference herein in their entirety.

Figure 5:
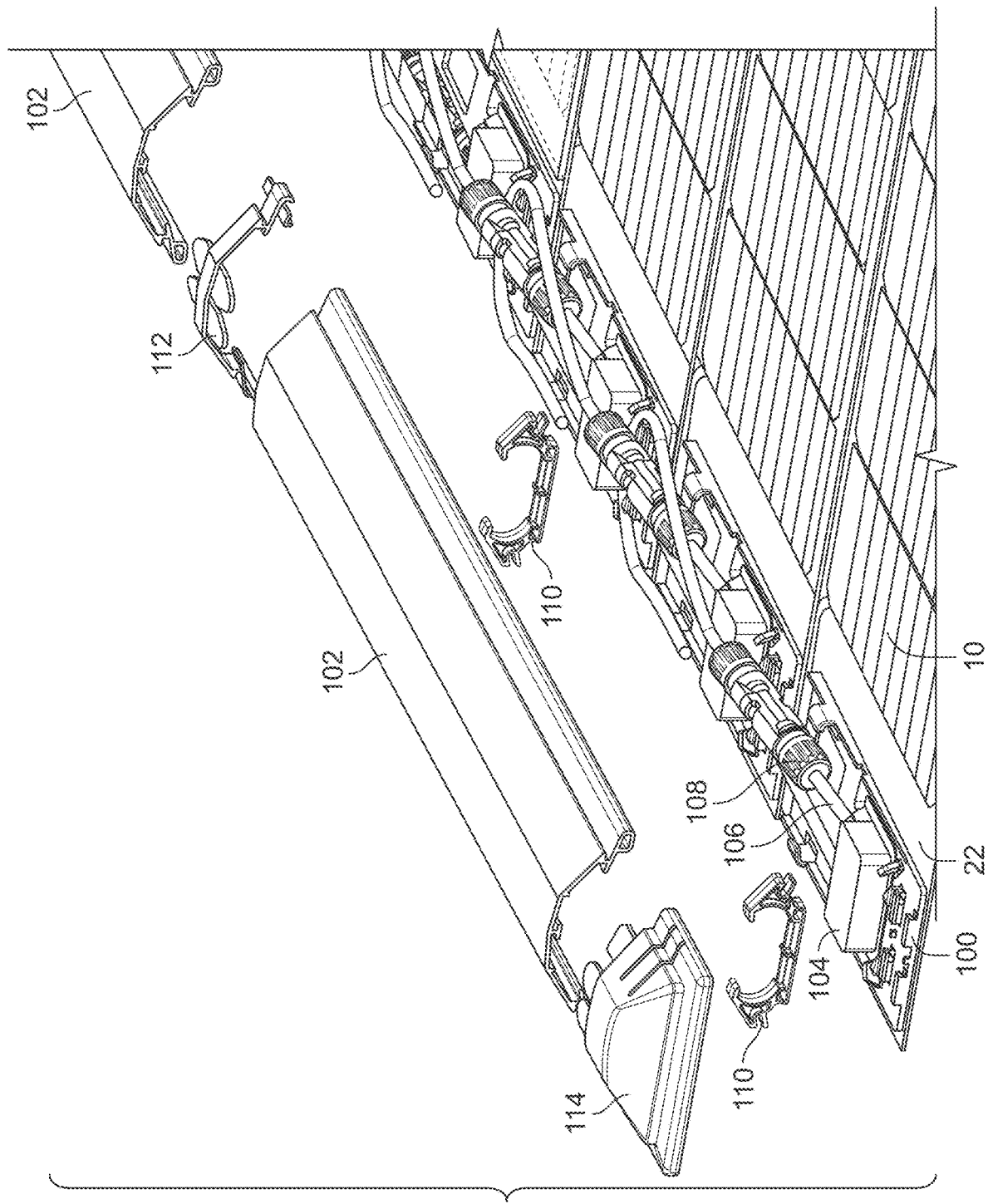
FIG. 5 is a top perspective, exploded view of some embodiments of a wireway of a photovoltaic system.

Referring to FIG. 5, in some embodiments, each of the photovoltaic modules 10 includes a baseplate 100. In some embodiments, the baseplate 100 is installed on the first side lap 22 of the photovoltaic module 10. In some embodiments, the baseplate 100 is composed of a polymer. In some embodiments, the baseplate 100 is composed of a composite material. In some embodiments, the baseplate 100 is composed of a reinforced plastic. In some embodiments, the baseplate 100 is composed of a fiber-reinforced polymer. In some embodiments, the baseplate 100 is composed of fiberglass. In some embodiments, the baseplate 100 is injection molded. In some embodiments, the baseplate 100 is configured to receive a wire cover 102, which shall be described in detail hereinafter. In some embodiments, the baseplate 100 is attached to the first side lap 22 by an adhesive. In some embodiments, the baseplate 100 is attached to the first side lap 22 by thermal bonding. In some embodiments, the baseplate 100 is attached to the first side lap 22 by ultrasonic welding.

In some embodiments, the baseplate 100 has a height of 1 mm to 10 mm. In some embodiments, the baseplate 100 has a height of 1 mm to 9 mm. In some embodiments, the baseplate 100 has a height of 1 mm to 8 mm. In some embodiments, the baseplate 100 has a height of 1 mm to 7 mm. In some embodiments, the baseplate 100 has a height of 1 mm to 6 mm. In some embodiments, the baseplate 100 has a height of 1 mm to 5 mm. In some embodiments, the baseplate 100 has a height of 1 mm to 4 mm. In some embodiments, the baseplate 100 has a height of 1 mm to 3 mm. In some embodiments, the baseplate 100 has a height of 1 mm to 2 mm. In some embodiments, the baseplate 100 has a height of 2 mm to 10 mm. In some embodiments, the baseplate 100 has a height of 2 mm to 9 mm. In some embodiments, the baseplate 100 has a height of 2 mm to 8 mm. In some embodiments, the baseplate 100 has a height of 2 mm to 7 mm. In some embodiments, the baseplate 100 has a height of 2 mm to 6 mm. In some embodiments, the baseplate 100 has a height of 2 mm to 5 mm. In some embodiments, the baseplate 100 has a height of 2 mm to 4 mm. In some embodiments, the baseplate 100 has a height of 2 mm to 3 mm. In some embodiments, the baseplate 100 has a height of 3 mm to 10 mm. In some embodiments, the baseplate 100 has a height of 3 mm to 9 mm. In some embodiments, the baseplate 100 has a height of 3 mm to 8 mm. In some embodiments, the baseplate 100 has a height of 3 mm to 7 mm. In some embodiments, the baseplate 100 has a height of 3 mm to 6 mm. In some embodiments, the baseplate 100 has a height of 3 mm to 5 mm. In some embodiments, the baseplate 100 has a height of 3 mm to 4 mm. In some embodiments, the baseplate 100 has a height of 4 mm to 10 mm. In some embodiments, the baseplate 100 has a height of 4 mm to 9 mm. In some embodiments, the baseplate 100 has a height of 4 mm to 8 mm. In some embodiments, the baseplate 100 has a height of 4 mm to 7 mm. In some embodiments, the baseplate 100 has a height of 4 mm to 6 mm. In some embodiments, the baseplate 100 has a height of 4 mm to 5 mm.

In some embodiments, the baseplate 100 has a height of 5 mm to 10 mm. In some embodiments, the baseplate 100 has a height of 5 mm to 9 mm. In some embodiments, the baseplate 100 has a height of 5 mm to 8 mm. In some embodiments, the baseplate 100 has a height of 5 mm to 7 mm. In some embodiments, the baseplate 100 has a height of 5 mm to 6 mm. In some embodiments, the baseplate 100 has a height of 6 mm to 10 mm. In some embodiments, the baseplate 100 has a height of 6 mm to 9 mm. In some embodiments, the baseplate 100 has a height of 6 mm to 8 mm. In some embodiments, the baseplate 100 has a height of 6 mm to 7 mm. In some embodiments, the baseplate 100 has a height of 7 mm to 10 mm. In some embodiments, the baseplate 100 has a height of 7 mm to 9 mm. In some embodiments, the baseplate 100 has a height of 7 mm to 8 mm. In some embodiments, the baseplate 100 has a height of 8 mm to 10 mm. In some embodiments, the baseplate 100 has a height of 8 mm to 9 mm. In some embodiments, the baseplate 100 has a height of 9 mm to 10 mm.

In some embodiments, the baseplate 100 has a height of 1 mm. In some embodiments, the baseplate 100 has a height of 2 mm. In some embodiments, the baseplate 100 has a height of 3 mm. In some embodiments, the baseplate 100 has a height of 4 mm. In some embodiments, the baseplate 100 has a height of 5 mm. In some embodiments, the baseplate 100 has a height of 6 mm. In some embodiments, the baseplate 100 has a height of 7 mm. In some embodiments, the baseplate 100 has a height of 8 mm. In some embodiments, the baseplate 100 has a height of 9 mm. In some embodiments, the baseplate 100 has a height of 10 mm.

In some embodiments, the baseplate 100 is configured to receive one or more electronic components. In some embodiments, the electronic components include a junction box 104, electrical wires 106 and electrical connectors 108. In some embodiments, the baseplate 100 is configured to receive a hook member 110. In some embodiments, the wire cover 102 is removably attached to the hook member 110. In some embodiments, a coupler 112 is configured to couple ends of two of the wire covers 102. In some embodiments, a lower end of a lower one of the wire covers 102 is sized and shaped to receive an end cap 114. In some embodiments, the hook member 110 need not be included and the wire cover 102 is attached directly to the baseplate 100, such as with locking rails, tabs, pins or snaps.

Figure 6:
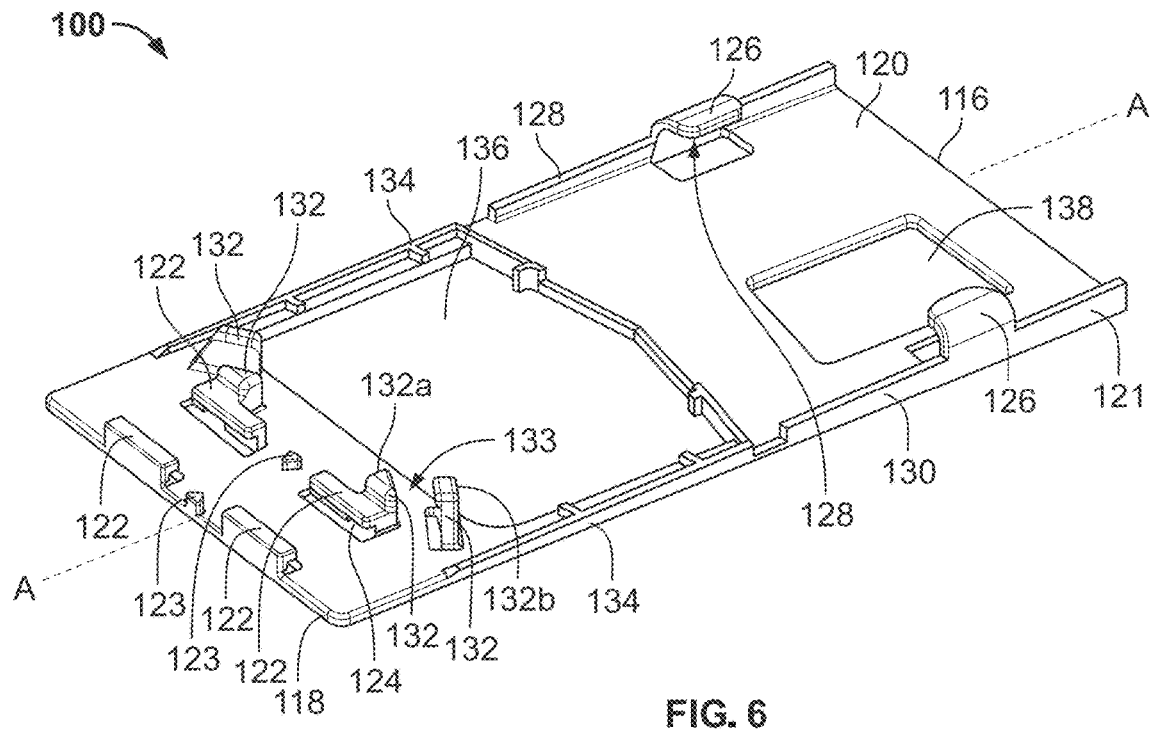
FIG. 6 is a top perspective view of some embodiments of a baseplate.

Referring to FIG. 6, in some embodiments, the baseplate 100 includes first end 116, a second end 118 opposite the first end 116, and a first surface 120. In some embodiments, the first surface 120 is an upper surface of the baseplate 100. In some embodiments, the baseplate 100 include a plurality of rails 122 extending from the first surface 120. In some embodiments, the rails 122 are located at the second end 118. In some embodiments, a slot 124 is located between each of the rails 122 and the first surface 120. In some embodiments, at least one of the rails 122 is spaced apart from another of the rails 122. In some embodiments, the plurality of rails 122 includes two of the rails. In some embodiments, the plurality of rails 122 includes three of the rails. In some embodiments, the plurality of rails 122 includes four of the rails. In some embodiments, the plurality of rails 122 includes more than four of the rails. In some embodiments, the plurality of rails 122 includes a first pair of rails and a second pair of rails. In some embodiments, each of the first pair of rails 122 is spaced apart from a corresponding one of the second pair of rails. In some embodiments, the plurality of rails 122 form a track.

In some embodiments, the baseplate 100 includes at least one tab 123 extending from the first surface 120. In some embodiments, the at least one tab 123 includes a plurality of the tabs 123. In some embodiments, the plurality of tabs 123 includes two of the tabs 123. In some embodiments, the tabs 123 are spaced apart from one another.

In some embodiments, the baseplate 100 includes at least one clip 126. In some embodiments, the at least one clip 126 extends outwardly from the first surface 120. In some embodiments, the at least one clip 126 is curvilinear in shape and includes a slot 128. In some embodiments, the at least one clip 126 includes a plurality of the clips 126. In some embodiments, the slot 128 is sized and shaped to receive and hold an electrical wire or cable therein. In some embodiments, one of the plurality of clips 126 is located proximate to a sidewall 130 and proximate to the first end 116. In some embodiments, another of the plurality of clips 126 is located proximate to a sidewall 130 and proximate to the first end 116.

In some embodiments, the baseplate 100 includes a plurality of guiderails 132 extending from the first surface 120. In some embodiments, each of the guiderails 132 is composed of a first portion 132*a* and a second portion 132*b* spaced apart from the first portion 132*a*. In some embodiments, a slot 133 is formed between the first portion 132*a* and a second portion 132*b*. In some embodiments, the first portion 132*a* and a second portion 132*b* are oblique relative to a longitudinal axis A-A of the baseplate 100. In some embodiments, the guiderails 132 are configured to guide an electrical cable or wire extending within the baseplate 100. In some embodiments, the guiderail 132 maintains the cable or wire a distance away from side edges 134 of the baseplate 100 so that the cable/wire does not impede the attachment of an associated wire cover 102 to the baseplate 100. In some embodiments, the baseplate 100 includes only one of the guiderails 132.

In some embodiments, the baseplate 100 includes a first cutout 136 extending from the first surface 120 to a second surface 121 opposite the first surface 120. In some embodiments, the first cutout 136 is sized and shaped to receive an electrical component. In some embodiments, the electrical component is the junction box 104. In some embodiments, the baseplate 100 includes a second cutout 138. In some embodiments, the second cutout 138 is for weight and material savings of the baseplate 100.

In some embodiments, a corresponding one of the baseplate 100 is located on the first side lap 22 of each of the plurality of photovoltaic modules 10. In some embodiments, the baseplate 100 is attached to the first side lap 22. In some embodiments, the baseplate 100 is attached to the first side lap 22 by an adhesive. In some embodiments, the baseplate 100 includes a sealant located on a second surface 121. In some embodiments, the sealant is composed of a room temperature vulcanizing material. In some embodiments, the sealant is composed of silicone. In some embodiments, the sealant is located around a perimeter of the second surface 121. In some embodiments, the baseplate 100 is attached to the first side lap 22 by thermal bonding. In some embodiments, the baseplate 100 is attached to the first side lap 22 by ultrasonic welding. In some embodiments, the baseplate 100 is laminated with the first side lap 22. In some embodiments, the baseplate 100 is attached to the second side lap 24 of the photovoltaic module 10.

Figure 7:
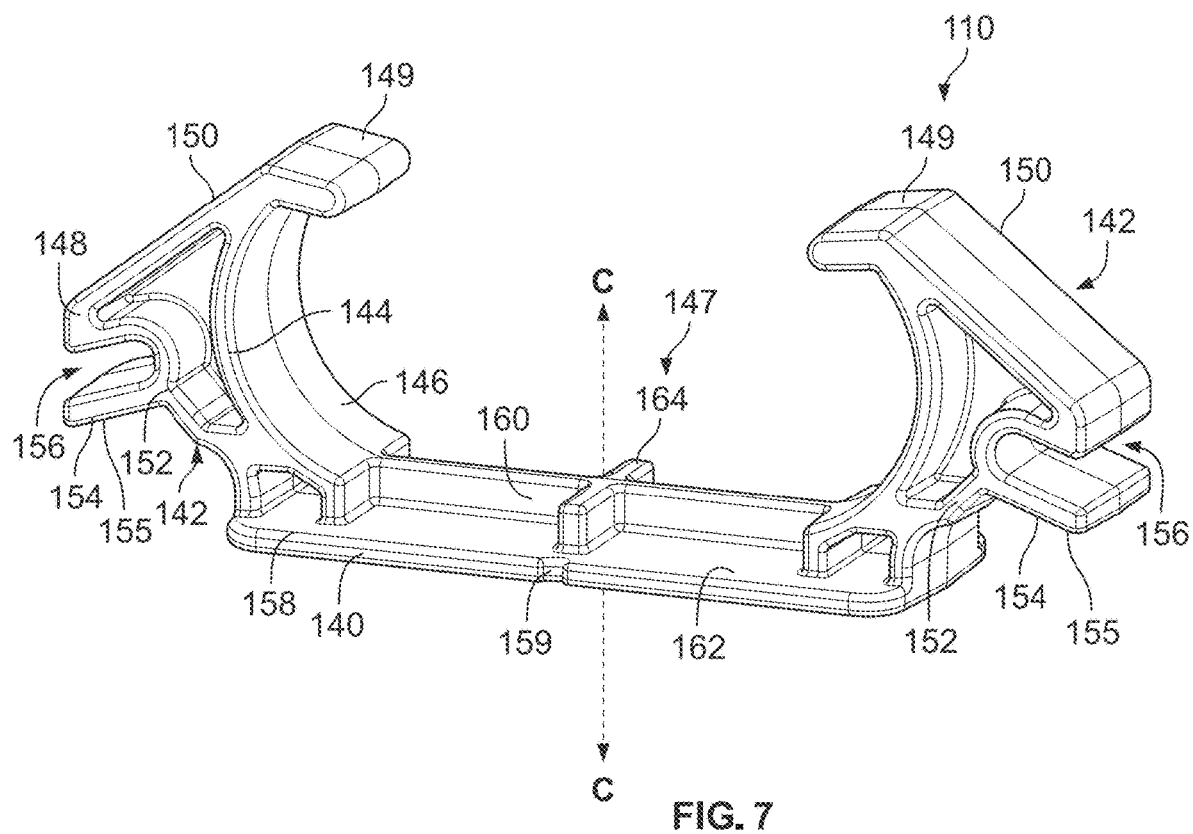
FIG. 7 is a front perspective view of some embodiments of a hook member.

Referring to FIG. 7, in some embodiments, the hook member 110 includes a base 140 and a pair of prongs 142 extending from the base 140. In some embodiments, the prongs 142 are spaced apart from one another. In some embodiments, the prongs 142 have the same structure, size and shape, but are a mirror image of one another. In some embodiments, each of the prongs 142 includes a first member 144. In some embodiments, the first member 144 includes a curved, concave inner surface 146. In some embodiments, the prongs 142 form a slot 147 between the first members 144 thereof. In some embodiments, the first member 144 includes an upper lip 149 and at end upper end thereof. In some embodiments, the upper lip 149 extends inwardly at the upper end. In some embodiments, the each of the prongs 142 includes a second member 148. In some embodiments, the second member 148 includes a first portion 150 and a second portion 152. In some embodiments, the first portion 150 extends obliquely and outwardly relative to a transverse axis C-C of the hook member 110. In some embodiments, the second portion 152 extends obliquely and inwardly relative to the transverse axis C-C. In some embodiments, each of the prongs 142 includes a clip 154. In some embodiments, the clip 154 is located between the first portion 150 and the second portion 152. In some embodiments, the clip 154 includes a slot 156. In some embodiments, the slot 156 is sized and shaped to receive a portion of the wire cover 102, which will be described in further detail below. In some embodiments, the clip 154 includes a lower surface 155.

In some embodiments, the base 140 includes side edges 158. In some embodiments, the base 140 includes a beam 160 extending outwardly from an upper surface 162 thereof. In some embodiments, the beam 160 extends between the prongs 142. In some embodiments, the base 140 includes a stop member 164 extending from the upper surface 162. In some embodiments, the stop member 164 is perpendicular or substantially perpendicular to the beam 160. In some embodiments, the stop member 164 extends between the side edges 158. In some embodiments, at least one of the side edges 158 of the base 140 includes at least one notch 159 formed therein. In some embodiments each of the side edges 158 of the base 140 includes the notch 159.

Figure 9A:
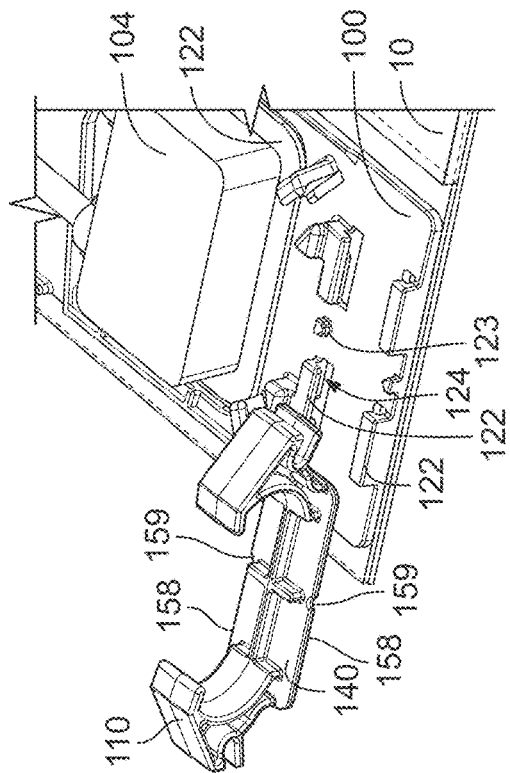
FIGS. 8 through 10 are top perspective views of some embodiments of the baseplate shown in FIG. 6 and the hook member shown in FIG. 7 installed in a wireway.
Figure 9B:
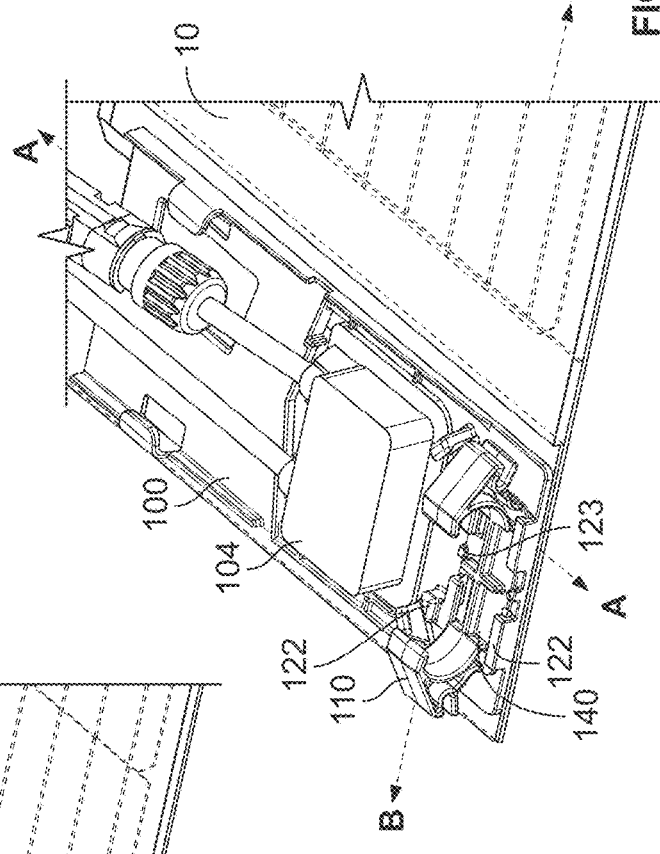
Figure 8:
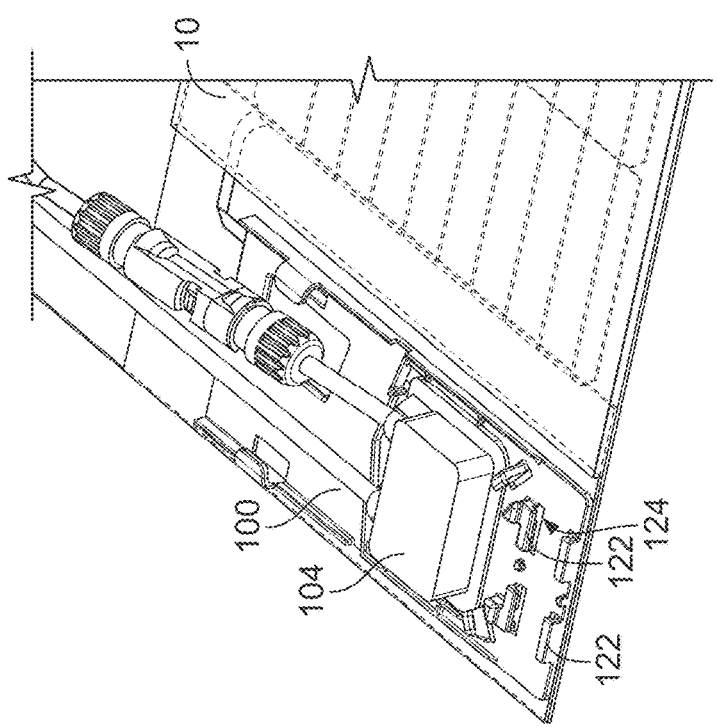
Figure 10:
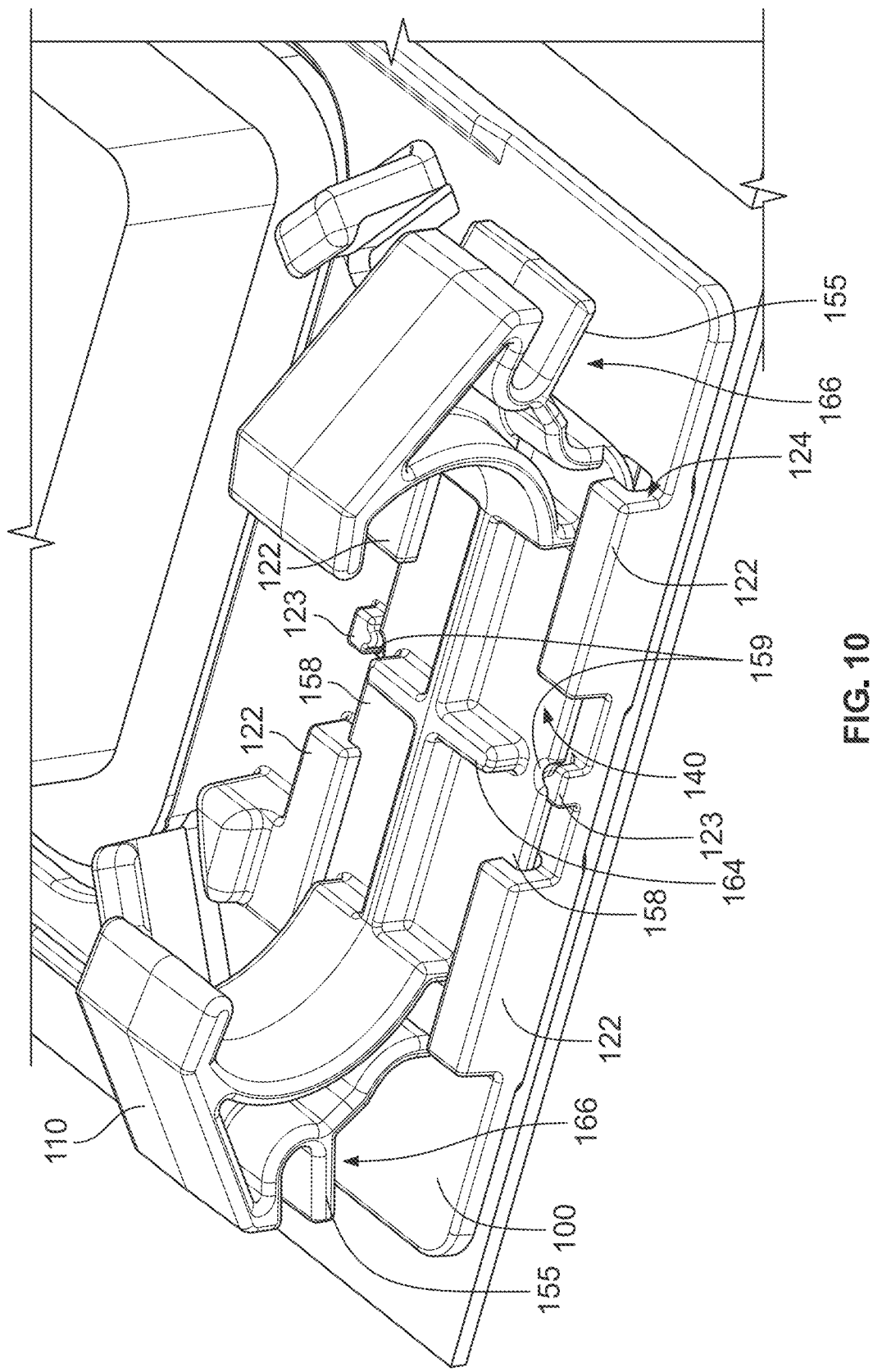
Figure 12A:
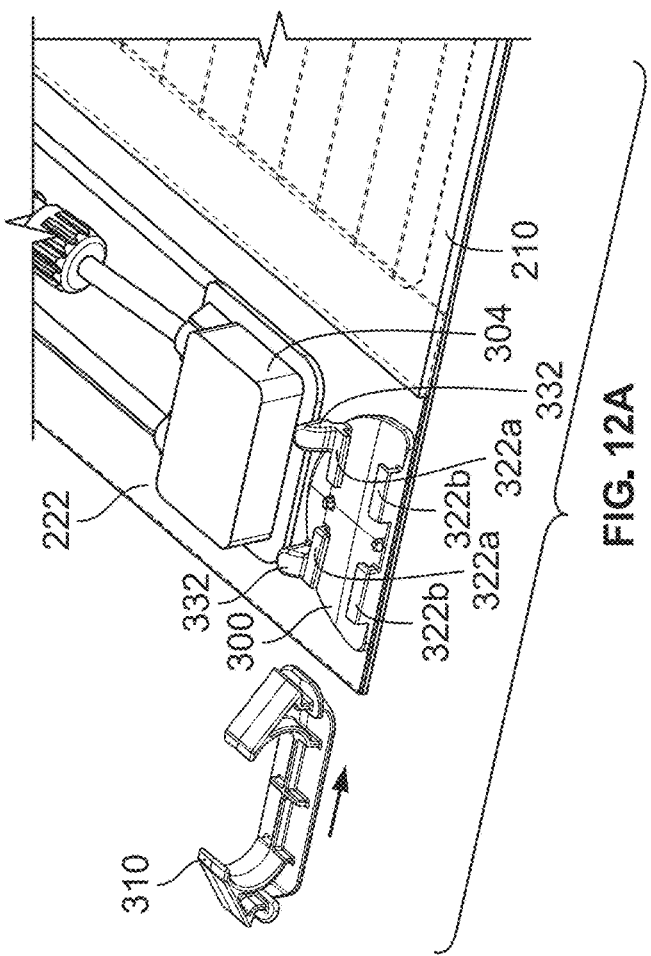
FIGS. 12A through 15 are top perspective views of some embodiments of the baseplate shown in FIG. 11 and the hook member shown in FIG. 7 installed in a wireway.
Figure 11:
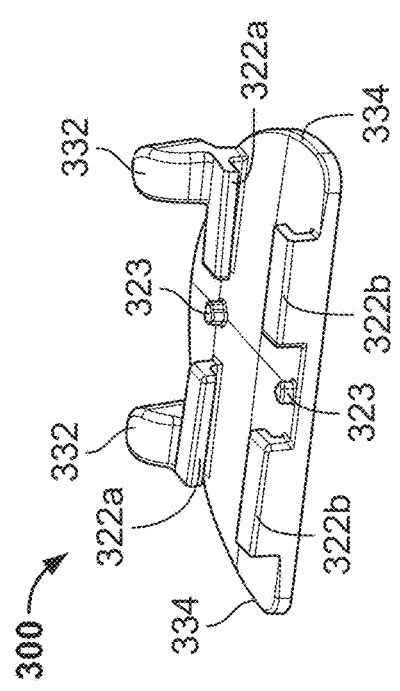
FIG. 11 is a top perspective view of some embodiments of a baseplate.
Figure 12B:
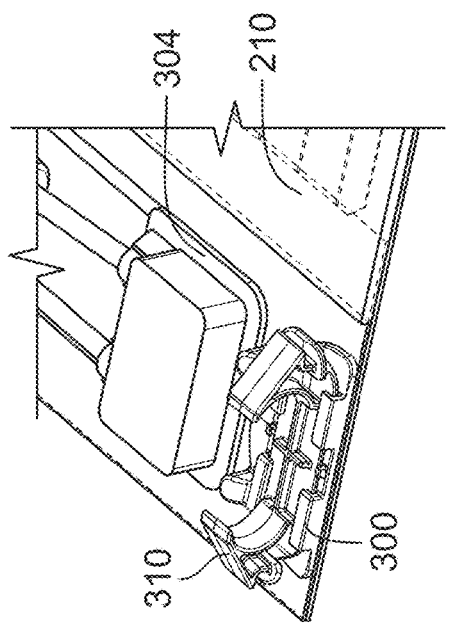

Referring to FIGS. 8 through 10, in some embodiments, the hook member 110 is installed on the baseplate 100. In some embodiments, the hook member 110 is removably installed on the baseplate 100. In some embodiments, the slots 124 of each of the rails 122 of the baseplate 100 are sized and shaped to slidably receive the corresponding side edges 158 of the base 140 of the hook member 110. In some embodiments, each of the tabs 123 of the baseplate 100 is sized and shaped to engage a corresponding one of the notches 159 of the hook member 110. In some embodiments, the tabs 123 and the notches 159 are configured to center the hook member 110 relative to the baseplate 100. In some embodiments, the tabs 123 and the notches 159 are configured to center the hook member 110 relative to the baseplate 100 to facilitate alignment and installation of the wire cover 102. In some embodiments, the hook member 110 is friction fit into the baseplate 100. In some embodiments, the friction fit of the hook member 110 in the baseplate 100 prevents the hook member 110 from inadvertently moving relative to the baseplate 100. In some embodiments, the side edges 158 of the base 140 of the hook member 110 are friction fit with the rails 122 of the baseplate 100. In some embodiments, when the hook member 110 is installed on the baseplate 100, the stop member 164 engages ends of a corresponding pair of the rails 122 spaced apart longitudinally from one another to prevent the hook member 110 from traveling to far relative to the baseplate 100 and falling out of the baseplate 100. In some embodiments, the stop member 164 is configured to act as a visual guide to center the hook member 110 relative to the baseplate 100 by alignment with the tabs 123 of the baseplate 100. In some embodiments, the position of the hook member 110 on the baseplate 100 is adjustable. In some embodiments, the position of the hook member 110 on the baseplate 100 is slidably adjustable. the position of the hook member 110 on the baseplate 100 is slidably adjustable in order to adjust the position of the wire cover 102, which will be described in further detail below.

In some embodiments, the slot 147 of the hook member 110 is sized and shaped to receive the at least one of the electrical connectors 108 therein. In some embodiments, the slot 147 of the hook member 110 is sized and shaped to receive a plurality of the electrical connectors 108 therein. In some embodiments, the inner surfaces 146 of the first members 144 of the prongs 142 are sized and shaped such that the electrical connectors 108 may be juxtaposed with them and facilitate the securement of the wires 106 on the baseplate 100. In some embodiments, a space 166 is formed between each of the lower surfaces 155 of the clips 154 and the first surface 120 of the baseplate 100. In some embodiments, the spaces 166 are sized and shaped to receive a portion of the electrical wire 106. In some embodiments, the position of the wire 106 is maintained or substantially maintained around the hook member 110 when the wire 106 is located within one or both of the spaces 166.

FIGS. 11 through 15 illustrate some embodiments of a baseplate 300. In some embodiments, the baseplate 200 is similar in structure and function to those of the baseplate 100 with some differences. In some embodiments, the baseplate 300 is attached to a first side lap 222 of a photovoltaic module 210. In some embodiments, the baseplate 300 includes a length that is shorter than a length of the baseplate 100. In some embodiments, a junction box 304 is located adjacent to the baseplate 300. In some embodiments, the junction box 304 is attached to the first side lap 222 of the photovoltaic module 210. In some embodiments, the baseplate 300 includes a plurality of rails 322a, 322b. In some embodiments, each of the rails 322a is spaced apart from a corresponding one of the rails 322b. In some embodiments, the rails 322a, 322b are configured to slidably receive a hook member 310. In some embodiments, the baseplate 300 includes at least one tab 323. In some embodiments, the baseplate 300 includes a plurality of the tabs 323. In some embodiments, the tabs 323 have a similar structure and function to the tabs 123 described above.

In some embodiments, the baseplate 300 includes at least one guiderail 332. In some embodiments, the at least one guiderail 332 includes a plurality of guiderails 332. In some embodiments, each of the guiderails 332 is located adjacent to a corresponding one of the rails 322a, 322b. In some embodiments, each of the guiderails 332 is integrally formed with a corresponding one of the rails 322a, 322b.

Figure 13:
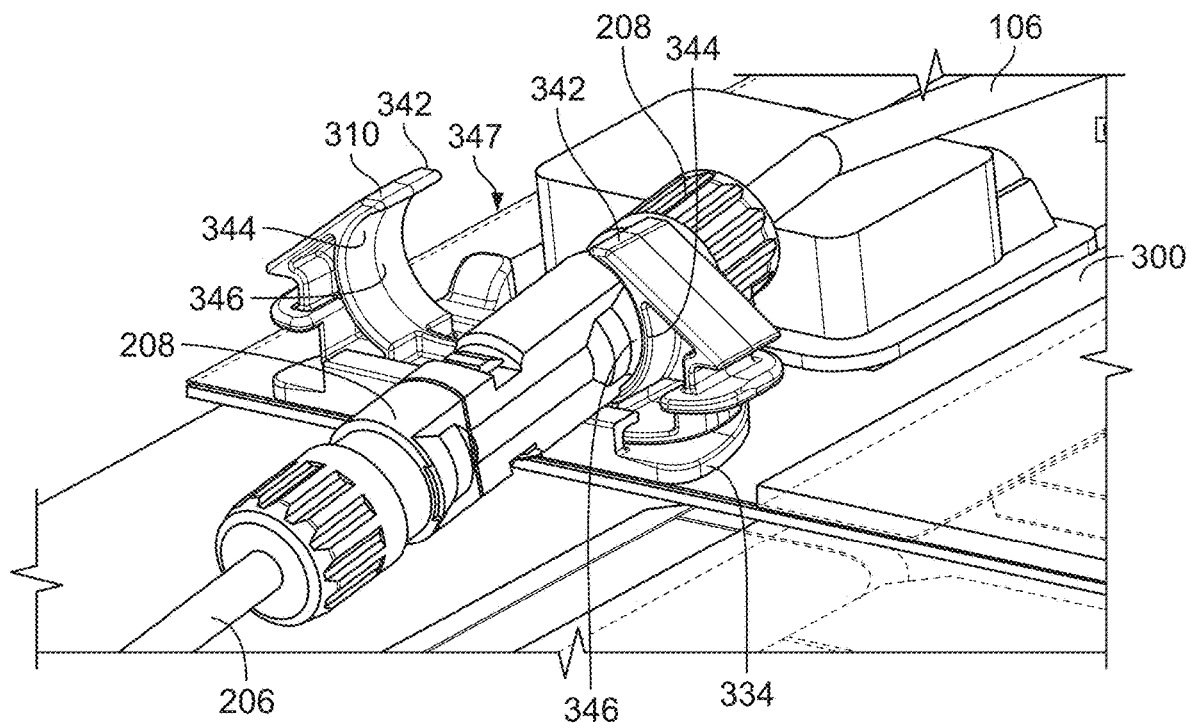
Figure 14:
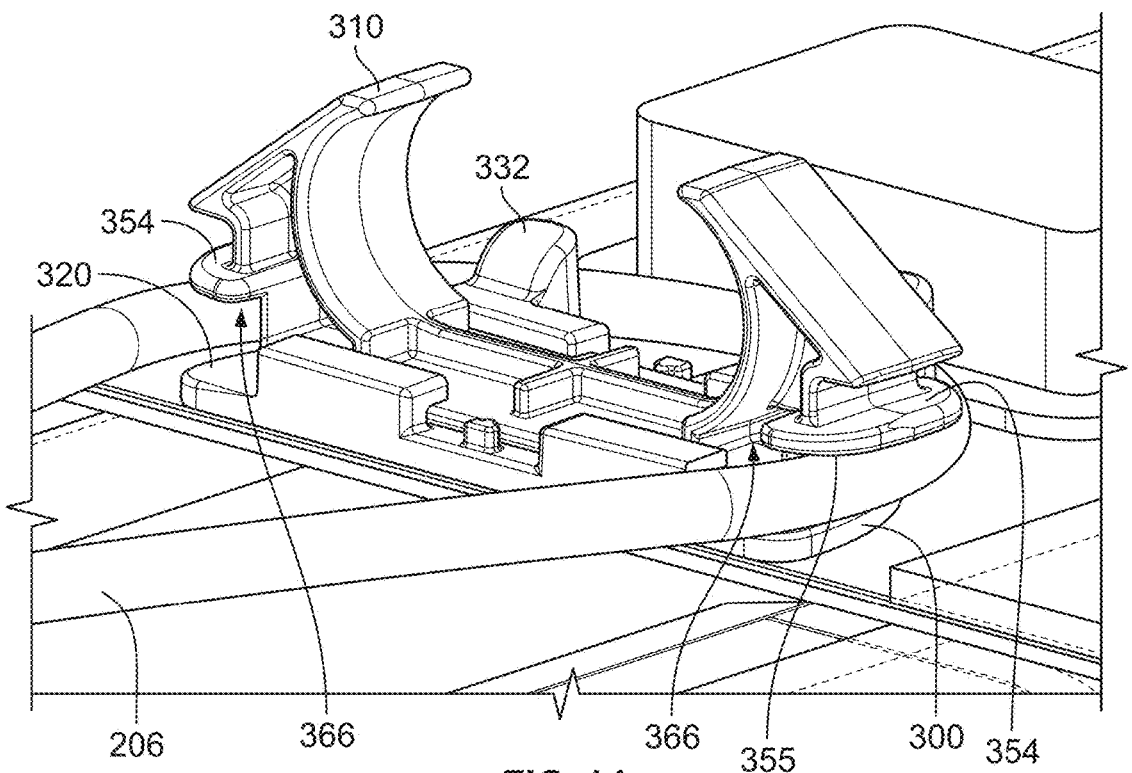
Figure 15:
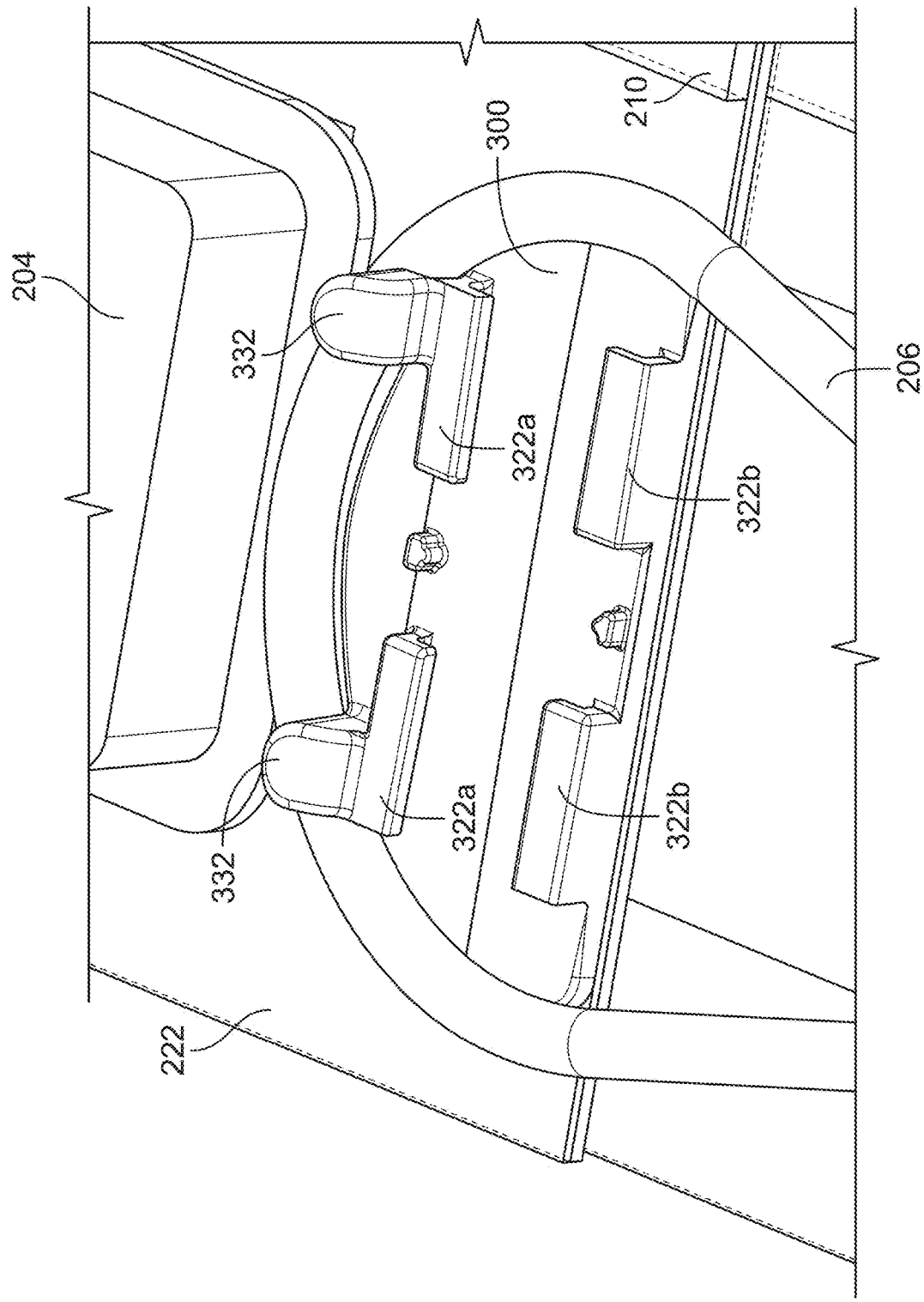
Figure 16:
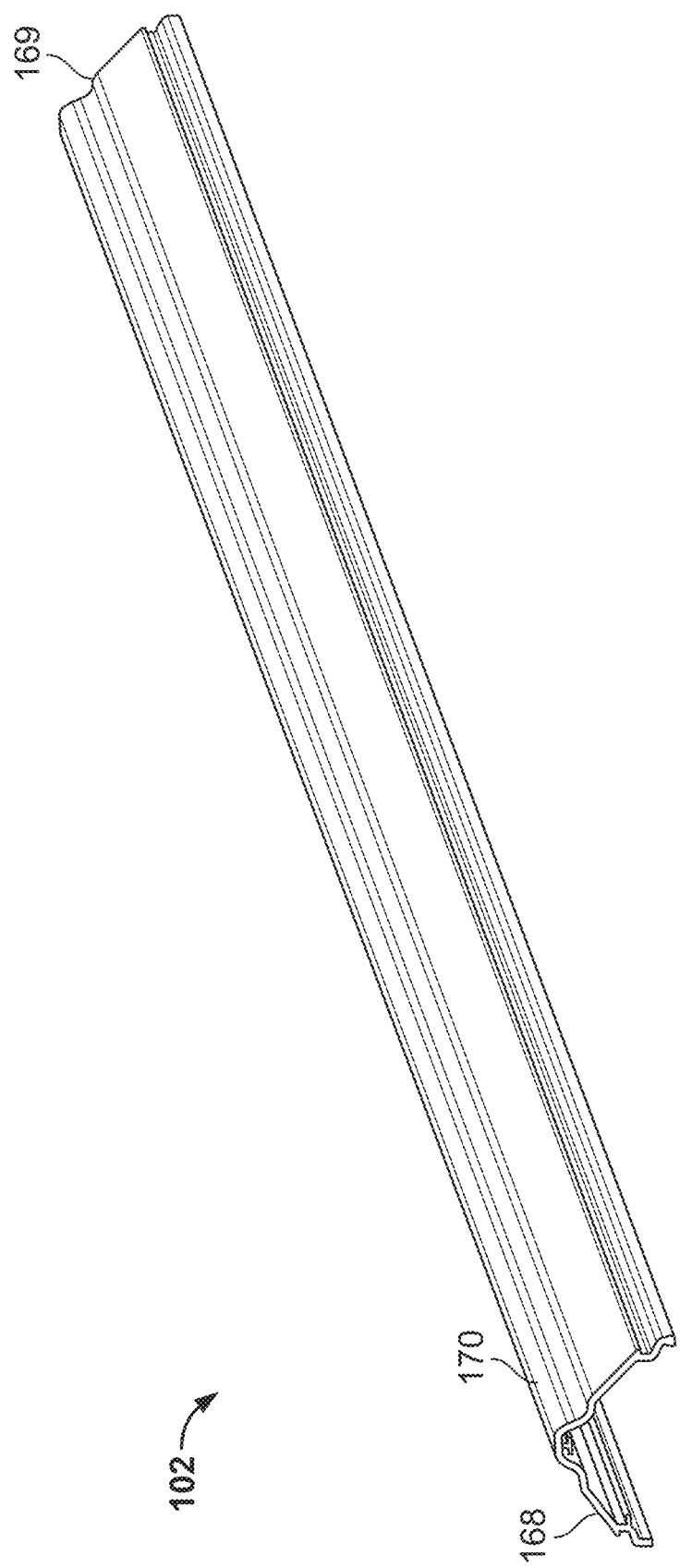
FIG. 16 is a top perspective view of some embodiments of a wire cover.
Figure 17:
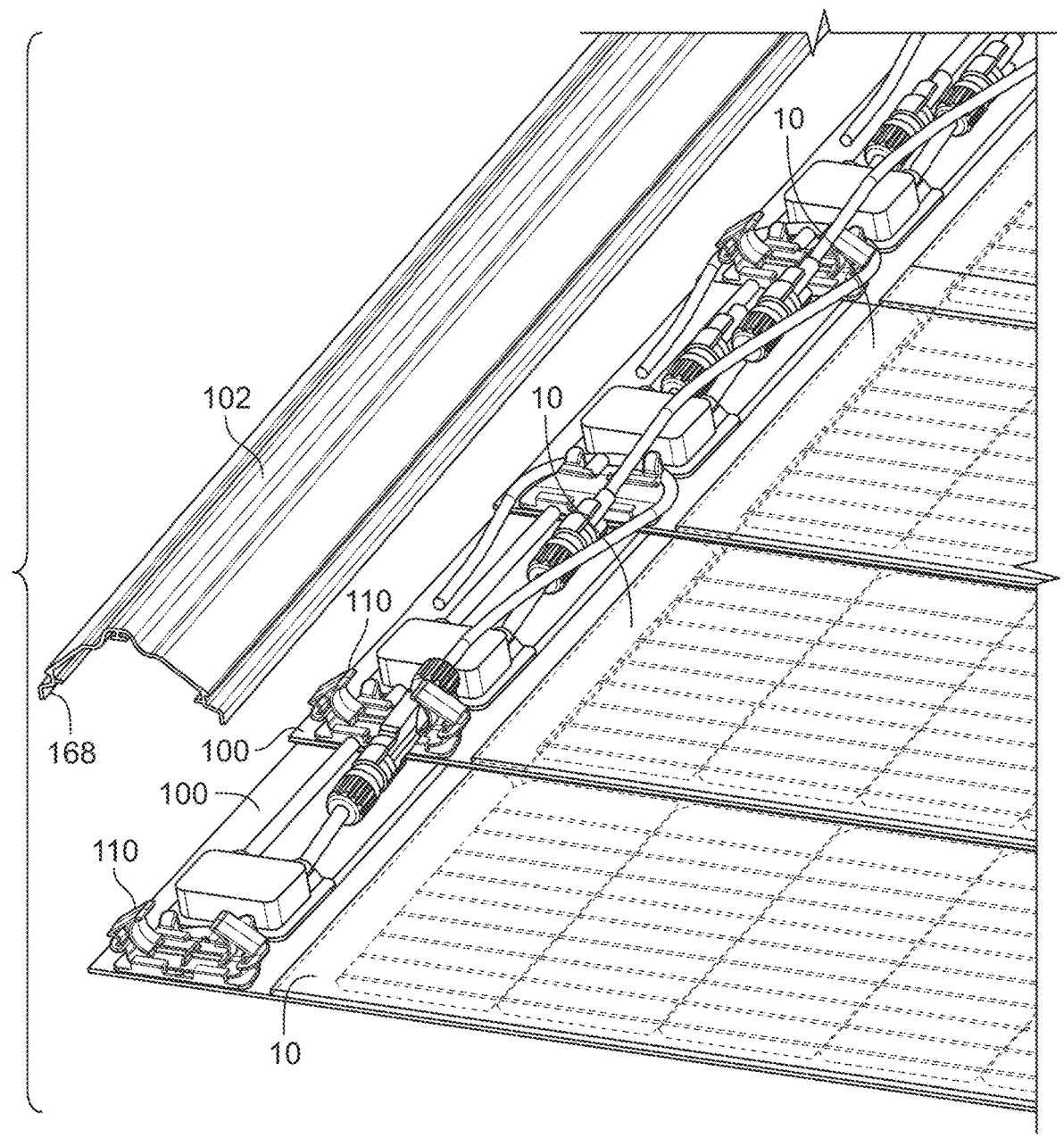
Figure 18:
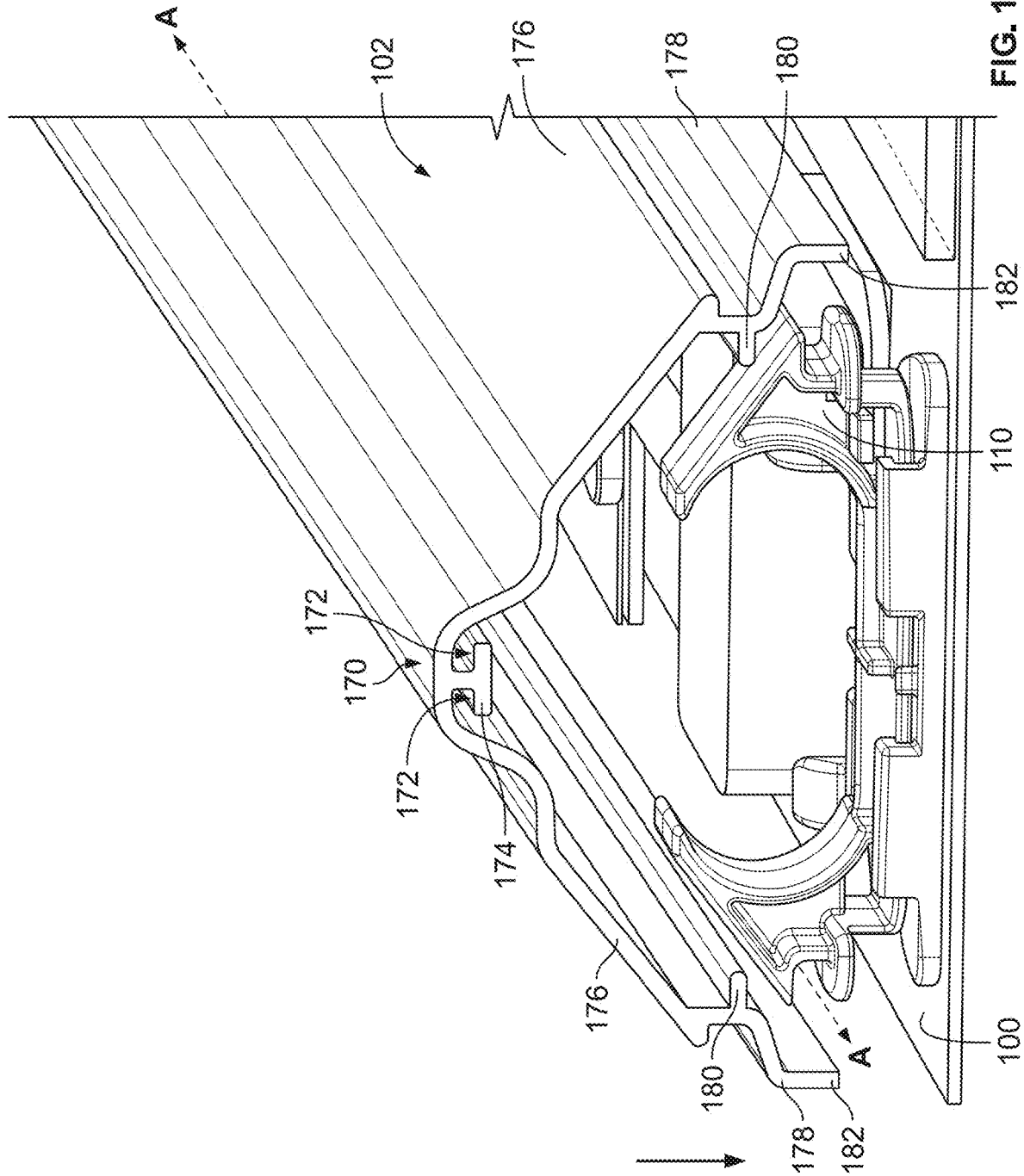
Figure 22:
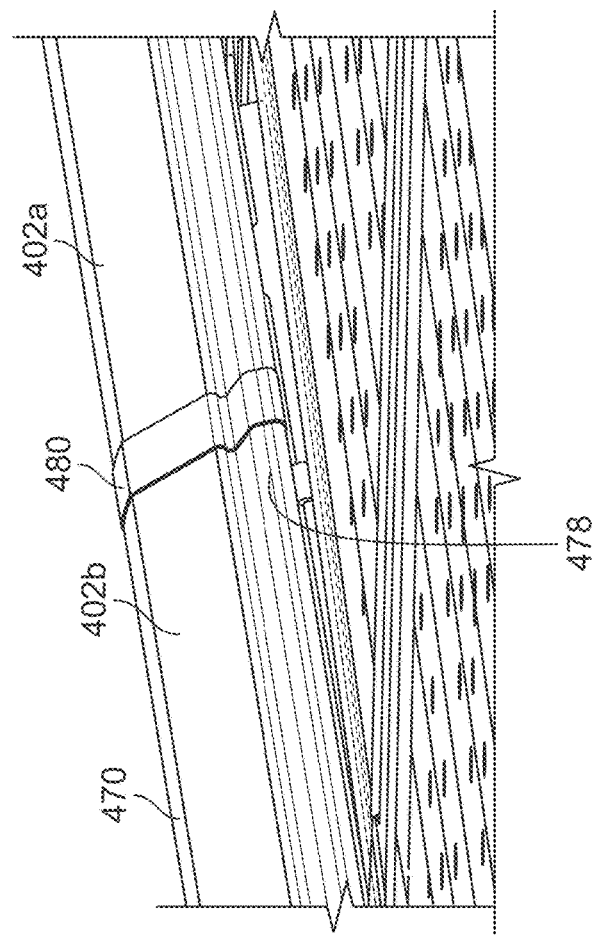
FIGS. 21 through 26 illustrate some embodiments of a coupler joining a plurality of wire covers.
Figure 21:
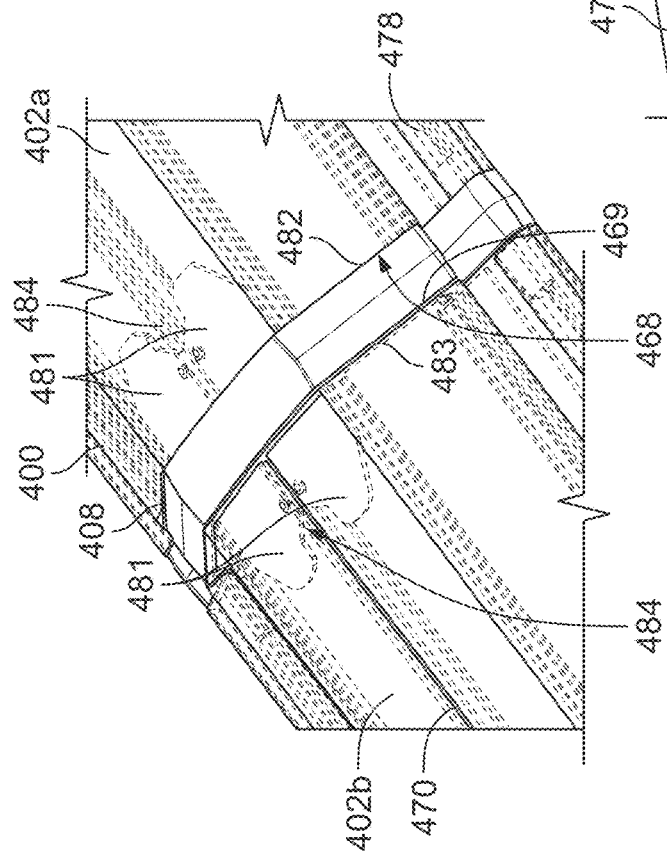
Figure 23:
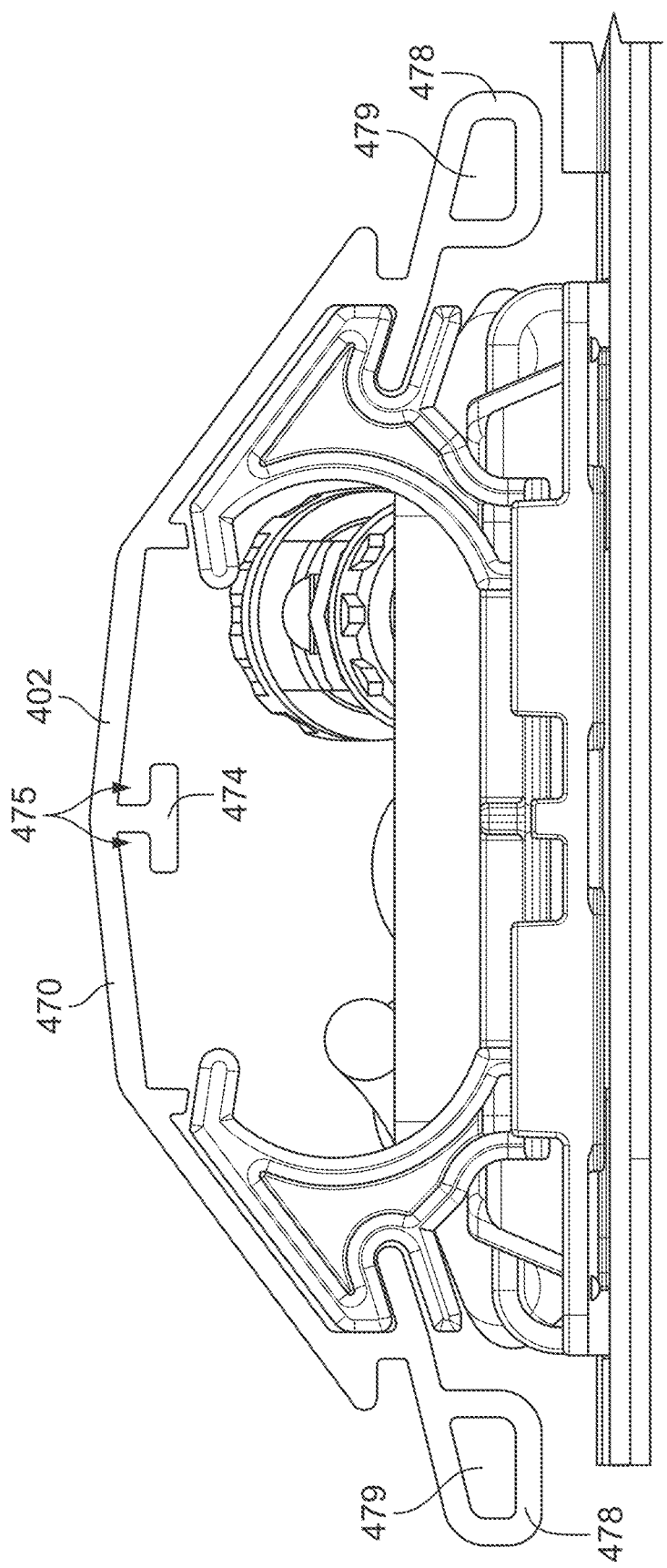
Figure 24:
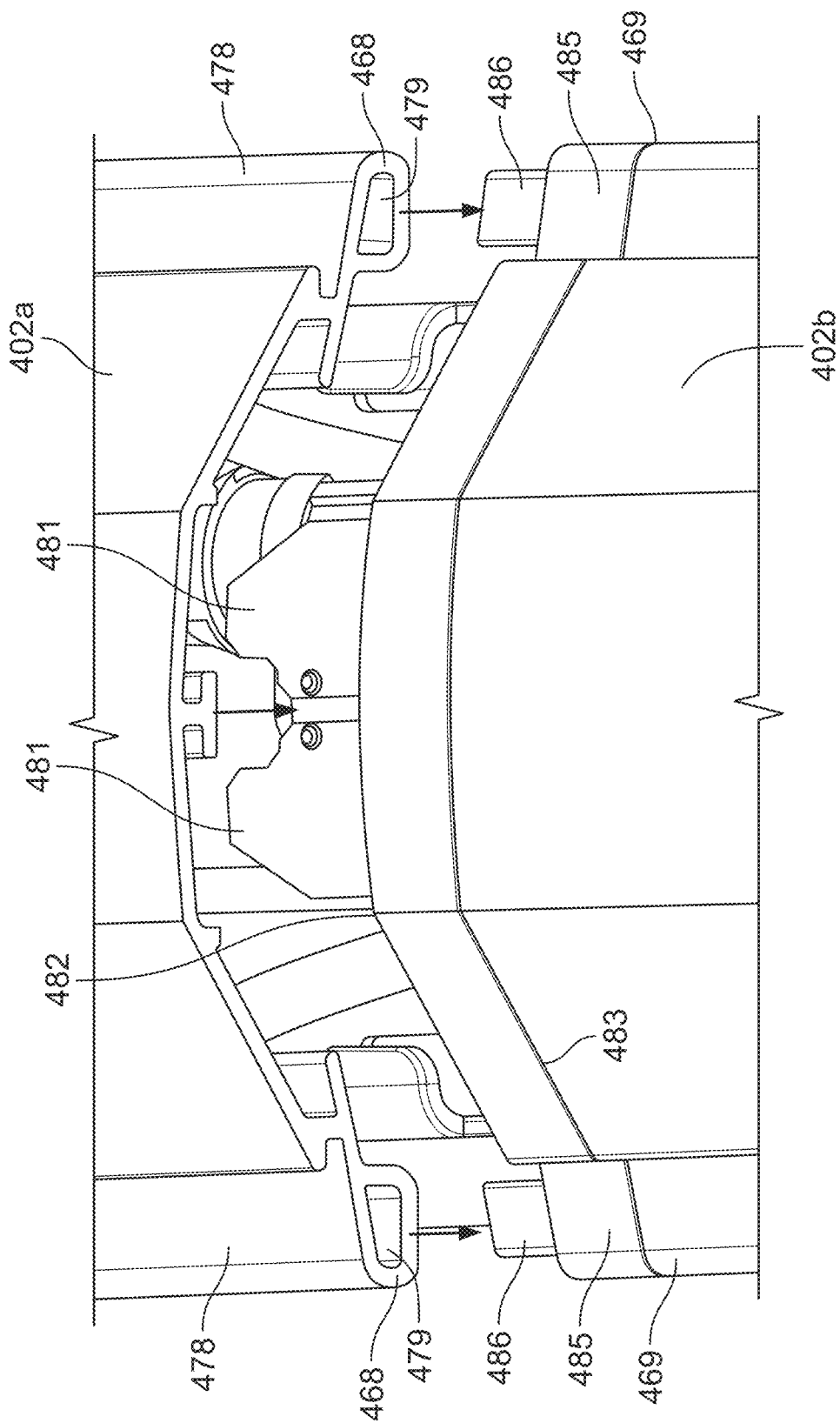
Figure 25:
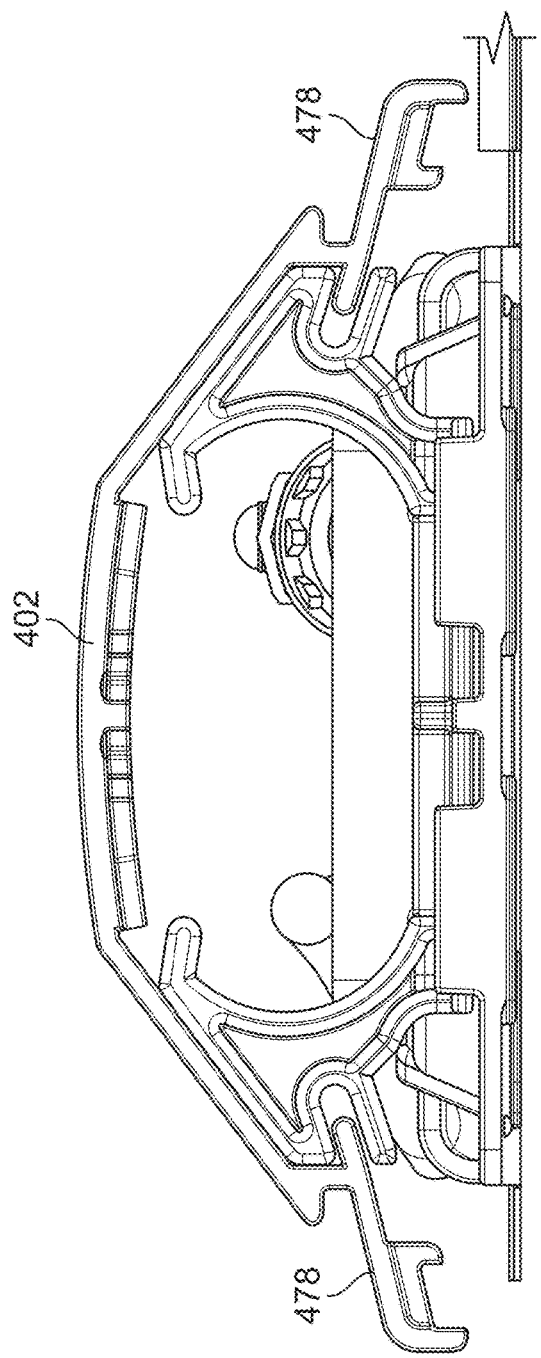

Referring to FIGS. 13 through 15, in some embodiments, a slot 347 of the hook member 310 is sized and shaped to receive the at least one of the electrical connectors 208 therein. In some embodiments, the slot 347 of the hook member 310 is sized and shaped to receive a plurality of the electrical connectors 208 therein. In some embodiments, the inner surfaces 346 of the first members 344 of the prongs 342 are sized and shaped such that the electrical connectors 208 may be juxtaposed with them and facilitate the securement of the wires 206 on the baseplate 300. In some embodiments, a space 366 is formed between each of the lower surfaces 355 of the clips 354 and the first surface 320 of the baseplate 300. In some embodiments, the spaces 366 are sized and shaped to receive a portion of the electrical wire 206. In some embodiments, the position of the wire 206 is maintained or substantially maintained around the hook member 310 when the wire 206 is located within one or both of the spaces 366. In some embodiments, the guiderails 332 are configured to guide the electrical wire 206 extending within the baseplate 300. In some embodiments, the guiderail 332 maintains the cable or wire a distance away from edges of the photovoltaic module 210 so that the wire 206 does not impede the attachment of an associated wire cover to the baseplate 300. In some embodiments, the baseplate 300 includes only one of the guiderails 332.

Referring to FIGS. 16 through 20, in some embodiments, the wire cover 102 includes a first end 168 and a second end 169 opposite the first end 168. In some embodiments, the wire cover 102 includes a top portion 170. In some embodiments, the top portion 170 extends from the first end 168 to the second end 169. In some embodiments, the top portion 170 has a U-shaped cross-section. In some embodiments, the top portion 170 has a V-shaped cross-section. In some embodiments, the top portion 170 has a square-shaped cross-section. In some embodiments, the top portion 170 has a curved cross-section. In some embodiments, the top portion 170 has a planar or flat cross-section. In some embodiments, the top portion 170 includes an inner surface 172. In some embodiments, a beam 174 extends from the inner surface 172. In some embodiments, the beam 174 has an I-beam cross-section. In some embodiments, slots 175 are located between the beam 174 and the inner surface 172. In some embodiments, the wire cover 102 includes first side portions 176 extending from the top portion 170. In some embodiments, the first side portions 176 are angled (i.e., oblique) relative to the top portion 170. In some embodiments, the first side portions 176 are angled to prevent shading over adjacent photovoltaic cells. In some embodiments, the wire cover 102 includes second side portions 178. In some embodiments, each of the second side portions 178 extends from a corresponding one of the first side portions 176. In some embodiments, the second side portions 178 extend obliquely relative to the first side portions 176. In some embodiments, the second side portions 178 extend substantially perpendicular relative to a longitudinal axis A-A of the wire cover 102. In some embodiments, each of the second side portions 178 has a curved cross-section. In some embodiments, each of the second side portions 178 has an S-shaped cross-section. In some embodiments, each of the second side portions 178 includes a tab 180 extending outwardly from the inner surface 172 of the top portion 170 of the wire cover 102. In some embodiments, each of the tabs 180 extends substantially perpendicular relative to the inner surface 172 of the second side portions 178. In some embodiments, each of the tabs 180 extends longitudinally from the first end 168 to the second end 169. In some embodiments, each of the tabs 180 extends longitudinally between the first end 168 to the second end 169. In some embodiments, each of the tabs 180 extends longitudinally from the first end 168 to the second end 169 in separate segments. In some embodiments, each of the tabs 180 is sized and shaped to removably engage a corresponding one of the slots 156 of the clips 154 of the hook member 110.

Referring to FIG. 19, in some embodiments, the wire cover 102 is installed on the wireway 74. In some embodiments, the wire cover 102 is attached to the hook member 110 of at least one of the baseplates 100. In some embodiments, the wire cover 102 is attached to each of the hook members 110 of a plurality of the baseplates 100. In some embodiments, the first portions 150 of the second members 148 of the hook member 110 is configured to lead-in the first side portions 176 of the wire cover 102 when the wire cover 102 is installed. In some embodiments, each of the tabs 180 is sized and shaped to removably engage a corresponding one of the slots 156 of the clips 154 of the hook member 110. In some embodiments, the first side portions 176 of the wire cover 102 are juxtaposed with the first portions 150 of the second member 148 of the hook member 110. In some embodiments, bottom ends 182 of the second side portions 178 are juxtaposed with the first side lap 22. In some embodiments, air is permitted to enter the wireway 74 through the second side portions 178 for ventilation. In some embodiments, the second side portions 178 minimize an amount of water from traveling laterally into the wireway 74 while allowing air to flow into the wireway 74. In some embodiments, the second side portions 178 reduce an amount of water from traveling laterally into the wireway 74. In some embodiments, the second side portions 178 prevent water from traveling laterally into the wireway 74. In some embodiments, the second side portions 178 substantially prevent water from traveling laterally into the wireway 74. In some embodiments, the second side portion 178 divert a substantial amount of water from entering laterally into the wireway 74.

Referring to FIG. 20, in some embodiments, a position of the wire cover 102 on the one or more of the baseplates 100 is moveable and adjustable. In some embodiments, the position of the wire cover 102 via the hook member 110 on the baseplate 100 is slidably adjustable. In some embodiments, the position of the wire cover 102 via on the baseplate 100 is slidably adjustable in the direction of the transverse axis B-B. In some embodiments, the transverse axis B-B is transverse relative to the longitudinal axis A-A of the baseplate 100. In some embodiments, the transverse axis B-B is perpendicular relative to the longitudinal axis A-A of the baseplate 100. In some embodiments, the transverse axis B-B is substantially perpendicular relative to the longitudinal axis A-A of the baseplate 100. In some embodiments, the transverse axis B-B is oblique relative to the longitudinal axis A-A of the baseplate 100. In some embodiments, the hook member 110 is moveable in a first direction D1. In some embodiments, the first direction D1 is along the transverse axis B-B. In some embodiments, the hook member 110 is moveable in a second direction D2. In some embodiments, the second direction D2 is opposite the first direction D1. In some embodiments, the first direction D1 is towards a "right" direction relative to the baseplate 100, e.g., toward the second end 14 of the photovoltaic module 10. In some embodiments, the second direction D2 is a "left" direction relative to the baseplate 100, e.g., toward the first end 12 of the photovoltaic module 10. In some embodiments, it should be understood that references to the first direction D1, the second direction D2, left and right directions are by way of example, and the first direction D1 and the second direction D2 may be different directions relative to a selected reference point.

In some embodiments, the position of the wire cover 102 via on the baseplate 100 is slidably adjustable in the direction of the longitudinal axis A-A of the baseplate 100. In some embodiments, the hook member 110 is moveable in a third direction D3. In some embodiments, the third direction D3 is along the longitudinal axis A-A. In some embodiments, the hook member 110 is moveable in a fourth direction D4. In some embodiments, the fourth direction D4 is opposite the third direction D3. In some embodiments, the third direction D3 is towards an "upward" direction relative to the baseplate 100, e.g., toward an upper end of the roof deck 72. In some embodiments, the fourth direction D4 is a "downward" direction relative to the baseplate 100, e.g., toward a lower end of the roof deck 72. In some embodiments, it should be understood that references to the third direction D3, the fourth direction D4, upward and downward directions are by way of example, and the third direction D3 and the fourth direction D4 may be different directions relative to a selected reference point.

In some embodiments, the position of the wire cover 102 is moveable adjustable up to 1 mm. In some embodiments, the position of the wire cover 102 is moveable adjustable up to 2 mm. In some embodiments, the position of the wire cover 102 is moveable adjustable up to 3 mm. In some embodiments, the position of the wire cover 102 is moveable adjustable up to 4 mm. In some embodiments, the position of the wire cover 102 is moveable adjustable up to 5 mm. In some embodiments, the position of the wire cover 102 is moveable adjustable up to 6 mm. In some embodiments, the position of the wire cover 102 is moveable adjustable up to 7 mm. In some embodiments, the position of the wire cover 102 is moveable adjustable up to 8 mm. In some embodiments, the position of the wire cover 102 is moveable adjustable up to 9 mm. In some embodiments, the position of the wire cover 102 is moveable adjustable up to 10 mm.

In some embodiments, the wireway 74 is covered by a single one of the wire covers 102. In some embodiments, the wire cover 102 is attached to a plurality of the hook members 110 of a plurality of the baseplates 100 of a plurality of the photovoltaic modules 10 in subarray S1 or subarray S2. In some embodiments, the wireway 74 is covered by a plurality of the wire covers 102. In some embodiments, the plurality of the wire covers 102 is attached to a plurality of the hook members 110 of a plurality of the baseplates 100 of a plurality of the photovoltaic modules 10. In some embodiments, a corresponding one the plurality of the wire covers 102 is attached to a corresponding one of the plurality of the hook members 110. In some embodiments, a corresponding one the plurality of the wire covers 102 is attached to a corresponding pair of the plurality of the hook members 110.

FIGS. 21 through 25 illustrate some embodiments of a wire cover 402. In some embodiments, each of second side portions 478 has a tubular shaped cross-section. In some embodiments, each of second side portions 478 includes a slot 479. In some embodiments, each of the slots 479 extends from a first end 468 of the wire cover 402 to a second end 469 of the wire cover 402 opposite the first end 468. In some embodiments, a coupler 480 is configured to couple a first end 468 of a first one of the wire covers 402*a* to a second end 469 to a second one of the wire covers 402*b*. In some embodiments, the coupler 480 has a size and shape including a cross-section that are similar to cross sections of the wire cover 402*a*, 402*b*. In some embodiments, the coupler 480 includes at least one tab 481 extending from one side 482 thereof. In some embodiments, the coupler 480 includes a plurality of the tabs 481 extending from the side 482. In some embodiments, the coupler 480 includes at least one of the tabs 481 extending from an opposite side 483 thereof. In some embodiments, the coupler 480 includes a plurality of the tabs 481 extending from the side 483. In some embodiments, the coupler 480 includes at least one tab 481 extending from the side 482 and at least one tab 481 extending from the side 483. In some embodiments, the coupler 480 includes a plurality of the tabs 481 extending from the side 482 and a plurality of the tabs 481 extending from the side 482. In some embodiments, each of the tabs 481 is elongated in shape. In some embodiments, each of the tabs 481 is rectangular in shape. In some embodiments, each of the tabs 481 is oval in shape. In some embodiments, each of the tabs 481 is elliptical in shape. In some embodiments, each of the tabs 481 is polygonal in shape. In some embodiments, a lead-on notch 484 is located between two adjacent ones of the tabs 481 on the side 482 or the side 483.

In some embodiments, the each of the wire covers 402a, 402b includes a beam 474 that extends from the inner surface 472 of a top portion 470 thereof. In some embodiments, slots 475 are located between the beam 474 and the inner surface 472. In some embodiments, each of the slots 475 is sized and shaped to receive one of the tabs 481. In some embodiments, one end of each of the tabs 481 on the side 482 of the coupler 480 is inserted within a corresponding one of the slots 475 at the first end 468 of the wire cover 402a. In some embodiments, one end of each of the tabs 481 on the side 483 of the coupler 480 is inserted within a corresponding one of the slots 475 at the second end 469 of the wire cover 402b. In some embodiments, the tabs 481 are friction fit in the slots 475. In some embodiments, the lead-in notches 484 are sized and shaped to facilitate the insertion of the tabs 481 within the slots 475 and align them with the slots 475.

In some embodiments, the coupler 480 includes side portions 485. In some embodiments, each of the side portions 485 includes a post 486 extending outwardly and longitudinally therefrom. In some embodiments, the posts 486 extend from the side 482 of the coupler 480. In some embodiments, the posts 486 extend from the side 483 of the coupler 480. In some embodiments, the coupler 480 includes only one of the posts 486 on the side 482. In some embodiments, the coupler 480 includes only one of the posts 486 on the side 483. In some embodiments, the slots 479 of the wire cover 402a are sized and shaped to receive the posts 486 on the side 482 of the coupler 480. In some embodiments, the slots 479 of the wire cover 402b are sized and shaped to receive the posts 486 on the side 483 of the coupler 480. In some embodiments, the posts 486 are friction fit in the slots 479. In some embodiments, the second side portions 478 of the wire cover 402 need not include the slots 479 and the coupler 480 need not include the posts 486. In some embodiments, the coupler 480 need not include the tabs 481.

Figure 26:
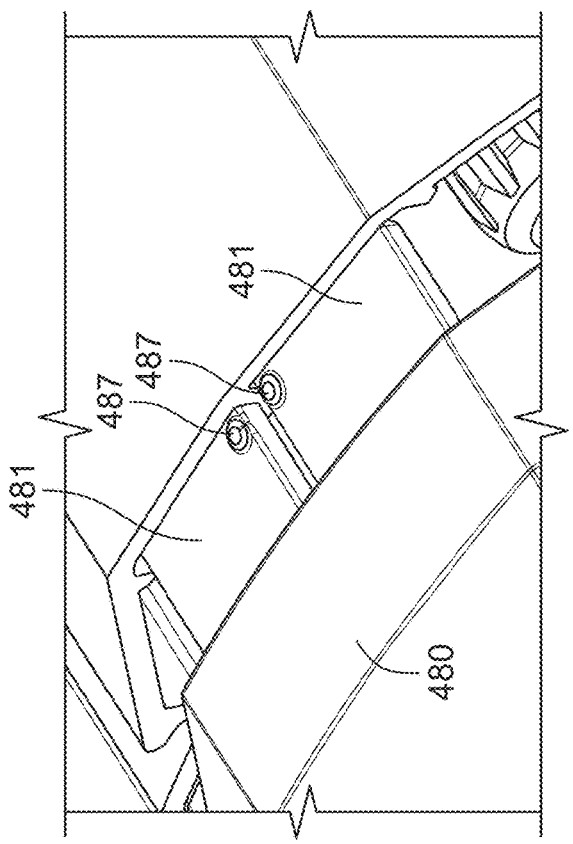

Referring to FIG. 26, in some embodiments, one or more of the tabs 481 includes at least one projection 487 on an upper surface thereof. In some embodiments, the at least one projection 487 is configured to increase the friction between the coupler 480 and the wire cover 402. In some embodiments, the at least one projection 487 includes a bump. In some embodiments, the at least one projection 487 includes a tab. In some embodiments, the at least one projection 487 includes a rib. In some embodiments, the at least one projection 487 includes a plurality of projections 487. In some embodiments, the at least one projection 487 includes a circular shape, square shape, triangular shape, rectangular shape, elliptical shape, oval shape, geometric shape, polygonal shape or non-polygonal shape.

In some embodiments, the wire cover 102 may include one or more similar features, structure and function of those of the wire cover 402. In some embodiments, at least two of the wire covers 102 in the wireway 74 are coupled with one another in a similar manner as that with the wire cover 402.

Figure 27:
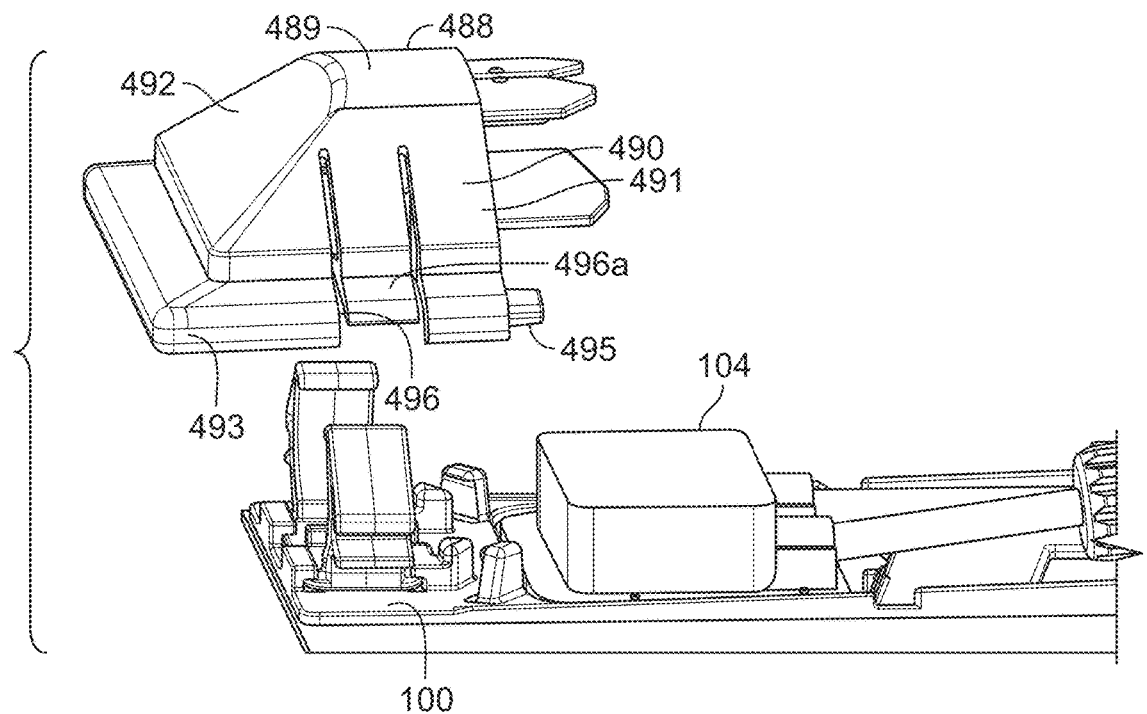
FIGS. 27 through 33 illustrate some embodiments of an endcap installed in a wireway.
Figure 28:
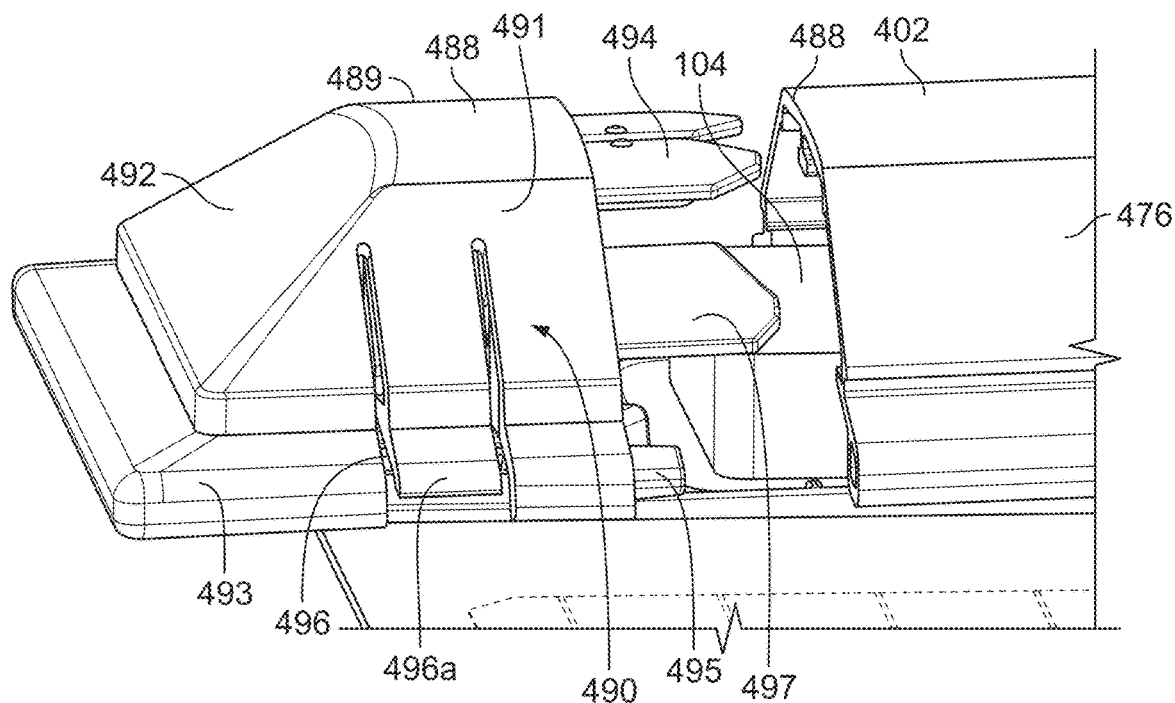
Figure 29:
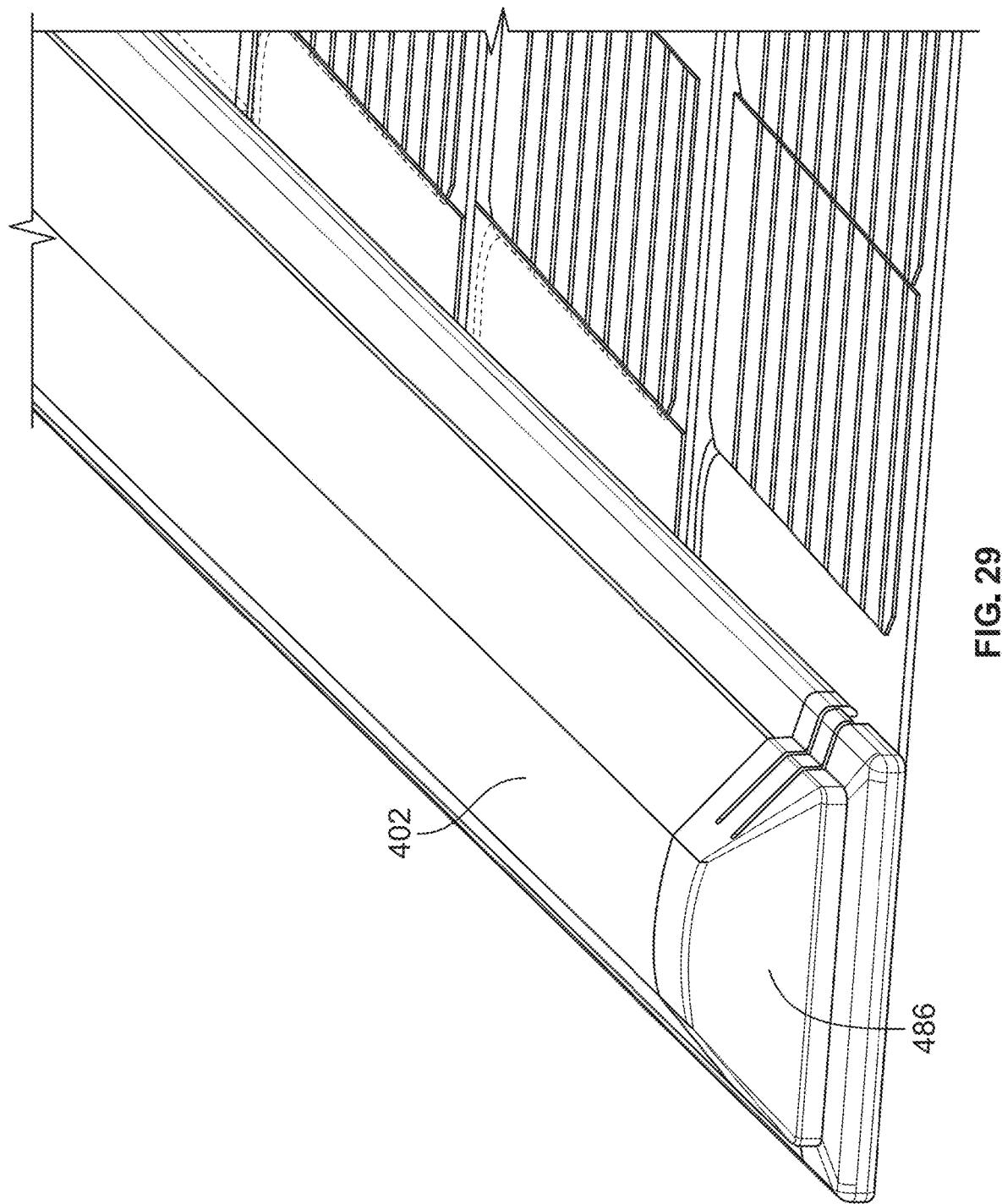

Referring to FIGS. 27 through 29, in some embodiments, an end cap 488 is installed on the baseplate 100 of the photovoltaic module 10 in the lowest row R of the subarray S1 or subarray S2. In some embodiments, the end cap 488 includes a top portion 489 and two side portions 490, each of which extends from a corresponding side of the top portion 489. In some embodiments, each of the side portions 490 has at least two side surfaces 491 In some embodiments, the side surfaces 491 are angled (i.e., oblique) relative to the top portion 489. In some embodiments, the at least two side surfaces 491 of the end cap 488 are aligned with first side portions 476 of the wire cover 402. In some embodiments, the end cap 488 includes an end wall 492. In some embodiments, the end cap 488 includes second side portions 493. In some embodiments, the second side portions 493 of the end cap 488 are aligned with second side portions 478 of the wire cover 402. In some embodiments, the end cap 488 includes at least one tab 494 extending from the top portion 489. In some embodiments, the end cap 488 includes a plurality of the tabs 494 extending from the top portion 489. In some embodiments, the tabs 494 have a structure and function similar to the tabs 481 of the coupler 480. In some embodiments, the slots 475 of the wire cover 402 located at the first end 468 of the wire cover 402 are sized and shaped to receive the tabs 494 of the end cap 488. In some embodiments, each of the second side portions 493 of the end cap 488 include a post 495. In some embodiments, the posts 495 of the end cap 488 have a structure and function similar to the posts 486 of the coupler 480. In some embodiments, the slots 479 of the wire cover 402 located at the first end 468 of the wire cover 402 are sized and shaped to receive the posts 495 of the end cap 488. In some embodiments, the side portions 490 and the second side portions 493 include one or more vents 496 to promote air flow and cooling within the wireway 74. In some embodiments, the end cap 488 includes a pair of tabs 496a, each of which extends from the side portions 490 to the second side portions 493. In some embodiments, the tabs 496a are between the vents 496. In some embodiments, the tabs 496a are moveable. In some embodiments, the tabs 496a are resilient and moveable in a spring-like manner. In some embodiments, the end cap 488 includes a tab 497 extending therefrom. In some embodiments, the tab 497 is sized and shaped to overlay the junction box 104. In some embodiments, the tab 497 is configured to maintain the position of the junction box 104 on the baseplate 100 and prevent it from decoupling therefrom and/or from other electric connectors and wires.

Figure 31:
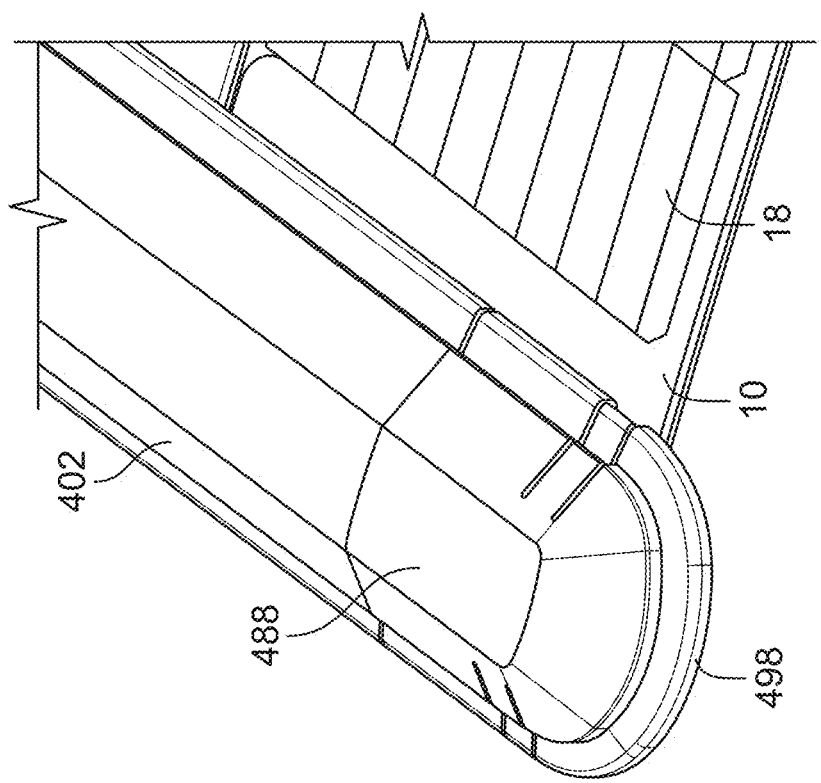
Figure 30:
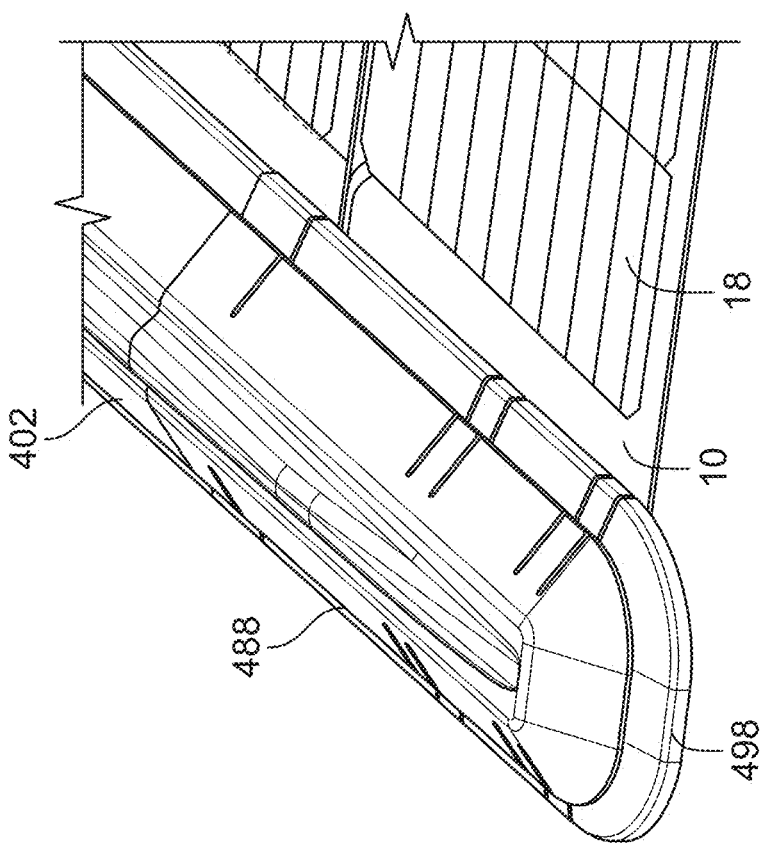
Figures 32, 33:
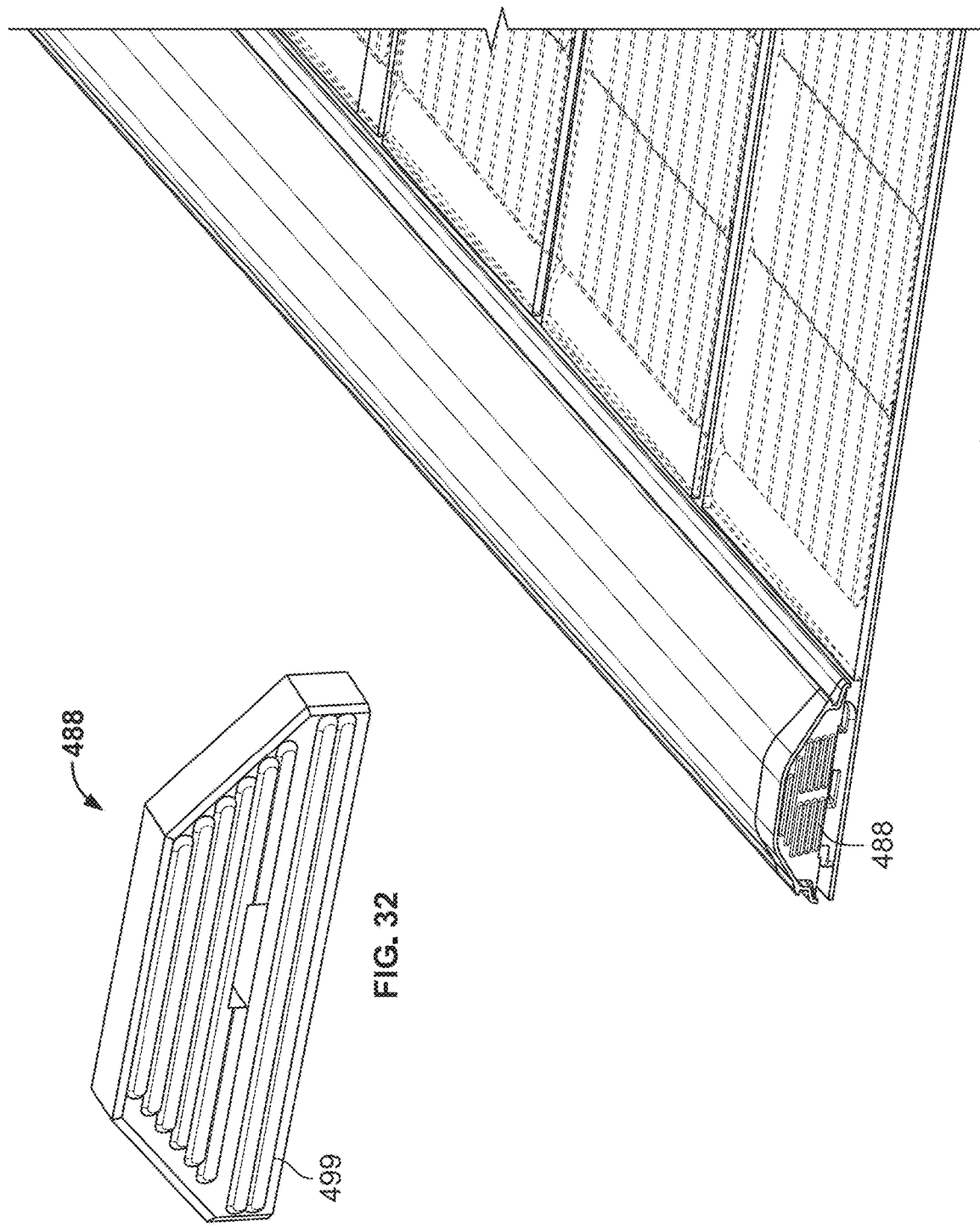

In some embodiments, the end cap 488 includes a substantially pyramid shape (see FIG. 29). In some embodiments, the end cap 488 has an elongated shape (see FIG. 30). In some embodiments, the end cap 488 has a length. In some embodiments, the length is greater than a width of the reveal portion 18 of the photovoltaic module 10 (see FIG. 30). In some embodiments, the length is less than a width of the reveal portion 18 of the photovoltaic module 10 (see FIG. 31). In some embodiments, the end cap 488 includes a curved-shaped end 498. In some embodiments, the end cap 488 includes a semi-circular-shaped end 498. In some embodiments, the end cap 488 includes a semi-oval-shaped end 498. In some embodiments, the end cap 488 includes a semi-elliptical-shaped end 498. In some embodiments, the end cap 488 includes a square-shaped end 498. In some embodiments, the end cap 488 includes a rectangular-shaped end 498. In some embodiments, the end cap 488 includes a triangular-shaped end 498. In some embodiments, the end cap 488 includes a geometric-shaped end 498. In some embodiments, the end cap 488 includes a non-geometric-shaped end 498. In some embodiments, the end cap 488 includes a polygonal-shaped end 498. In some embodiments, the end cap 488 is configured to prevent the wire cover 102 from moving downward on the roof deck. In some embodiments, the) end cap 488 includes a plurality of vents 499 at the end 498 (see FIGS. 32 and 33).

In some embodiments, the end cap 488 is attached to the hook member 110. In some embodiments, each of the tabs 496*a* is sized and shaped to engage a corresponding one of the slots 156 of the clips 154 of the hook member 110. In some embodiments, the end cap 488 is snapped onto the hook member 110 by the tabs 496*a* engaging the slots 156 of the hook member 110. In some embodiments, the end cap 488 is adjustable and moveable a manner similar to that as described above with respect to the wire cover 102.

Figure 35:
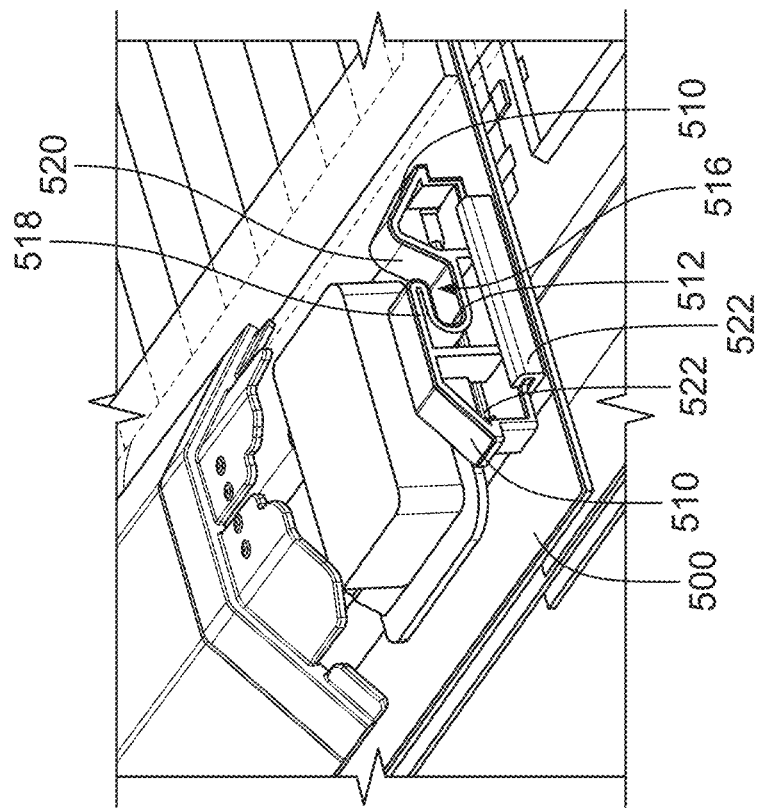
FIGS. 34 through 36 illustrate some embodiments of a hook member.
Figure 34:
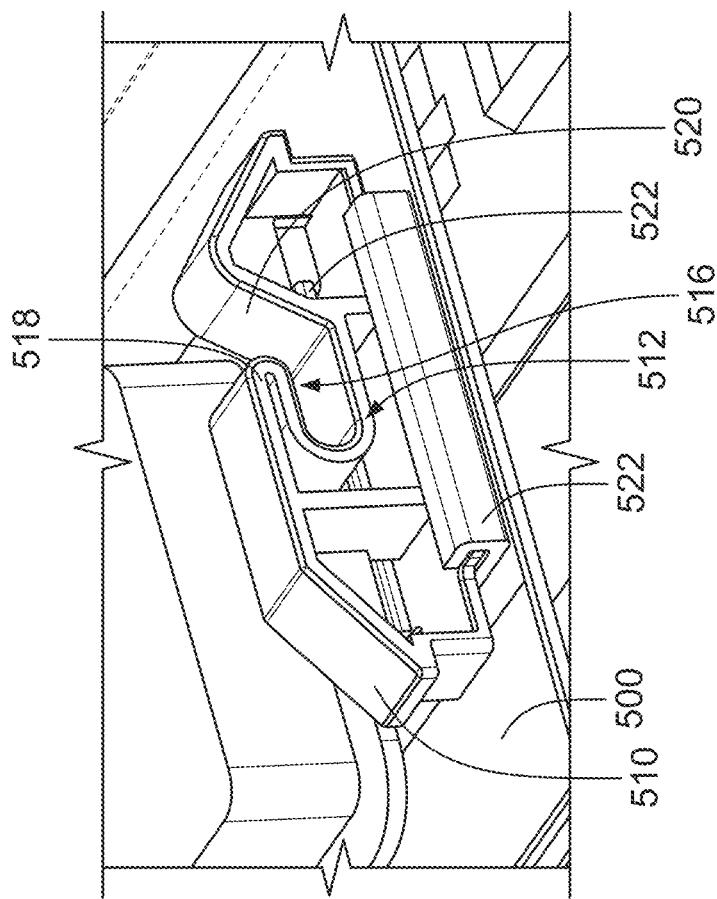
Figure 36:
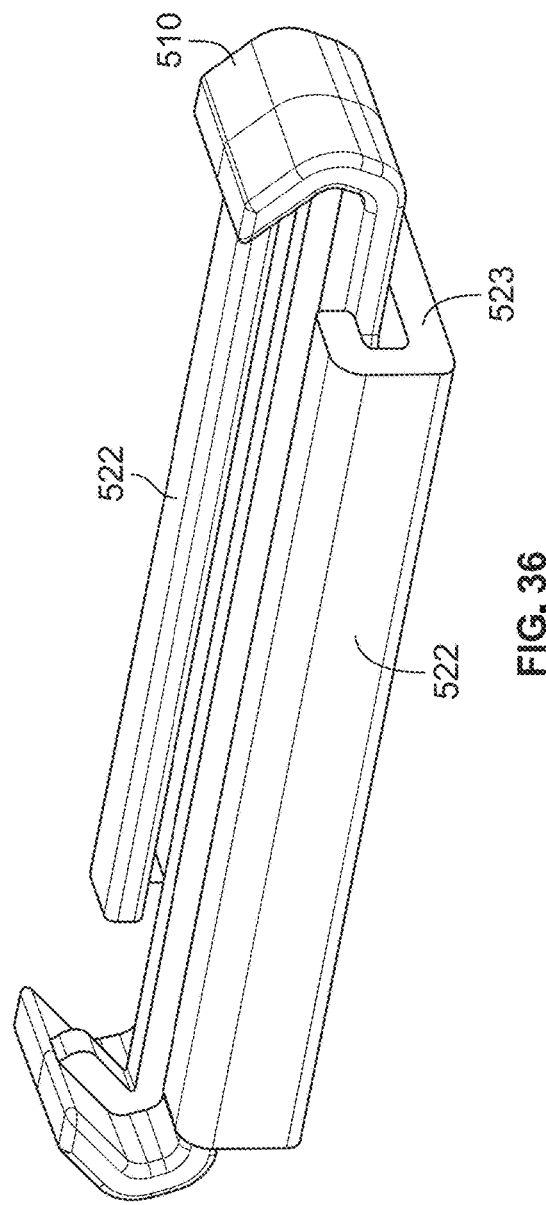

FIGS. 34 and 35 illustrate some embodiments of a baseplate 500 and a hook member 510. In some embodiments, the baseplate 500 includes rails 522. In some embodiments, the rails 522 are opposed with one another. In some embodiments, each of the opposed rails 522 is a single rail. In some embodiments, the rails 522 are integral with a common base 523 (see FIG. 36). In some embodiments, the hook member 510 includes a non-symmetrical cross-section. In some embodiments, the hook member 510 includes a first, central portion 512 having a clip 514. In some embodiments, the clip 514 is substantially S-shaped. In some embodiments, the clip 514 includes a slot 516. In some embodiments, the slot 516 is sized and shaped to receive an electrical wire or cable. In some embodiments, an upper portion 518 of the clip 514 is flexible to accommodate a range of wire sizes. In some embodiments, a second portion 520 adjacent the central portion 512 is configured to maintain the wire in the clip 514.

Figure 37:
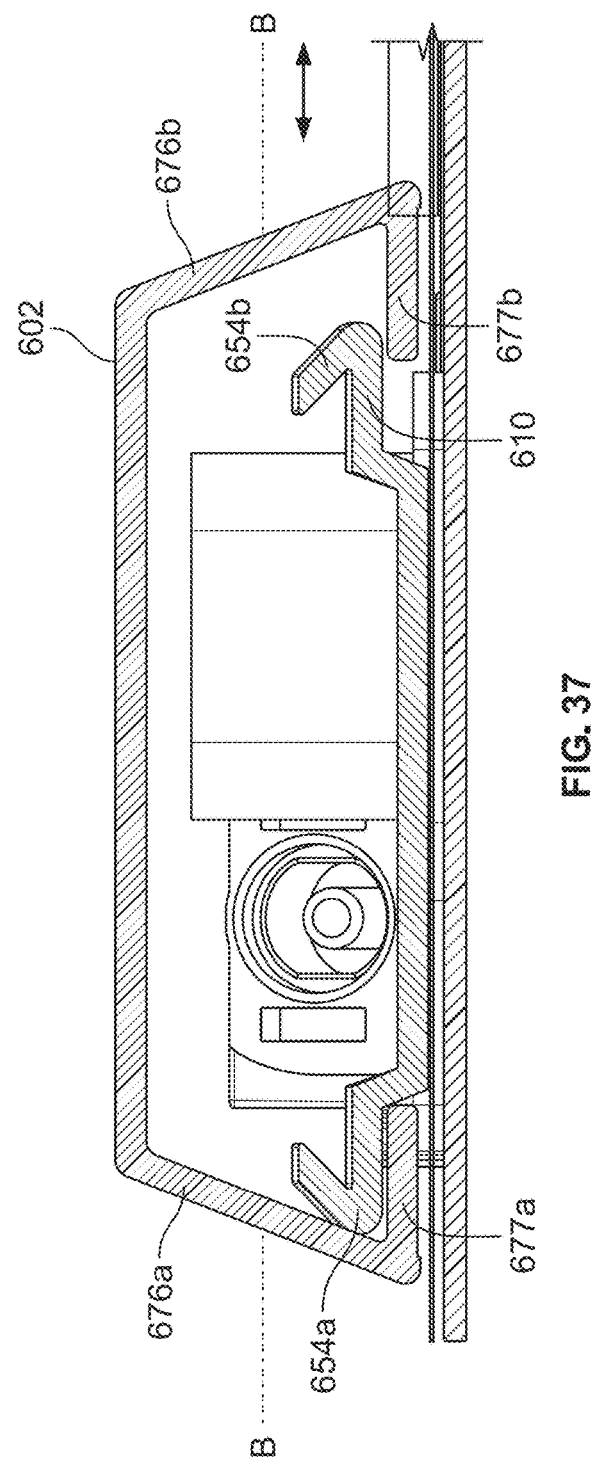
FIG. 37 is a side cross-sectional view of some embodiments of a wire cover installed on a wireway.
Figure 38:
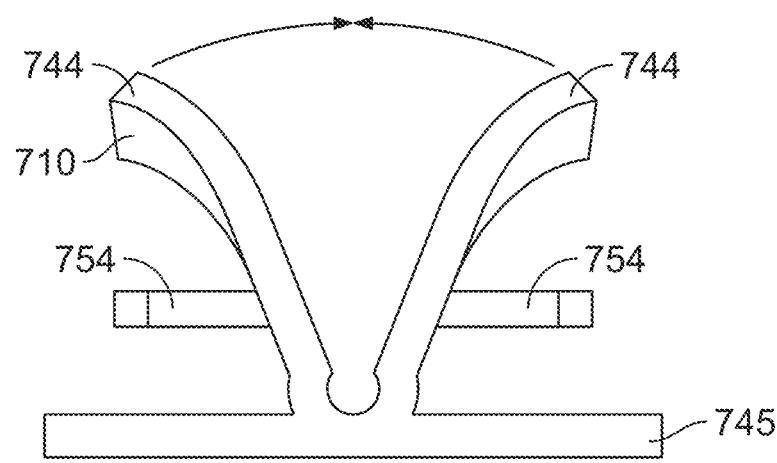
Figure 39:
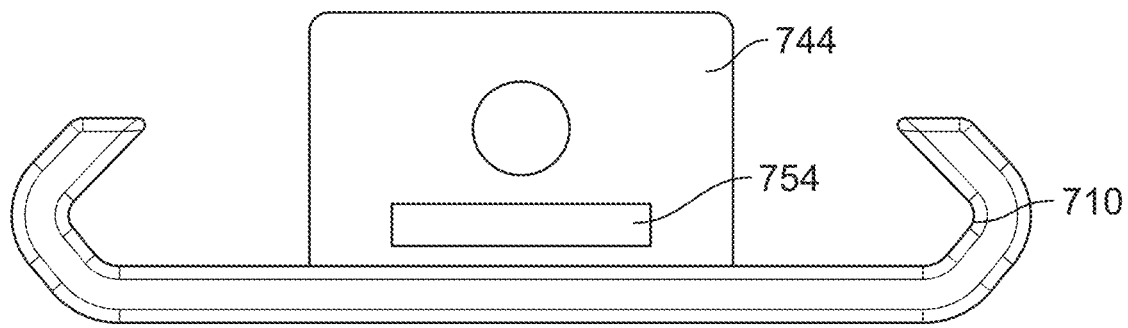
Figure 40:
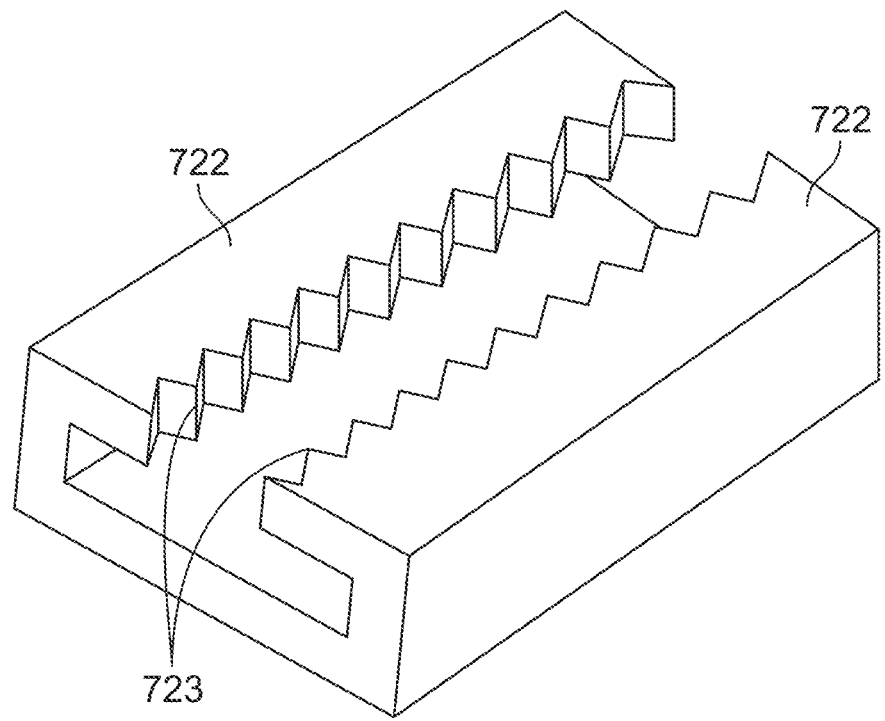

FIG. 37 illustrates some embodiments of a wire cover 602 and a hook member 610. In some embodiments, the wire cover 602 includes side portions 676*a*, 676*b* having respective flange portions 677*a*, 677*b*. In some embodiments, each of the flange portions 677*a*, 677*b* include a length. In some embodiments, the length of each of the flange portions 677*a*, 677*b* is selected to enable to the flange portions 677*a*, 677*b* of the wire cover 602 to slidably engage clips 654*a*, 654*b* in a transverse axis B-B. In some embodiments, the wire cover 602 is slidably adjustable relative to the hook member 610 in a transverse axis B-B. In some embodiments, the length of the flange portion 677*a* that engages the clip 654*a* is greater than the length of the flange portion 677*b* that engages the clip 654*b*. In some embodiments, the length of the flange portion 677*a* that engages the clip 654*a* is less than the length of the flange portion 677*b* that engages the clip 654*b*.

FIGS. 38 through 41B illustrate some embodiments of a hook member 710. In some embodiments, the hook member 710 includes a pair of members 744 extending from a base portion 745. In some embodiments, each of the members 744 includes a clip 754. In some embodiments, the members 744 are configured to be squeezed and rotated towards one another. In some embodiments, rails 722 of a baseplate include a plurality of teeth 723. In some embodiments, the rails 722 slidably receive the base portion 745 of the hook member 710. In some embodiments, the clips 754 of the hook member 710 engages the teeth 723 of the rails 722. In some embodiments, squeezing and rotating the members 744 of the hook member 710 towards one another compresses it and enables the clips 754 to disengage the teeth 723 so that the hook member 710 is slidably adjustable relative to the rails 722 and the baseplate.

FIGS. 42A through 42B illustrate some embodiments of a hook member 810 and a baseplate 800. In some embodiments, the baseplate 800 includes at least one tab 802 extending therefrom. In some embodiments, the at least one tab 802 includes a first curved portion 803, a second curved portion 804, and a slot 805. In some embodiments, the second curved portion 804 extends in an opposite direction than that of the first curved portion 803. In some embodiments, the at least one tab 802 includes a plurality of the tabs 802. In some embodiments, the hook member 810 includes at least one first aperture 812. In some embodiments, the at least one first aperture 812 includes a plurality of the first apertures 812. In some embodiments, the plurality of first apertures 812 is arranged in a first row. In some embodiments, the hook member 810 includes at least one second aperture 814. In some embodiments, the at least one second aperture 814 includes a plurality of the second apertures 814. In some embodiments, the plurality of second apertures 814 is arranged in a second row. In some embodiments, each of the first apertures 812 is square in shape. In some embodiments, each of the second apertures 814 is rectangular in shape. In some embodiments, each of the first apertures 812 is square in shape. In some embodiments, an area of each of the second apertures 814 is greater than an area of each of the first apertures 812. In some embodiments, a surface portion 816 of the hook member 810 separates the first row of the first apertures 812 from the second row of the second apertures 814. In some embodiments, the hook member 810 is slidably moveable from a first position to a second position. In some embodiments, when the hook member 810 is in the first position, each of the tabs 802 is located within a corresponding one of the second apertures 814 (see FIG. 42A). In some embodiments, when the hook member 810 is in the second position, the surface portion 816 of the hook member 810 removably engages each of the slots 805 of the tabs 802 of the baseplate 800. In some embodiments, when the hook member 810 is in the second position, each of the first curved portions 803 of the tabs 802 removably engages a corresponding one of the first apertures 812 of the hook member 810. In some embodiments, applying a force on the hook member 810 disengages the surface portion 816 from the slots 805 of the tabs 802 and the curved portions 803 from the first apertures 812 to move the hook member 110 from its second position to its first position.

Figure 43:
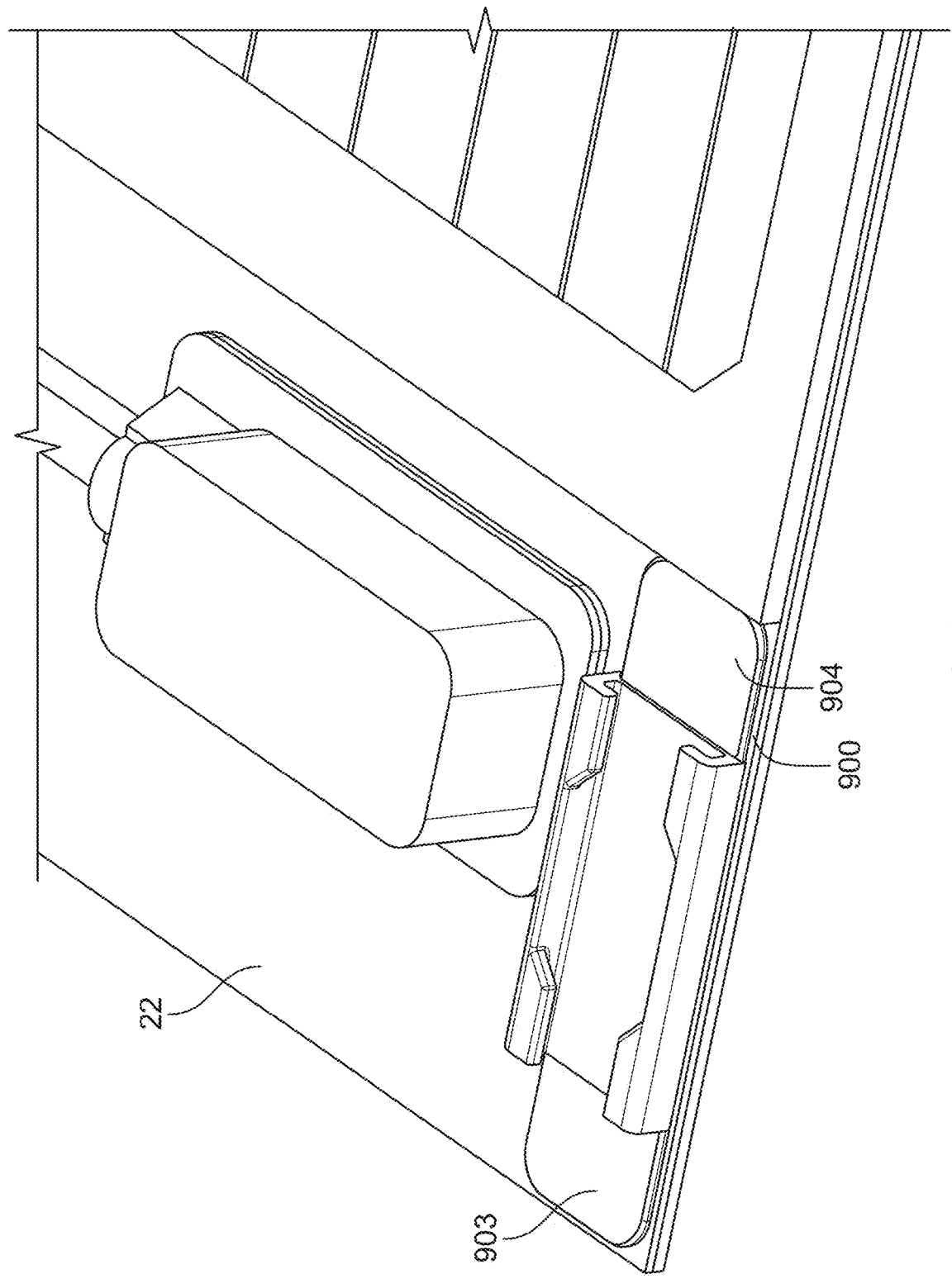
FIG. 43 is a top perspective view of some embodiments of a hook member and a baseplate.

Referring to FIG. 43, in some embodiments, a baseplate 900 includes a base portion 902. In some embodiments, the base portion 902 includes a first extension 903. In some embodiments, the base portion 902 includes a second extension 904. In some embodiments, the first extension 903 is opposite the second extension 904. In some embodiments, the first extension 903 and the second extension 904 are each composed of a polymer. In some embodiments, the first extension 903 and the second extension 904 are composed of thermoplastic polyolefin (TPO). In some embodiments, the first extension 903 and the second extension 904 are composed of polyvinyl chloride (PVC). In some embodiments, the first extension 903 and the second extension 904 are composed of EPDM rubber. In some embodiments, the first extension 903 and the second extension 904 are attached to the first side lap 22 of the photovoltaic module 10 by an adhesive. In some embodiments, the first extension 903 and the second extension 904 are attached to the first side lap 22 by thermal bonding. In some embodiments, the first extension 903 and the second extension 904 are attached to the first side lap 22 by ultrasonic welding.

Figure 45:
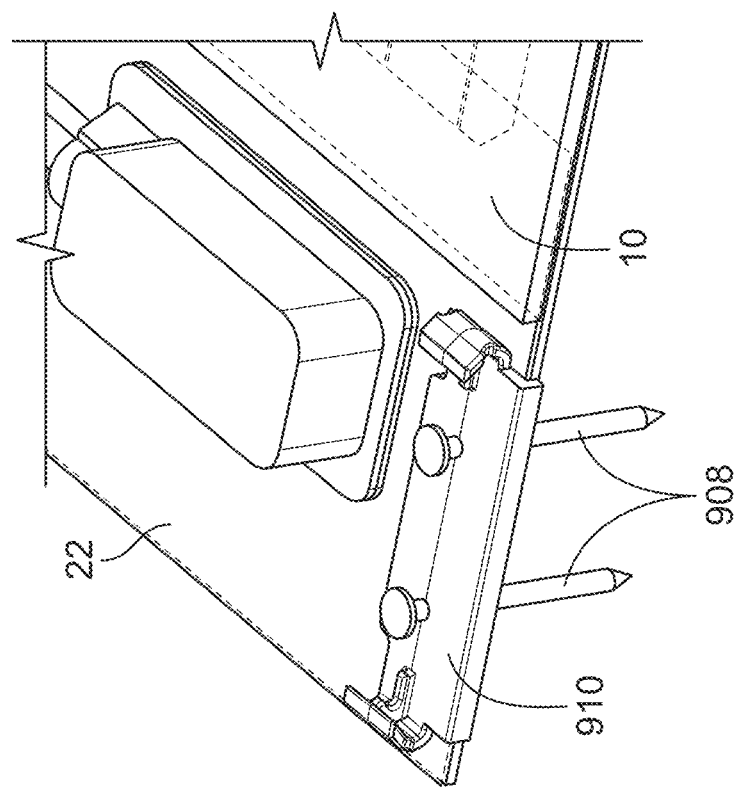
FIGS. 44 and 45 are top perspective views of some embodiments of a hook member and a baseplate.
Figure 44:
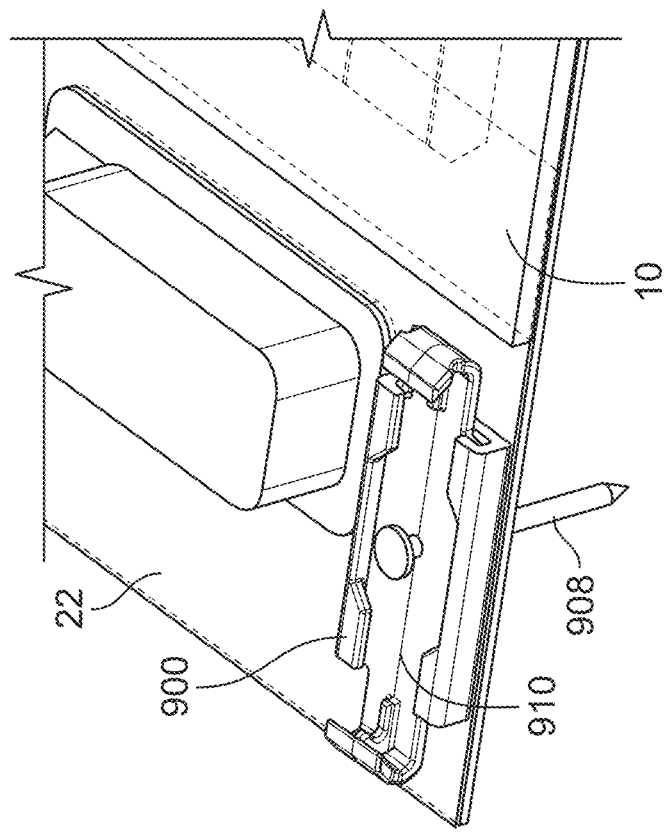
Figure 46B:
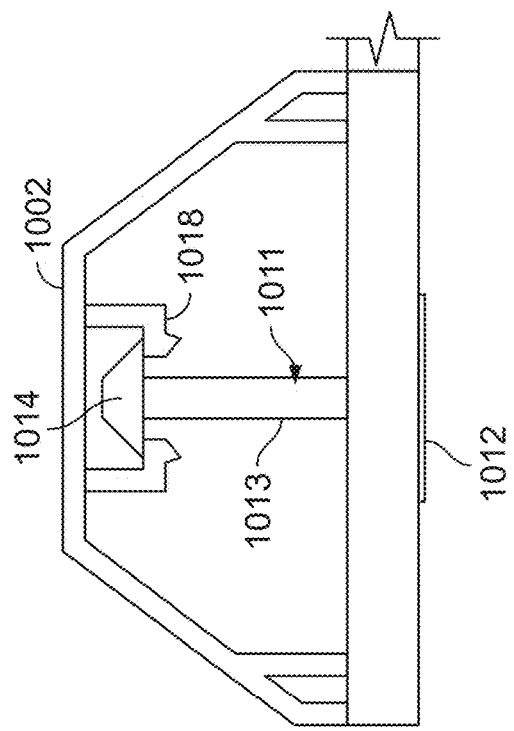
FIGS. 46A through 46D illustrate some embodiments of a wire cover installed on a wireway.
Figure 46D:
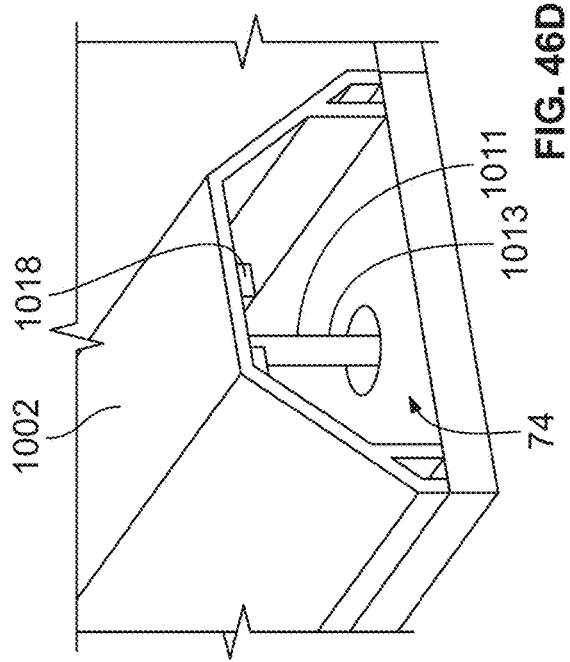
Figure 46A:
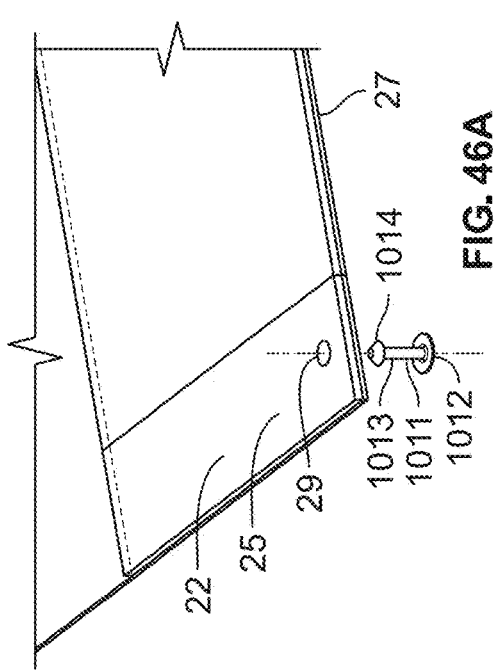
Figure 46C:
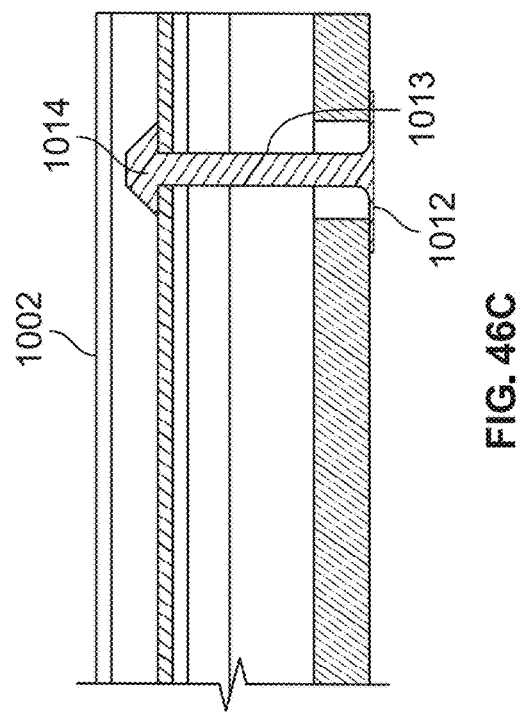

Referring to FIGS. 44 and 45, the baseplate 900 and/or a hook member 910 can be attached to the first side lap 22 by one or more fasteners 908. In some embodiments, the fasteners 908 includes nails. In some embodiments, the fasteners 908 include screws. In some embodiments, the fasteners 908 include staples. In some embodiments, the fasteners 908 include rivets.

Referring to FIGS. 46A through 46D, a baseplate need not be included. In some embodiments, a projection 1011 includes base 1012, an elongated shaft 1013 extending from the base 1012 and a head 1014 at one end of the shaft 1013. In some embodiments, the head 1014 is an enlarged head. In some embodiments, an aperture 29 extends from the outer surface 25 to the inner surface 27 of the photovoltaic module 10. In some embodiments, the shaft 1013 of the projection 1011 is inserted within the aperture 29 of the photovoltaic module 10. In some embodiments, the inner surface 27 overlays the base 1012 of the projection 1011. In some embodiments, the wire cover 1002 includes a receptacle 1018. In some embodiments, the head 1014 removably engages the receptacle 1018 of the wire cover 1002 to secure the wire cover 1002 to the wireway 74.

Figure 47A:
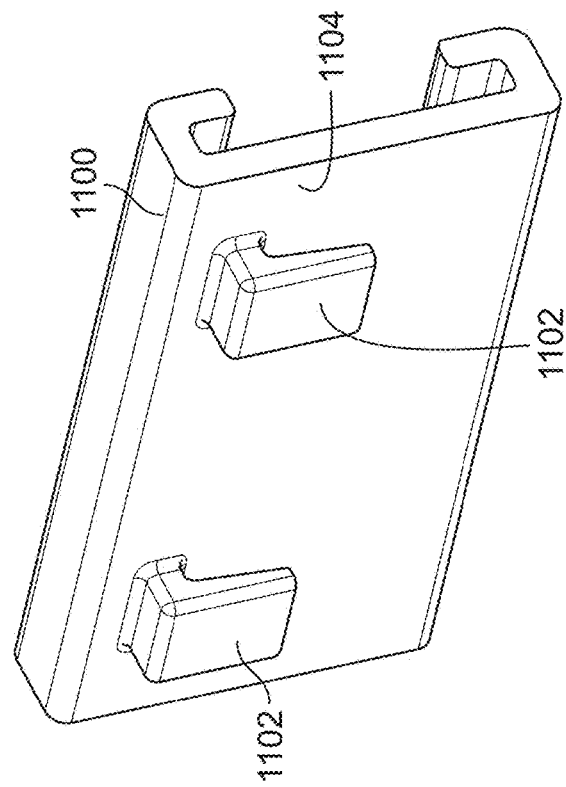
FIGS. 47A through 47C illustrate some embodiments of a hook member and a baseplate.
Figure 47B:
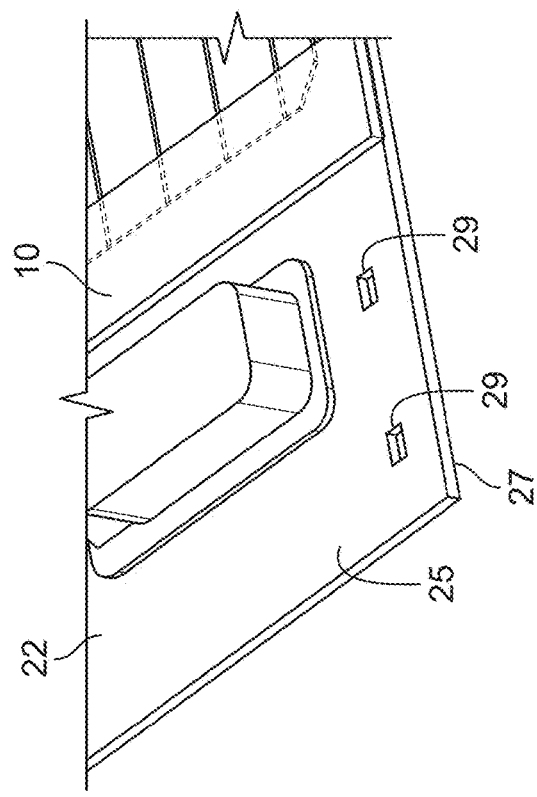
Figure 47C:
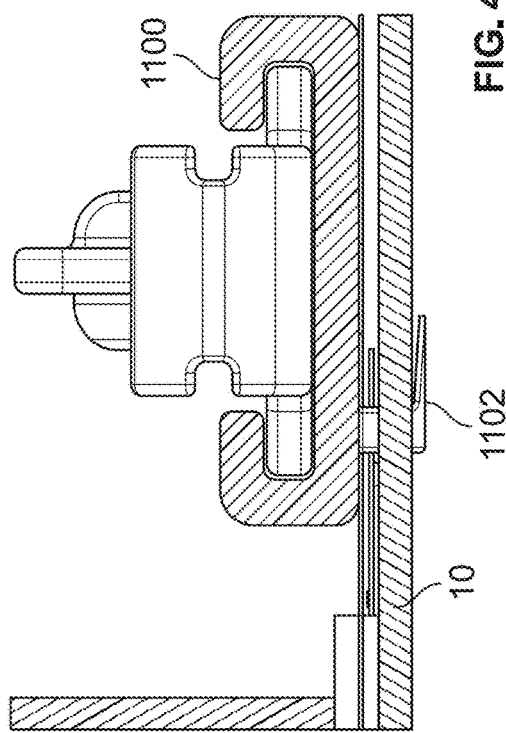

Referring to FIGS. 47A through 47C, in some embodiments, the first side lap 22 of the photovoltaic module 10 includes a plurality of the apertures 29. In some embodiments, a baseplate 1100 includes a plurality of hook members 1102 extending from a bottom surface 1104 thereof. In some embodiments, each of the apertures 29 of the photovoltaic module 10 is sized and shaped to receive a corresponding one of the hook members 1102 of the baseplate 1100.

Referring to FIG. 48A and FIG. 48B, in some embodiments, a baseplate 1200 includes a pair of rails 1222. In some embodiments, a hook member 1210 includes a plurality of clips 1254 inwardly extending from first side portions 1278. In some embodiments, the side portions 1278 are configured to be squeezed towards one another to facilitate engagement of the clips 1254 of a wire cover 1202 with the rails 1222 of the baseplate 1200. In some embodiments, the wire cover 1202 is composed of a flexible material. In some embodiments, the wire cover 1202 is composed of a polymer. In some embodiments, the wire cover 1202 is composed of a metal.

Referring to FIG. 49A and FIG. 49B, in some embodiments, a baseplate 1300 includes a pair of rails 1322, each of which has an outer surface 1323, a first tab 1325 extending from the outer surface 1323 and a second tab 1327 extending from the outer surface 1323. In some embodiments, the second tab 1327 is located above and offset from the first tab 1325. In some embodiments, a wire cover 1302 includes side portions 1378, each of which includes an inner rail 1380 having a notch 1382 formed therein. In some embodiments, each of the notches 1382 of the wire cover 1302 is sized and shaped to receive a corresponding one of the second tabs 1327 of the baseplate 1300. In some embodiments, each of the inner rails 1380 is located between corresponding ones of the first tab 1325 and the second tab 1327 and the wire cover 1302 is slidable relative thereto to facilitate installation of the wire cover 1302 to the baseplate 1300.

Figure 50:
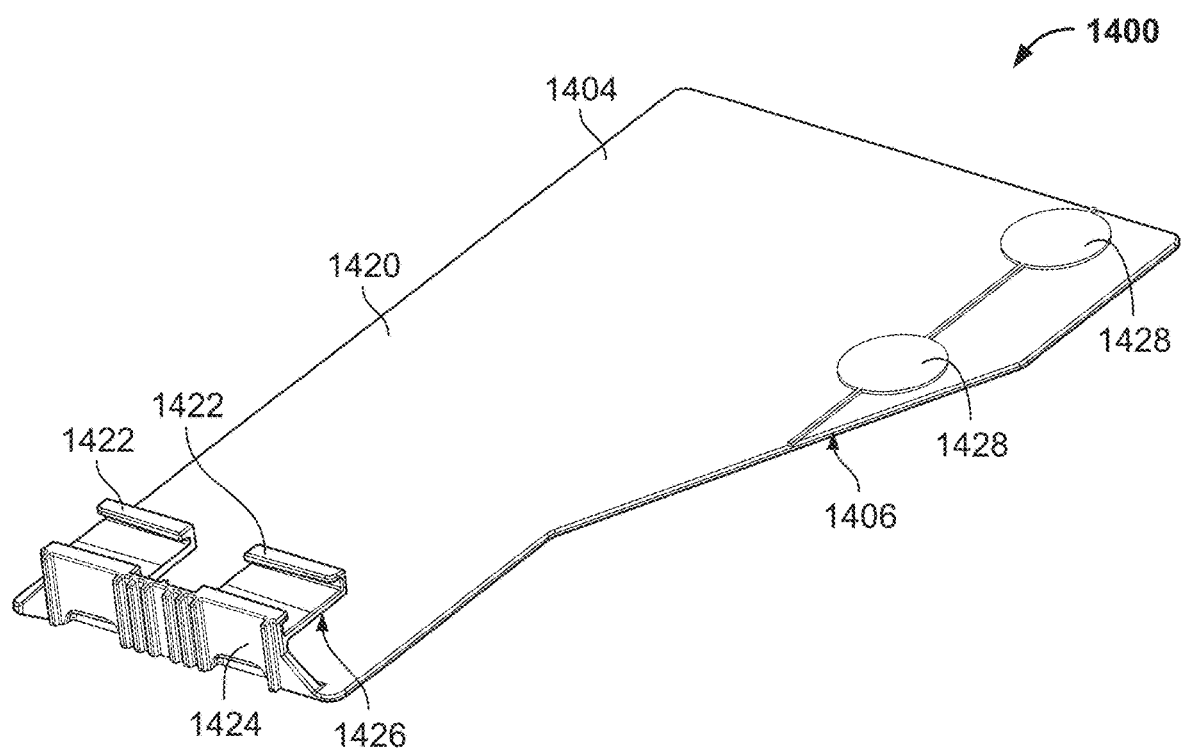
FIG. 50 is a top perspective view of a baseplate.
Figure 51:
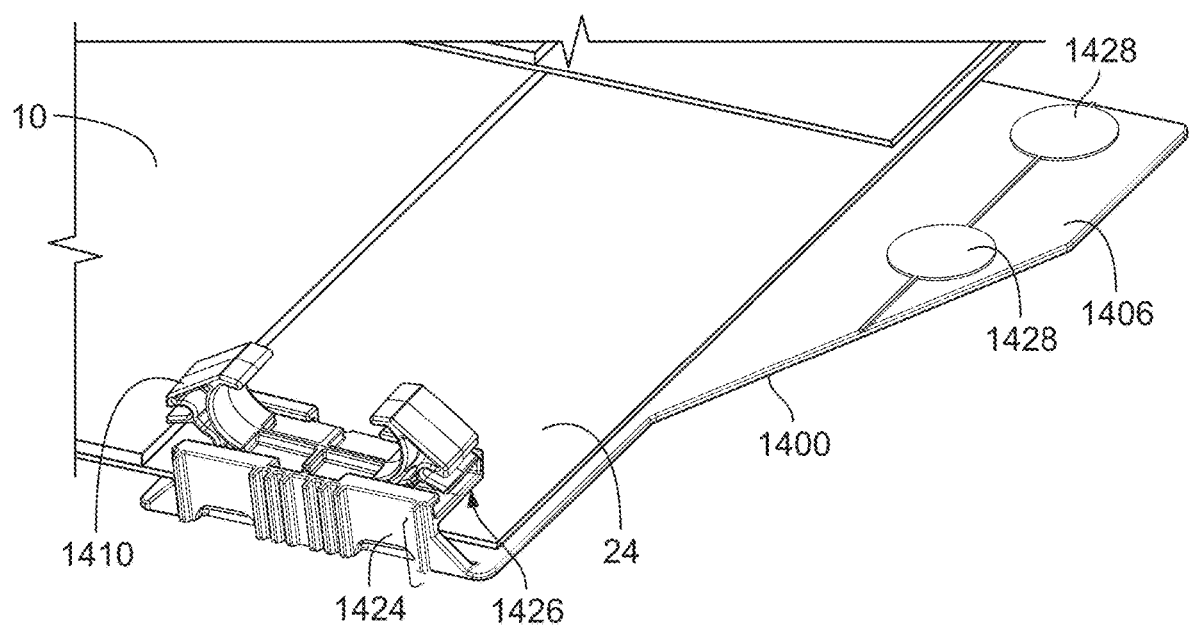
FIGS. 51 through 53G illustrate some embodiments of the baseplate shown in FIG. 50 installed in a wireway of a photovoltaic system.

Referring to FIGS. 50 and 51, in some embodiments, a bracket 1400 includes a base portion 1404. In some embodiments, the base portion 1404 includes a wing portion 1406 having an enlarged width. In some embodiments, a wall 1424 extends from an end of the bracket 1400. In some embodiments, the bracket 1400 includes a plurality of rails 1422. In some embodiments, the plurality of rails 1422 extends outwardly from the wall 1424. In some embodiments, the plurality of rails 1422 is located above an upper surface 1420 of the bracket 1400. In some embodiments, a space 1426 is located between the rails 1422 and the upper surface 1420. In some embodiments, the rails 1422 are sized and shaped to slidably receive a hook member 1410. In some embodiments, the hook member 1410 includes a structure and function similar to those of the hook member 110. In some embodiments, a lower end of the second side lap 24 of the photovoltaic module 10 overlays the bracket 1400 and is located within the space 1426 between the rails 1422 and the upper surface 1420. In some embodiments, the wing portion 1406 extends outwardly from the second side lap 24. In some embodiments, the wing portion 1406 includes a nail zone 1428. In some embodiments, the nail zone 1428 is configured to receive one or more fasteners therein. In some embodiments, the fasteners include nails, screws, rivets, or staples.

Figure 52:
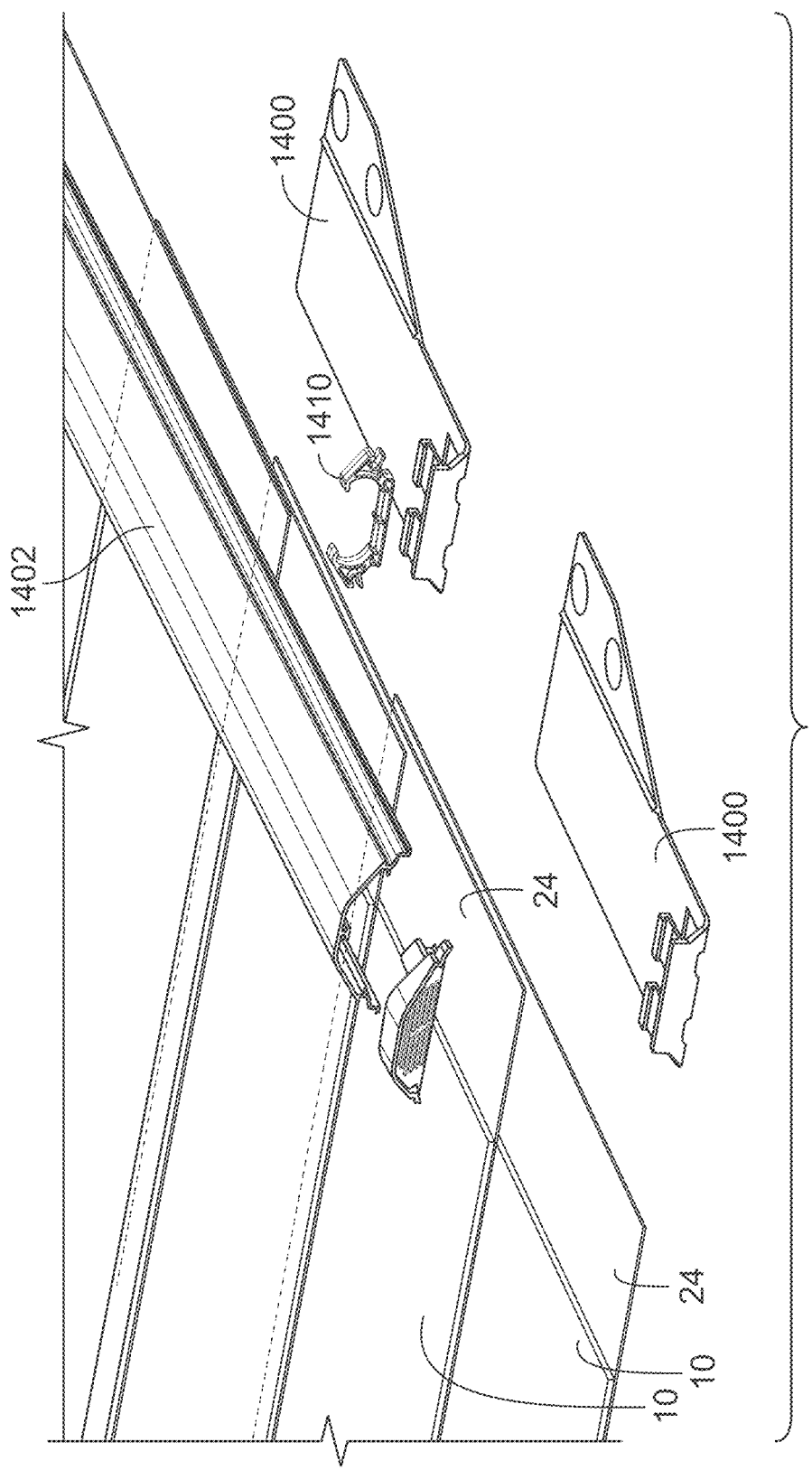

Referring to FIG. 52, a wire cover 1402 is configured to be attached to the hook member 1410. In some embodiments, the wire cover 1402 has a structure and function similar to that of the wire cover 102 or any of the embodiments of the wire covers disclosed herein. In some embodiments, the wire cover 1402 is configured to be attached to the hook member 1410 as described in any of the embodiments of the wire covers and hook members as described herein.

Figure 53A:
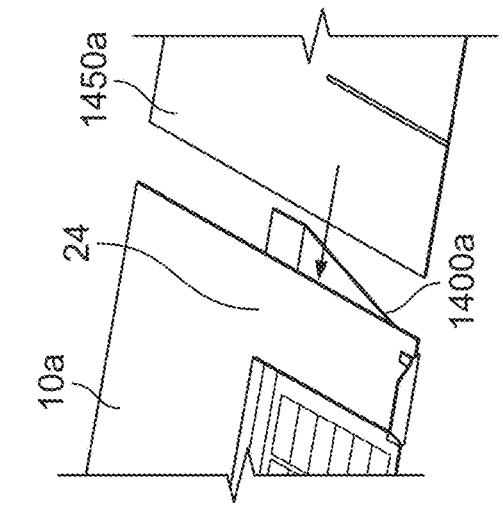
Figure 53B:
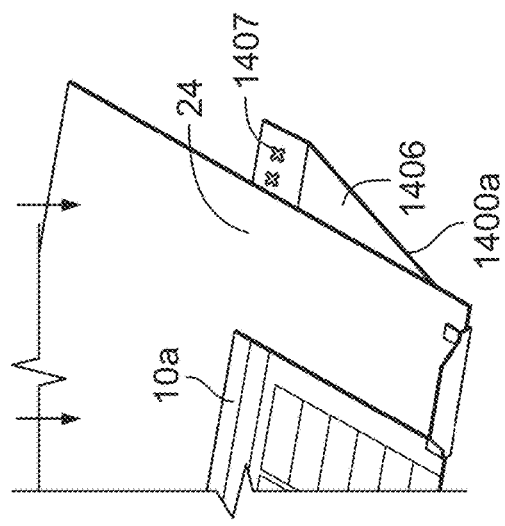
Figure 53C:
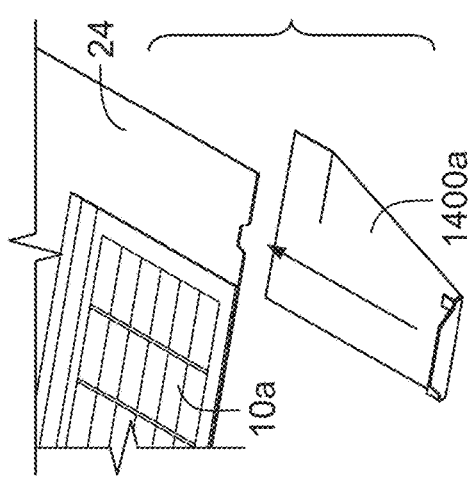
Figure 53D:
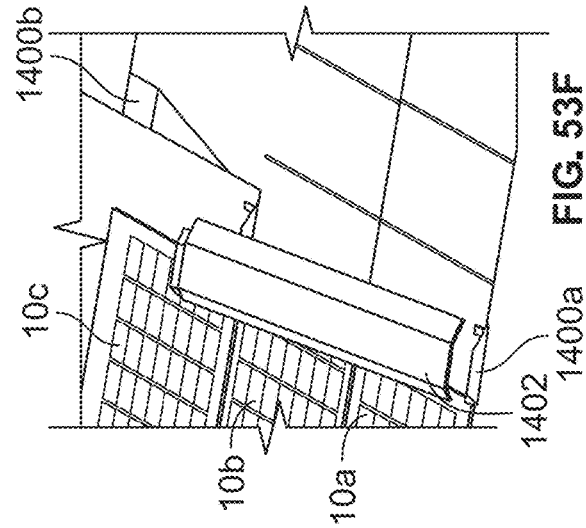
Figure 53E:
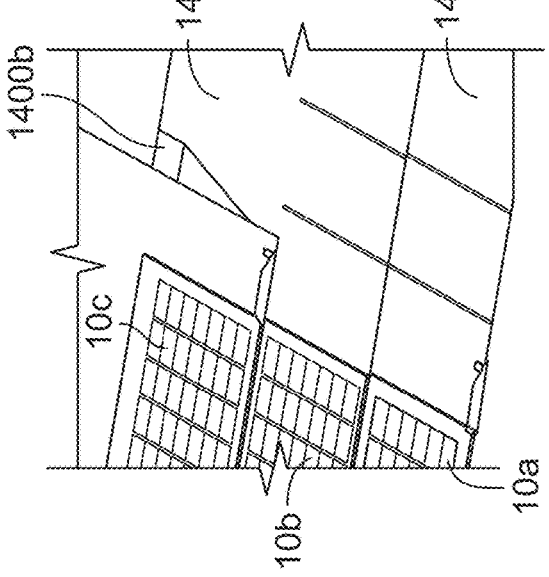
Figure 53F:
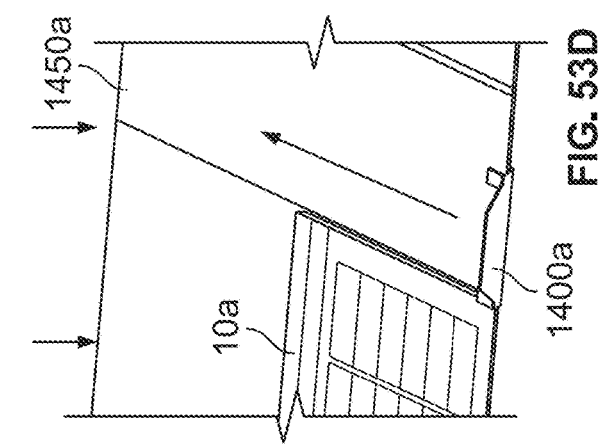

In some embodiments, the bracket 1400 is configured to be used on the wireway 74 on the right side of the second subarray S2. Referring to FIGS. 53A and 53B, in some embodiments, the lower end of the second side lap 24 of a first photovoltaic module 10a overlays a first one of the bracket 1400a and is located within the space 1426 between the rails 1422 and the upper surface 1420 thereof. In some embodiments, the wing portion 1406 extends outwardly from the second side lap 24. In some embodiments, the wing portion 1406 is fastened to a roof deck by fasteners 1407. Referring to FIGS. 53C and 53D, in some embodiments, a roofing shingle 1450a overlays the second side lap 24 and the bracket 1400a. Referring to FIG. 53E, in some embodiments, a second photovoltaic module 10b overlays the first photovoltaic module 10a. In some embodiments, a second roofing shingle 1450b overlays the second side lap 24 of the second photovoltaic module 10b and the headlap portion of the first roofing shingle 1450a. In some embodiments, a second one of the bracket 1400b overlays the second roofing shingle 1450b. In some embodiments, a third photovoltaic module 10c overlays the bracket 1400b and is located within the space 1426 between the rails 1422 and the upper surface 1420 thereof. In some embodiments, the wire cover 1402 is installed on the hook members 1410 of the brackets 1400a, 1400b. In some embodiments, the wireway 74 on the right side of the subarray S2 does not include any electrical wiring or cables. In some embodiments, the wireway 74 on the right side of the subarray S2 including the wire cover 102 is for aesthetic purposes.

Figure 53G:
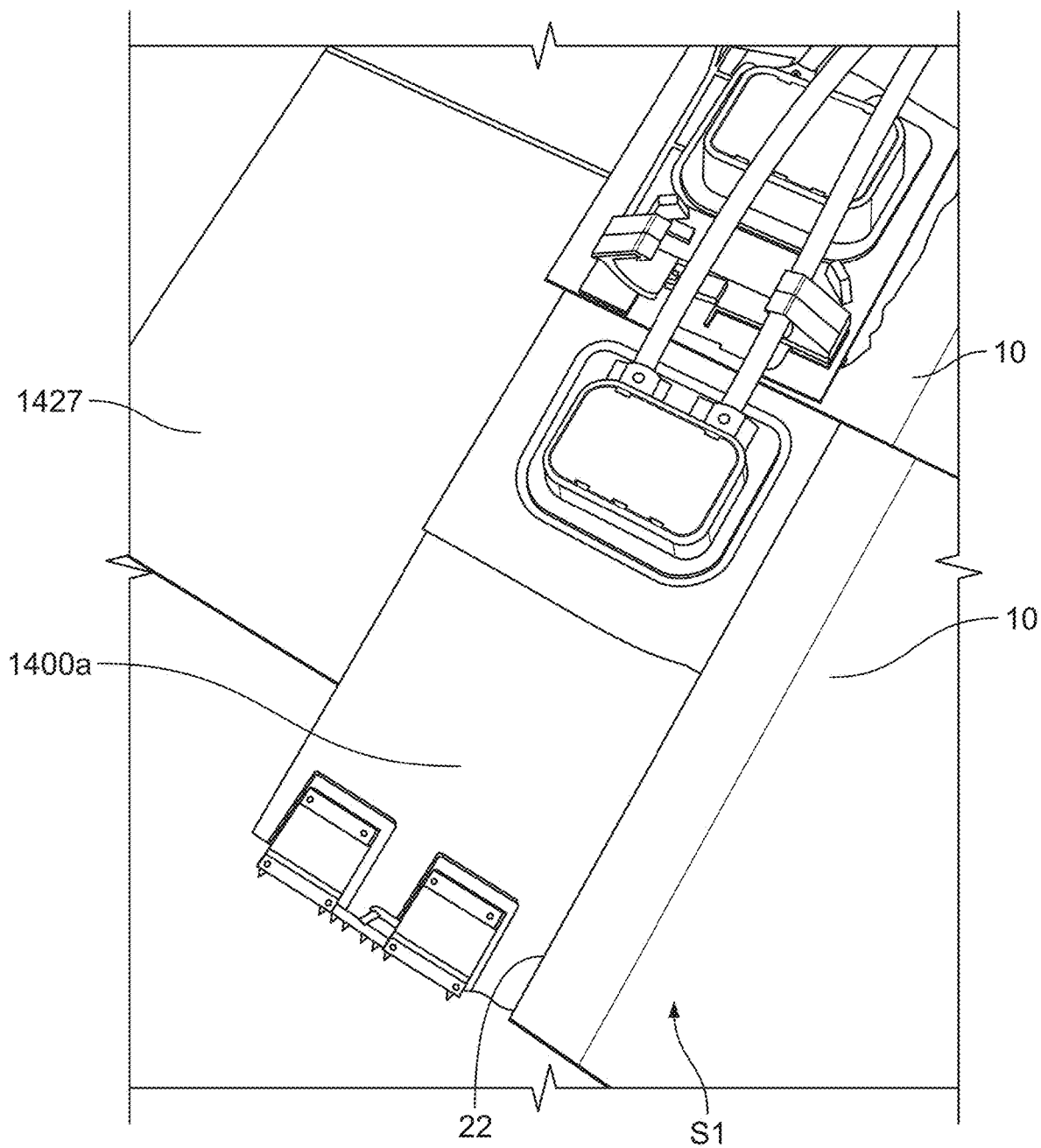

Referring to FIG. 53G, in some embodiments, the bracket 1400a is configured to be installed in a lower lefthand corner of an array of the photovoltaic modules 10. In some embodiments, the bracket 1400a is configured to be installed in a lower lefthand corner of the subarray S1 of the photovoltaic modules 10. In some embodiments, the bracket 1400a is configured to be installed over the first side lap 22 of the photovoltaic module 10 in the lowermost row R of the subarray S1. In some embodiments, the first side lap 22 of the photovoltaic module 10 in the lowermost row R of the subarray S1 overlays at least a portion of the bracket 1400a.

In some embodiments, the bracket 1400*a* overlays at least a portion of a step flap 1427. In some embodiments, the bracket 1400*a* is installed in other suitable locations along the subarrays S1, S2. Referring to FIGS. 54A and 54B, in some embodiments, a first flashing base 1500 is located at an upper end of the wireway 74. In some embodiments, the first flashing base 1500 includes a flat base portion 1531 having a first surface and a second surface opposite the first surface, an aperture 1533 extending from the first surface to the second surface, and a sidewall 1535 extending from the first surface to the second surface and surrounding the aperture 1533. In some embodiments, the base portion 1531 is rectangular in shape. In some embodiments, the base portion 1531 is square in shape. In some embodiments, the base portion 1531 is trapezoidal in shape. In some embodiments, the base portion 1531 is circular in shape. In some embodiments, an opening 1539 is located proximate to a lower end 1541 of the first flashing base 1500. In some embodiments, the aperture 1533 is substantially rectangular in shape. In some embodiments, the aperture 1533 extends from a first end 1543 located proximate to the lower end 1541 of the first flashing base 1500 and a second end 1545 located intermediate the lower end 1541 and an upper end 1547 of the first flashing base 1500. In some embodiments, the aperture 1533 is sized and shaped to receive at least one electrical component therein. In some embodiments, the second end 1545 includes a width that is wider than a width of the first end 1543. In some embodiments, the wider width of the second end 1545 is sized and shaped to receive relatively larger sized electrical components.

In some embodiments, the first flashing base 1500 is configured to be installed on the roof deck. In some embodiments, the first flashing base 1500 is installed at the top of the wireway 74 of the subarray S1. In some embodiments, the sidewall 1535, the aperture 1533 and the flanged portions 1537 of the first flashing base 1528 are aligned with the baseplate 100 of the photovoltaic module 10 in the uppermost row R of the subarray S1. In some embodiments, the first flashing base is 1500 is configured to be installed to the roof deck by at least one fastener. In some embodiments, the base portion 1531 is configured to receive the at least one fastener. In some embodiments, the at least one fastener includes a plurality of fasteners. In some embodiments, the plurality of fasteners is roofing nails, rivets, screws or staples. In some embodiments, the first flashing base is 1500 is configured to be installed to the roof deck by an adhesive. In some embodiments, the first flashing base 1500 overlays at least one of a step flap 1526.

Figure 55A:
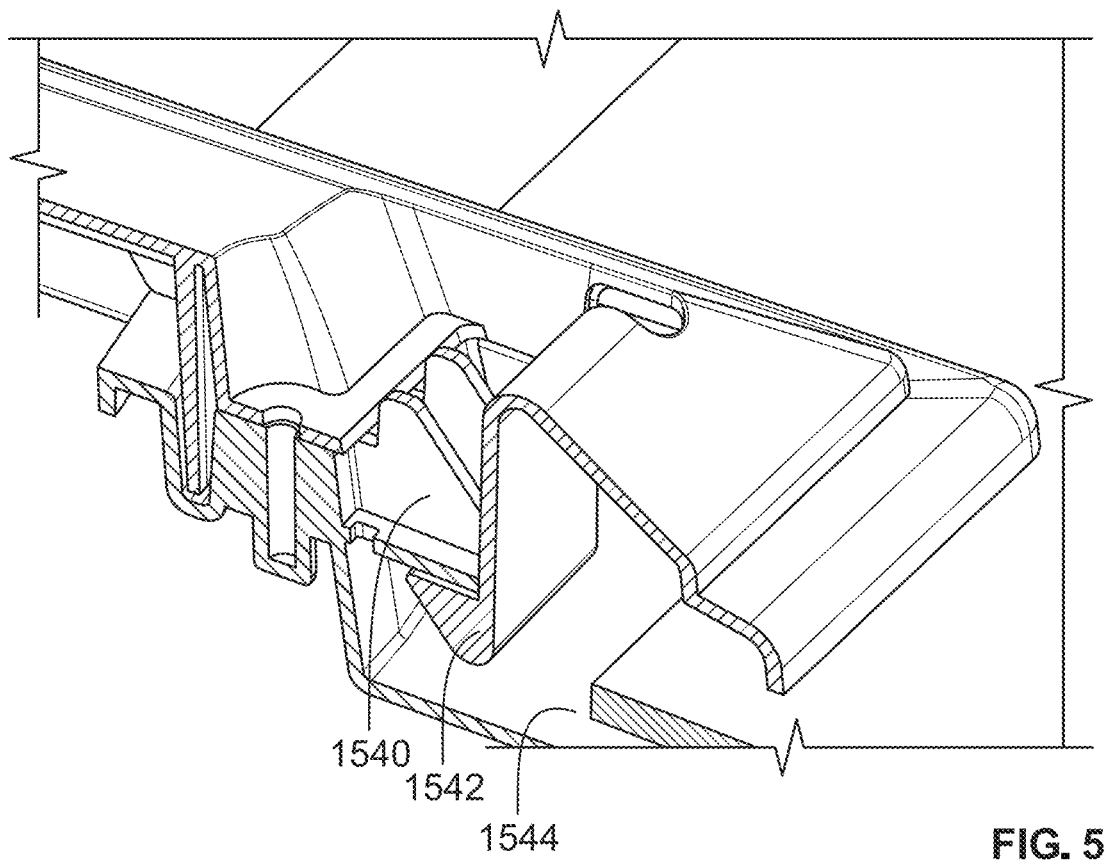
Figure 55B:
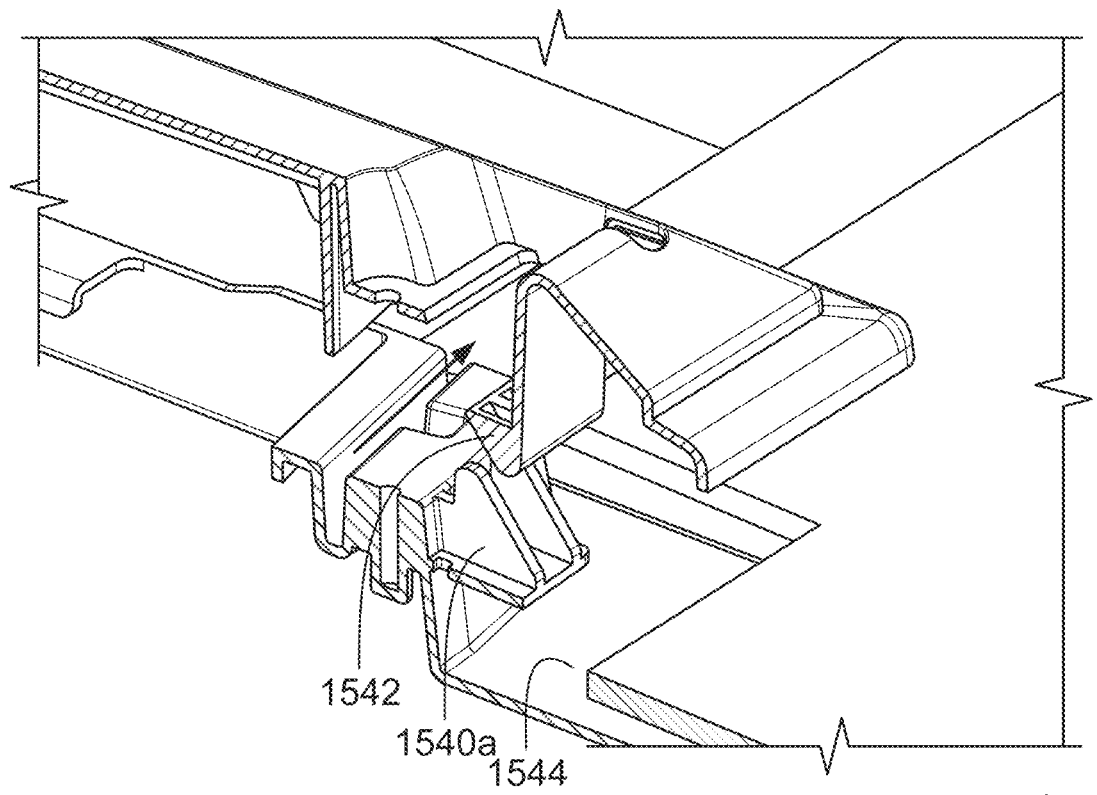

In some embodiments, a wire cover 1502 is attached to the first flashing base 1500. In some embodiments, the wire cover 1502 is removably attached to the first flashing base 1500. In some embodiments, the wire cover 1502 covers the aperture 1533. In some embodiments, the wire cover 1502 is juxtaposed with the wire cover 102. In some embodiments, a lower portion of the wire cover 1502 of the first flashing base 1500 overlays an upper portion 103 of the wire cover 102. Referring to FIGS. 55A and 55B, in some embodiments, the wire cover 1502 includes a tab 1540 and the first flashing base 1500 includes a tab 1542. In some embodiments, the wire cover 1502 is attached to the first flashing base 1500 by mating (e.g., snap fitting) the tab 1540 with the tab 1542. In some embodiments, the first flashing base 1500 includes a trough 1544. In some embodiments, the trough 1544 is configured to direct water outward therefrom.

Figure 56B:
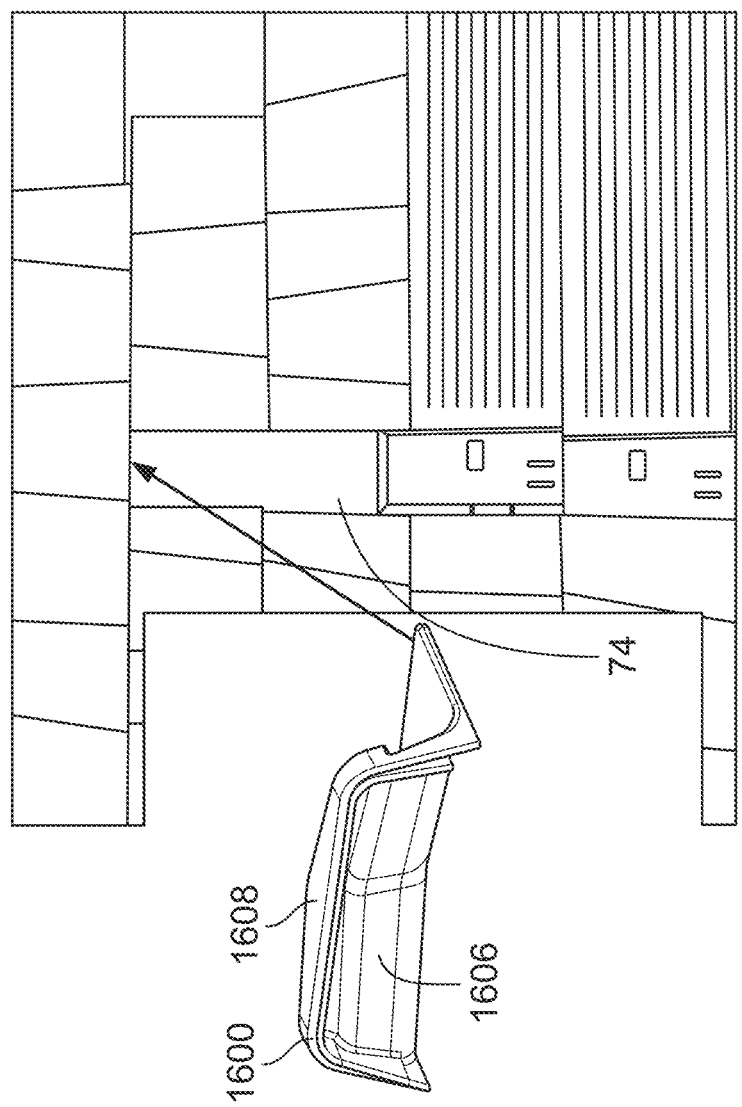
FIGS. 56A and 56B illustrate some embodiments of an endcap of a wireway of a photovoltaic system.
Figure 56A:
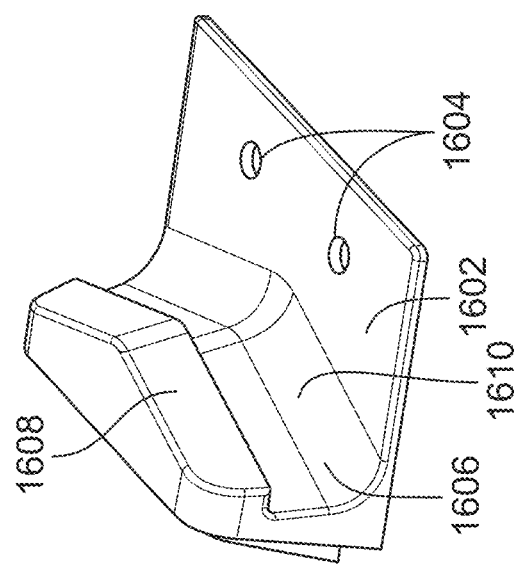
Figure 57A:
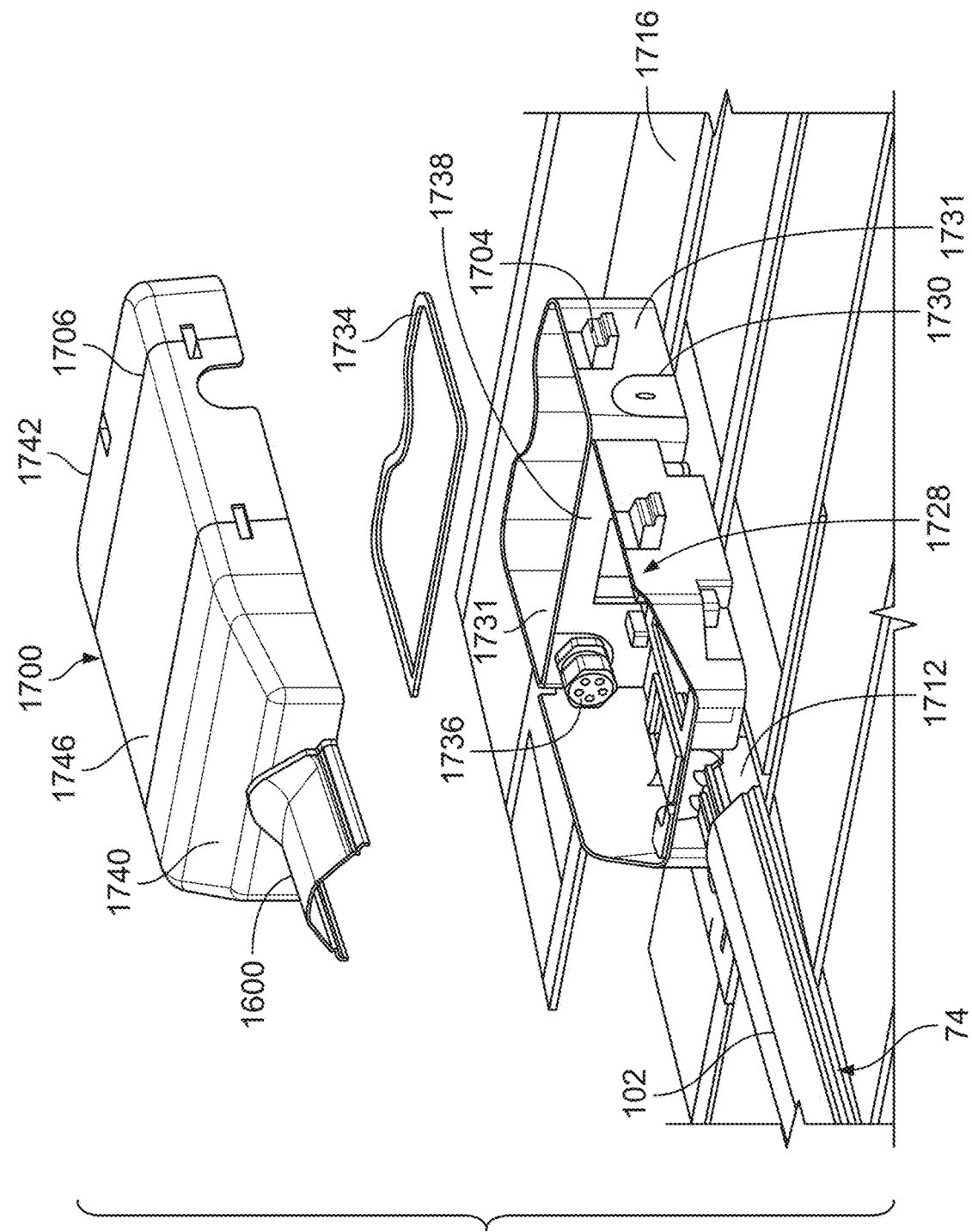
FIGS. 57A through 57D illustrate some embodiments of a transition box of a wireway of a photovoltaic system.
Figure 57B:
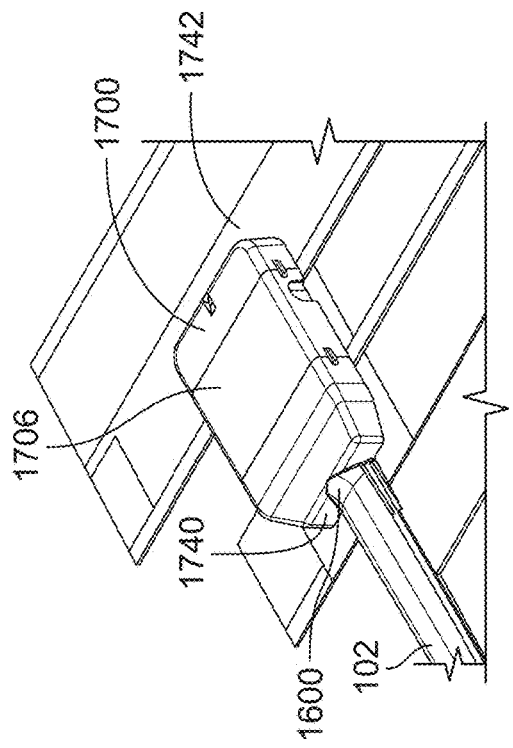
Figure 57C:
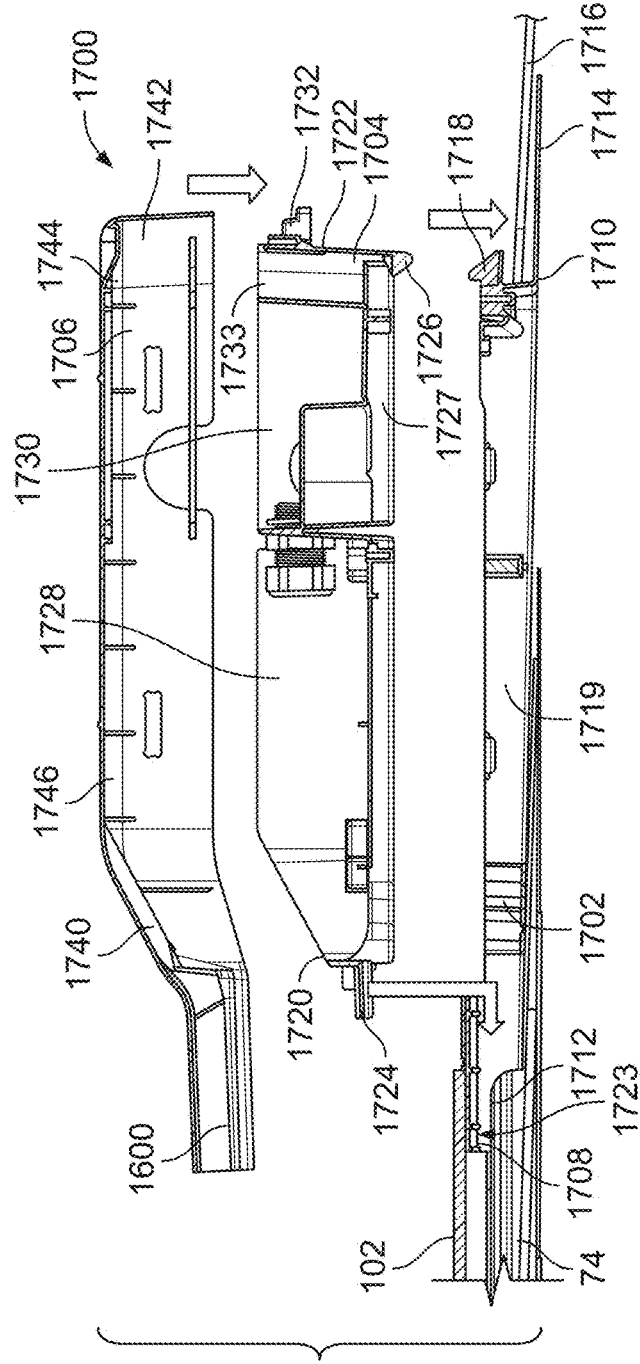
Figure 57D:
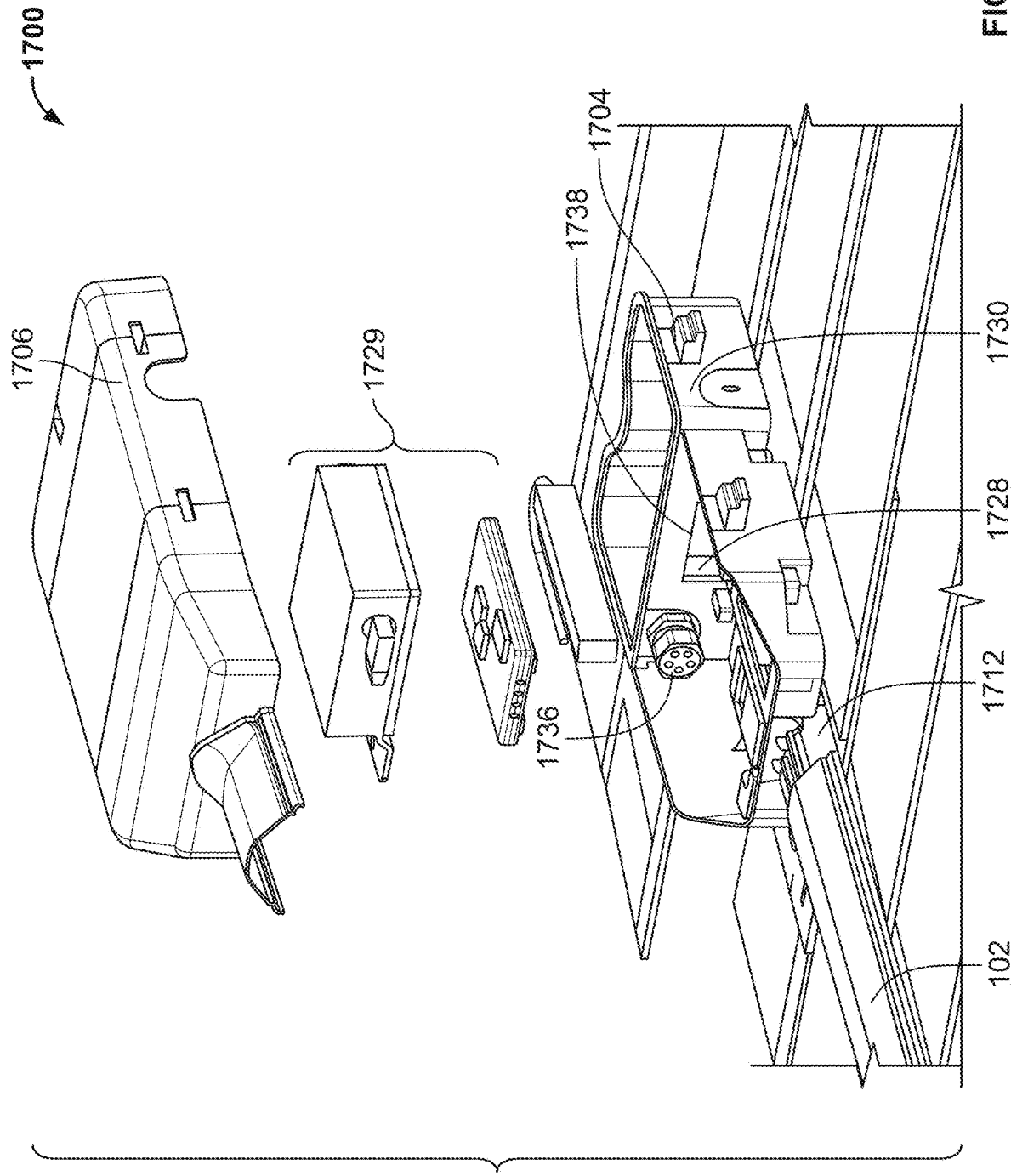

Referring to FIGS. 56A and 56B, in some embodiments, an top cap 1600 is located at an upper end of the wireway 74. In some embodiments, the top cap 1600 includes a base 1602. In some embodiments, the base 1602 includes at least one aperture 1604. In some embodiments, the at least one aperture 1604 is configured to receive a fastener. In some embodiments, the at least one aperture 1604 includes a plurality of apertures 1604. In some embodiments, the top cap 1600 includes a wall portion 1606. In some embodiments, the top cap 1600 includes a lip 1608 extending outwardly from the wall portion 1606. In some embodiments, the lip 1608 forms a groove 1610.

Referring to FIGS. 57A through 57D, in some embodiments, the groove 1610 is sized and shaped to receive an end of a transition box 1700. In some embodiments, the transition box 1700 includes a base 1702, a housing 1704 removably attached to the base 1702, and a wire cover 1706 removably attached to the housing 1704. In some embodiments, the base 1702 includes a first end 1708 and a second end 1710 opposite the first end 1708. In some embodiments, a mating portion 1712 extends from the first end 1708. In some embodiments, the mating portion 1712 includes an internal cavity 1713. In some embodiments, the mating portion 1712 is sized and shaped to be removably inserted into an upper end of the wire cover 102 in the wireway 74. In some embodiments, the mating portion 1712 is slidably inserted into the upper end of the wire cover 102. In some embodiments, a front lap portion 1714 extends from the second end 1710 of the base 1702. In some embodiments, the front lap portion 1714 is flat or planar. In some embodiments, the front lap portion 1714 is substantially flat. In some embodiments, a roofing shingle 1716 overlays the front lap portion 1714. In some embodiments, the overlayment of the roofing shingle 1716 maintains the second end 1710 of the base 1702 in its position on the roof deck. In some embodiments, the roofing shingle 1716 is an asphalt shingle. In some embodiments, the roofing shingle 1716 is composed of a polymer. In some embodiments, a tab 1718 extends from the second end 1710 of the base 1702. In some embodiments, the base 1702 includes a sidewall 1719. In some embodiments, the sidewall 1719 extends around a perimeter of the base 1702. In some embodiments, the sidewall 1719 extends around a portion of the perimeter of the base 1702.

In some embodiments, the housing 1704 includes a first end 1720 and a second end 1722 opposite the first end 1720. In some embodiments, the housing 1704 includes a mating portion 1724 that extends from the first end 1720. In some embodiments, the mating portion 1724 is sized and shaped to be removably inserted into the internal cavity 1723 of the mating portion 1712 of the base 1702. In some embodiments, the housing 1704 includes a first tab 1726 that extends from a lower surface 1727 thereof at the second end 1722. In some embodiments, the tab 1726 of the housing 1704 engages the tab 1718 of the base 1702 when the housing 1704 is installed on the base 1702. In some embodiments, the tab 1726 of the housing 1704 removably engages the tab 1718 of the base 1702. In some embodiments, the tab 1726 of the housing 1704 and the tab 1718 of the base 1702 are snap-fit tabs. In some embodiments, the housing 1704 is attached to the base 1702 without any separate fasteners, such as, for example, screws, pin members, bolts, nuts, or rivets. In some embodiments, the housing 1704 may be attached to the base 1702 by fasteners. In some embodiments, the housing 1704 may be attached to the base 1702 by an adhesive.

In some embodiments, the housing 1704 includes a first compartment 1728. In some embodiments, the housing 1704 includes a second compartment 1730. In some embodiments, the first compartment 1728 is adjacent the second compartment 1730. In some embodiments, the housing 1704. In some embodiments, the first compartment 1728 houses one or more electronic components or electrical components 1729. In some embodiments, the transition box 1700 includes a rapid shutdown device. In some embodiments, the transition box 1700 includes a mid-circuit interrupter (MCI). In some embodiments, the transition box includes a splice box. In some embodiments, the transition box 1700 houses electrical wiring for the photovoltaic system. In some embodiments, the electrical wiring includes THHN electrical wiring. In some embodiments, the THHN electrical wire is electrically connected to an inverter.

In some embodiments, the housing 1704 includes a second tab 1732 extending from the second end 1722 thereof. In some embodiments, the second tab 1732 is located proximate to an upper end 1733 of the housing 1704.

In some embodiments, the housing 1704 is symmetrical. In some embodiments, the housing 1704 is asymmetrical. In some embodiments, the second compartment 1730 includes a sidewall 1731. In some embodiments, either side of the sidewall 1731 is configured to receive an external conduit or electrical cable or wire therethrough. In some embodiments, the sidewall 1731 of the housing 1704 is configured to have an aperture formed therein, either by drilling, punching or cutting. In some embodiments, the second compartment 1730 is sized and shaped to receive the external conduit or electrical cable or wire therein through the aperture. In some embodiments, the aperture is sized and shaped to receive a conduit connected to the splice box. In some embodiments, the conduit is configured to house and run electrical wiring across the roof. In some embodiments, the second compartment 1730 is sized and shaped to receive an electrical cable passthrough. In some embodiments, a gasket 1734 or other seal is located at the upper end of the second compartment 1730 to provide a watertight seal. In some embodiments, a liquid-tight cable gland 1736 is located in a dividing wall 1738 between the first compartment 1728 and the second compartment 1730. In some embodiments, the cable gland 1736 is configured to receive an electrical cable or wire therethrough and provide a liquid-tight seal between the first compartment 1728 and the second compartment 1730.

In some embodiments, the wire cover 1706 includes first end 1740 and a second end 1742 opposite the first end 1740. In some embodiments, the wire cover 1706 includes a tab 1744 located at the second end 1742. In some embodiments, the tab 1744 is located on an interior surface of a top portion 1746 of the wire cover 1706. In some embodiments, the tab 1744 of the wire cover 1706 engages the second tab 1732 of the housing 1704. In some embodiments, the tab 1744 of the wire cover 1706 and the second tab 1732 of the housing 1704 are snap-fit tabs. In some embodiments, the top cap 1600 is located at the first end 1740 of the wire cover 1706. In some embodiments, the top cap 1600 is snap-fit to the first end 1740 of the wire cover 1706 by the lip 1608 of the top cap 1600. In some embodiments, the top cap 1600 is attached to the first end 1740 of the wire cover 1706 by fasteners. In some embodiments, the top cap 1600 is attached to the first end 1740 of the wire cover 1706 by an adhesive. In some embodiments, the top cap 1600 is integral with the wire cover 1706. In some embodiments, the top cap 1600 overlays the upper end of the wire cover 102. In some embodiments, the wire cover 102 is composed of a material that enables it to thermally contract or expand as a result of an external environmental condition, such as temperature. In some embodiments, the overlayment of the top cap 1600 on the wire cover 102 provides clearance to enable the contraction or expansion of the wire cover 102. In some embodiments, the contraction or expansion of the wire cover 102 does not affect the aesthetic appearance of the photovoltaic system.

In some embodiments, a method comprises the steps of:
obtaining a plurality of photovoltaic modules 10;
installing at least three of the photovoltaic modules 10 on a slope of a roof deck, wherein a first photovoltaic module of the at least three of the photovoltaic modules 10 is horizontally adjacent to a second photovoltaic module of the at least three of the photovoltaic modules 10, wherein a third photovoltaic module of the at least three of the photovoltaic modules 10 is vertically adjacent to the first photovoltaic module, wherein the first ends 12 of the first and third photovoltaic modules are substantially aligned with each other, wherein the second ends 14 of the first and third photovoltaic modules are substantially aligned with each other, wherein the first photovoltaic module overlays at least a part of the head lap portion 16 of the third photovoltaic module, wherein the second photovoltaic module overlays at least a part of the side lap 22 of the first photovoltaic module, and wherein the baseplate 100 of the first photovoltaic module is substantially aligned with the baseplate 100 of the third photovoltaic module, wherein the substantially aligned baseplates 100 include a longitudinal axis A-A;
installing at least one wire cover 102 to at least one of the baseplates 100; and
adjusting a position of the installed at least one wire cover 102 in the at least a first direction.

Figure 58:
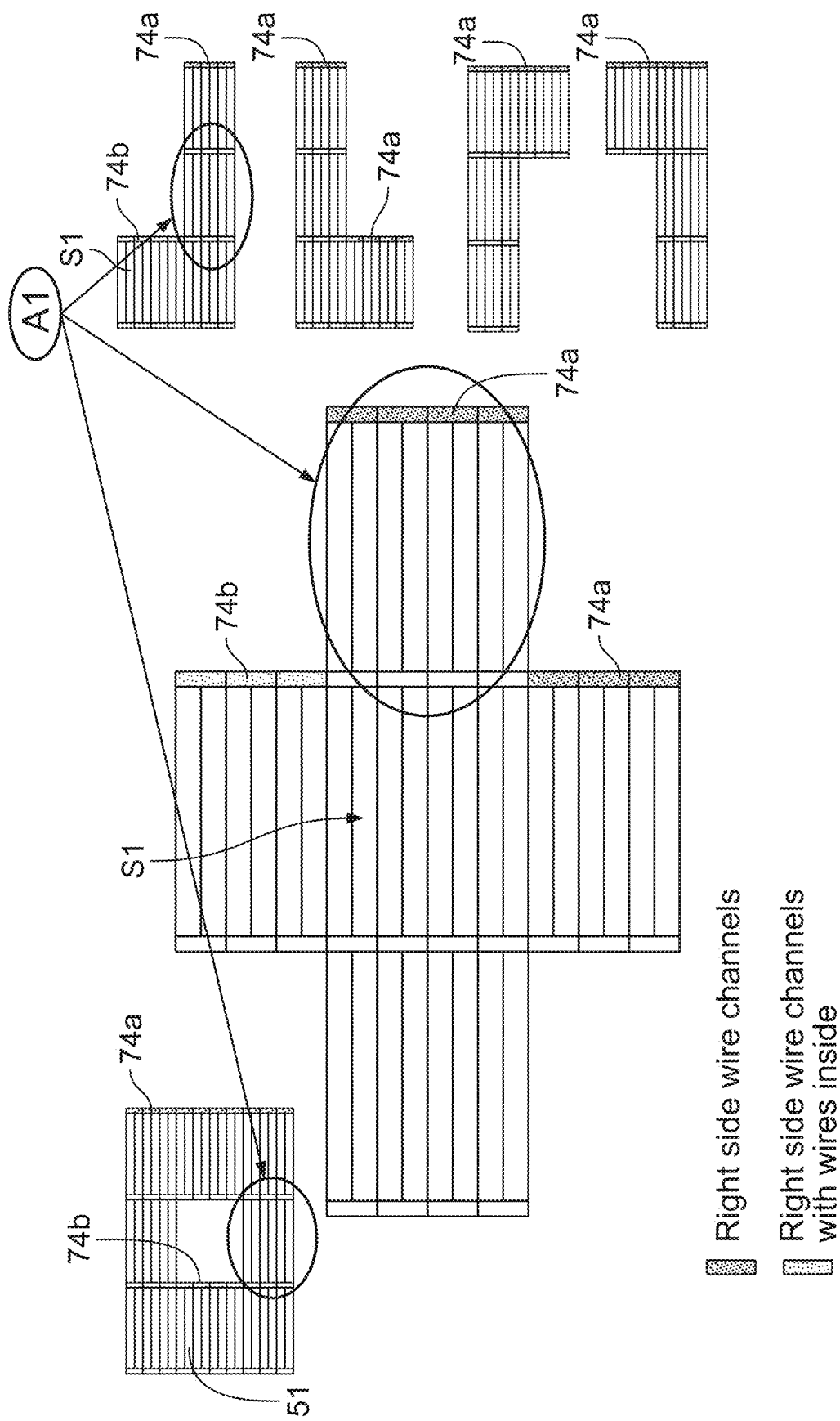
FIG. 58 illustrates some embodiments of subarrays of photovoltaic systems having wireways.

Referring to FIG. 58, in some embodiments, examples of different arrays having multiple columns of the photovoltaic modules 10 are shown, and indicate "right side" wireways that (a) require no electrical wires therein (non-electrically active), or (b) require electrical wiring therein (electrically active), in view of the configuration of the photovoltaic system. In some embodiments, the right side, non-electrically active wireways 74a do not require electrical wires therein. In some embodiments, the right side wireways 74a include the installed brackets 1400 as described above and shown in FIGS. 50 through 54B. In some embodiments, the right side, electrically active wireways 74b require electrical wiring to electrically complete the electrical connection between the subarrays, e.g., where for a first subarray S1 in a row of one or more subarrays of the photovoltaic modules 10, there is no immediately adjacent right side, second subarray in the next column to the immediate right thereof. In some embodiments, the right side wireways 74b include the installed baseplates 100 as described above.

What is claimed is:
1. A system, comprising:
a plurality of photovoltaic modules installed on a roof deck,
wherein the photovoltaic modules are arranged in an array on the roof deck,
wherein the photovoltaic modules includes a first photovoltaic module and a second photovoltaic module,
wherein the first photovoltaic module is vertically adjacent to the second photovoltaic module,
wherein each of the photovoltaic modules includes
a first end and a second end opposite the first end,
a first side lap located at the first end,
a second side lap located at the second end,
a first baseplate on the first side lap, wherein the first baseplate of the first photovoltaic module is substantially aligned with the first baseplate of the second photovoltaic module, and wherein the first baseplate is configured to receive at least one electrical component;

a first cover removably attached to at least one of the first baseplates; and at least one second baseplate installed on the roof deck, wherein the at least one second baseplate includes a base portion and a wing portion extending from the base portion, and wherein the wing portion is configured to receive at least one fastener for installing the at least one second baseplate to the roof deck, and wherein the second side lap of the first photovoltaic module overlays at least a portion of a first one of the at least one second baseplate; and a second cover, wherein the second cover is installed on at least the first ne of the at least one second baseplate.

2. The system of claim 1, wherein the second side lap of the first photovoltaic module overlays the base portion of the first one of the at least one second baseplate, wherein the wing portion of the first one of the at least one second baseplate extends outwardly from the second side lap of the first photovoltaic module.

3. The system of claim 1, further comprising a plurality of roofing shingles, wherein a first one of the plurality of roofing shingles overlays the second side lap of the first photovoltaic module and the first one of the at least one second baseplate.

4. The system of claim 3, wherein the second photovoltaic module overlays at least a portion of the first photovoltaic module, and wherein the second side lap of the second photovoltaic module overlays at least a portion of the first one of the plurality of roofing shingles.

5. The system of claim 4, wherein a second one of the plurality of roofing shingles overlays the second side lap of the second photovoltaic module.

6. The system of claim 5, wherein a second one of the at least one second baseplate overlays at least a portion of the second one of the plurality of roofing shingles.

7. The system of claim 6, wherein the plurality of photovoltaic modules includes a third photovoltaic module, wherein the third photovoltaic module is vertically adjacent to the second photovoltaic module, and wherein the first baseplate of the third photovoltaic module is substantially aligned with the first baseplate of the second photovoltaic module.

8. The system of claim 7, wherein the third photovoltaic module overlays at least a portion of the second photovoltaic module, and wherein the second side lap of the third photovoltaic module overlays at least a portion of the second one of the at least one second baseplate.

9. The system of claim 8, wherein a third one of the plurality of roofing shingles overlays the second side lap of the third photovoltaic module and the second one of the at least one second baseplate.

10. The system of claim 8, wherein the second side lap of the third photovoltaic module overlays the base portion of the second one of the at least one second baseplate, wherein the wing portion of the second one of the at least one second baseplate extends outwardly from the second side lap of the third photovoltaic module.

11. The system of claim 6, wherein the second cover is installed on the at least one second baseplate.

12. The system of claim 9, wherein the at least one second baseplate includes an upper end and a lower end opposite the upper end, and a wall at the lower end, wherein the second side lap of each of the photovoltaic modules includes a lower end, and wherein the lower end of the second side lap of the first photovoltaic module is juxtaposed with the wall of the first one of the at least one second baseplate.

13. The system of claim 12, wherein each of the plurality of roofing shingles includes a lower edge, and wherein the lower edge of the first one of the plurality of roofing shingles is juxtaposed with the wall of the first one of the at least one second baseplate.

14. The system of claim 13, wherein the lower end of the second side lap of the third photovoltaic module is juxtaposed with the wall of the second one of the at least one second baseplate.

15. The system of claim 14, wherein the lower edge of the third one of the plurality of roofing shingles is juxtaposed with the wall of the second one of the at least one second baseplate.

16. The system of claim 1, wherein the first cover is moveable in at least a first direction, and wherein the first direction is transverse relative to a longitudinal axis of the substantially aligned first baseplates.

17. The system of claim 16, wherein the second cover is moveable in the first direction.

18. A system, comprising:
a plurality of photovoltaic modules installed on a roof deck,
wherein the photovoltaic modules are arranged in an array on the roof deck,
wherein the photovoltaic modules includes a first photovoltaic module and a second photovoltaic module,
wherein the first photovoltaic module is adjacent to the second photovoltaic module,
wherein each of the photovoltaic modules includes
a first end and a second end opposite the first end,
a first side lap located at the first end,
a second side lap located at the second end,
a first baseplate on the first side lap,
wherein the first baseplate of the first photovoltaic module is substantially aligned with the first baseplate of the second photovoltaic module, and
at least one second baseplate installed on the roof deck,
wherein the at least one second baseplate includes a base portion and a wing portion extending from the base portion, and wherein the wing portion is configured to receive at least one fastener for installing the at least one second baseplate to the roof deck, and
wherein the second side lap of the first photovoltaic module overlays a first one of the at least one second baseplate, and
wherein the second side lap of the first photovoltaic module overlays the first one of the at least one second baseplate; and
a plurality of roofing shingles,
wherein a first one of the plurality of roofing shingles overlays the second side lap of the first photovoltaic module.

19. The system of claim 18, wherein the at least one second baseplate includes an upper end and a lower end opposite the upper end, and a wall at the lower end, wherein the second side lap of each of the photovoltaic modules includes a lower end, and wherein the lower end of the second side lap of the first photovoltaic module is juxtaposed with the wall of the first one of the at least one second baseplate.

* * * * *